US011317010B2

(12) United States Patent
Aschwanden et al.

(10) Patent No.: US 11,317,010 B2
(45) Date of Patent: Apr. 26, 2022

(54) OPTICAL DEVICE, PARTICULARLY CAMERA, PARTICULARLY COMPRISING AUTOFOCUS, IMAGE STABILIZATION AND SUPER RESOLUTION

(71) Applicant: OPTOTUNE CONSUMER AG, Dietikon (CH)

(72) Inventors: Manuel Aschwanden, Allenwinde (CH); Markus Geissner, Bergdietikon (CH)

(73) Assignee: OPTOTUNE CONSUMER AG, Dietikon (CH)

( * ) Notice: Subject to any disclaimer, the term of this patent is extended or adjusted under 35 U.S.C. 154(b) by 0 days.

(21) Appl. No.: 16/120,363

(22) Filed: Sep. 3, 2018

(65) Prior Publication Data

US 2019/0104239 A1    Apr. 4, 2019

Related U.S. Application Data

(63) Continuation of application No. PCT/EP2017/054954, filed on Mar. 2, 2017.

(30) Foreign Application Priority Data

Mar. 2, 2016  (EP) ..................................... 16158246
Jul. 8, 2016   (EP) ..................................... 16178616
Jan. 9, 2017   (EP) ..................................... 17150731

(51) Int. Cl.
*H04N 5/225* (2006.01)
*G02B 3/14* (2006.01)
(Continued)

(52) U.S. Cl.
CPC ............. *H04N 5/2254* (2013.01); *G02B 3/14* (2013.01); *G02B 7/023* (2013.01); *G02B 7/10* (2013.01);
(Continued)

(58) Field of Classification Search
CPC ... G02B 3/12; G02B 3/14; G02B 5/06; G03B 2217/005; G03B 2205/0007–0038; H04N 5/23248–2329
(Continued)

(56) References Cited

U.S. PATENT DOCUMENTS

2001/0033435 A1    10/2001  Moennig
2007/0030573 A1*    2/2007  Batchko ................... G02B 3/14
                                                                        359/665
(Continued)

FOREIGN PATENT DOCUMENTS

CN       104937446       9/2015
EP        1004910        5/2000
(Continued)

*Primary Examiner* — Xi Wang
(74) *Attorney, Agent, or Firm* — JMB Davis Ben-David

(57) ABSTRACT

The present invention relates to Optical device (1), comprising: a transparent and elastically expandable membrane (10), an optical element (20) facing the membrane (10), a wall member (300), wherein the optical element (20) and the membrane (10) are connected to the wall member (300) such that a container (2) with a volume (V) is formed, a fluid (F) residing in said volume (V), and a lens shaping part (11) that is in contact with the membrane (10) for defining a curvature adjustable area (10c) of the membrane (10), which area (10c) faces said optical element (20), and a circumferential lens barrel (50) that surrounds an opening (50c) in which at least one rigid lens (51) is arranged that is held by the lens barrel (50), and an actuator means (40) that is designed to move the optical element (20) in an axial direction (A) with respect to the lens shaping part (11), which axial direction (A) is oriented perpendicular to a plane along which the lens shaping part (11) extends, or to move the lens shaping part (11) in an axial direction (A) with respect to the optical element (20), which axial direction (A) is oriented perpendicular to a plane along which the rigid lens (51) extends so
(Continued)

as to adjust the pressure of the fluid (F) residing inside the volume (V) and therewith a curvature of said area (10c).

19 Claims, 67 Drawing Sheets

(51) Int. Cl.
    *G02B 27/64*      (2006.01)
    *H02K 41/035*      (2006.01)
    *G02B 13/00*      (2006.01)
    *H04M 1/02*      (2006.01)
    *H05K 1/16*      (2006.01)
    *H04N 5/232*      (2006.01)
    *G02B 7/02*      (2021.01)
    *G02B 7/10*      (2021.01)

(52) U.S. Cl.
    CPC ......... *G02B 13/001* (2013.01); *G02B 27/646* (2013.01); *H02K 41/0356* (2013.01); *H04M 1/0264* (2013.01); *H04M 1/0266* (2013.01); *H04N 5/23254* (2013.01); *H04N 5/23299* (2018.08); *H05K 1/165* (2013.01); *G02B 7/021* (2013.01); *G02B 7/025* (2013.01); *G02B 7/028* (2013.01)

(58) Field of Classification Search
    USPC .......... 359/557, 226.3, 554–556; 396/52–55, 396/13; 348/219.1, 208.99
    See application file for complete search history.

(56) References Cited

U.S. PATENT DOCUMENTS

| | | | |
|---|---|---|---|
| 2008/0144186 A1 | 6/2008 | Feng et al. | |
| 2010/0128357 A1* | 5/2010 | Szilagyi | G02B 26/004 359/666 |
| 2010/0134887 A1* | 6/2010 | Shin | G02B 27/646 359/557 |
| 2011/0026149 A1* | 2/2011 | Fan | G02B 7/08 359/824 |
| 2011/0089245 A1 | 4/2011 | Havens et al. | |
| 2011/0134303 A1* | 6/2011 | Jung | H01L 27/14618 348/340 |
| 2014/0368789 A1* | 12/2014 | Webb | A61F 2/1635 351/159.68 |
| 2015/0365568 A1* | 12/2015 | Topliss | H02K 41/0356 348/360 |

FOREIGN PATENT DOCUMENTS

| | | |
|---|---|---|
| EP | 2860556 | 4/2015 |
| JP | 2006-191730 | 7/2006 |
| JP | 2007-322462 | 12/2007 |
| JP | 2011112757 | 6/2011 |
| JP | 2012-520486 | 9/2012 |
| JP | 2013-122605 | 6/2013 |
| KR | 10-2012-0034596 | 4/2012 |
| WO | 2015052236 | 4/2015 |

* cited by examiner

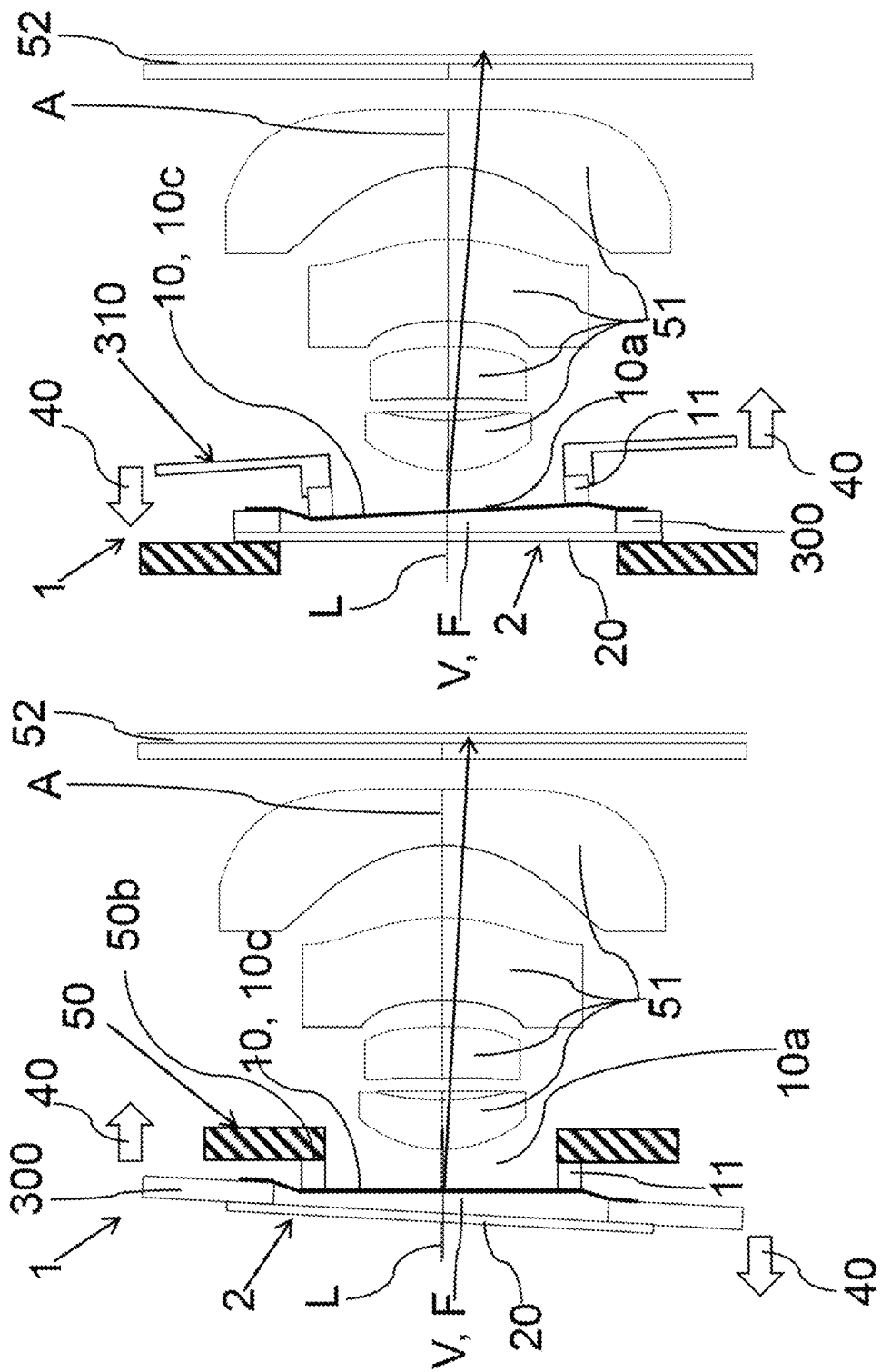

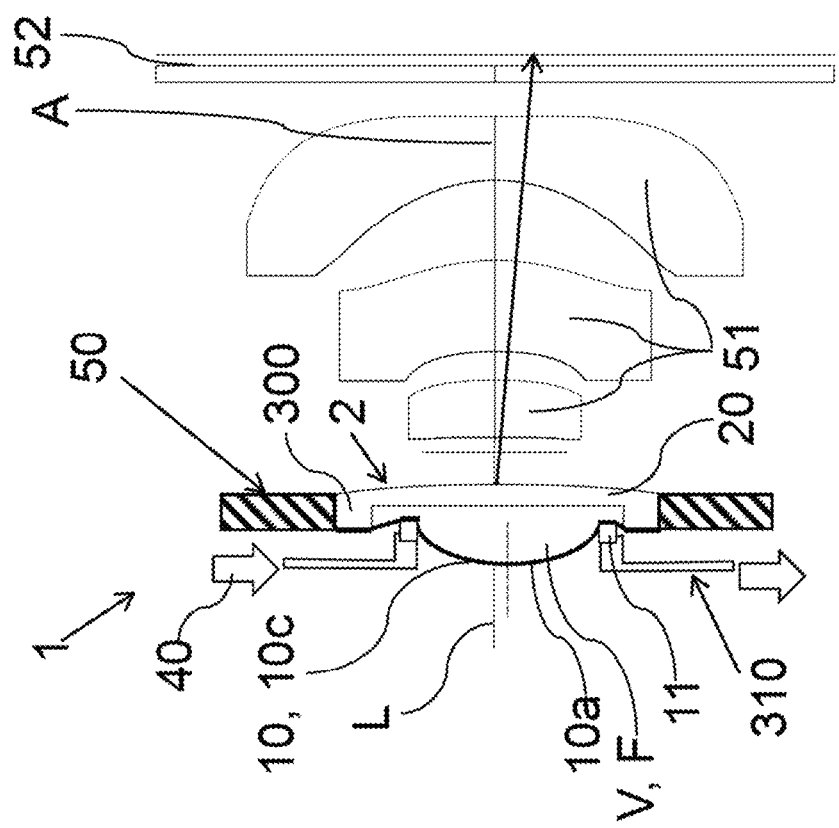
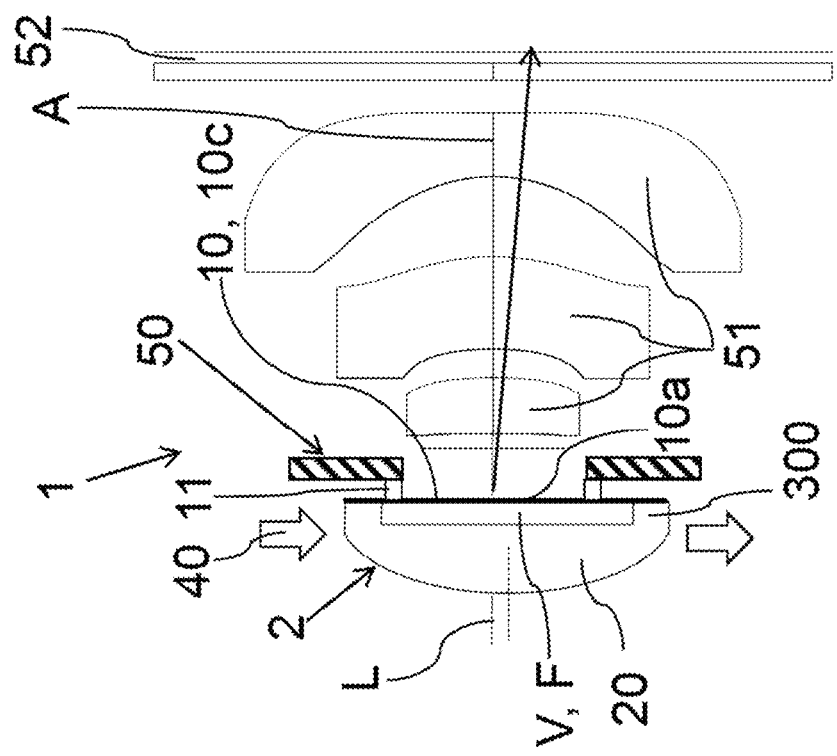

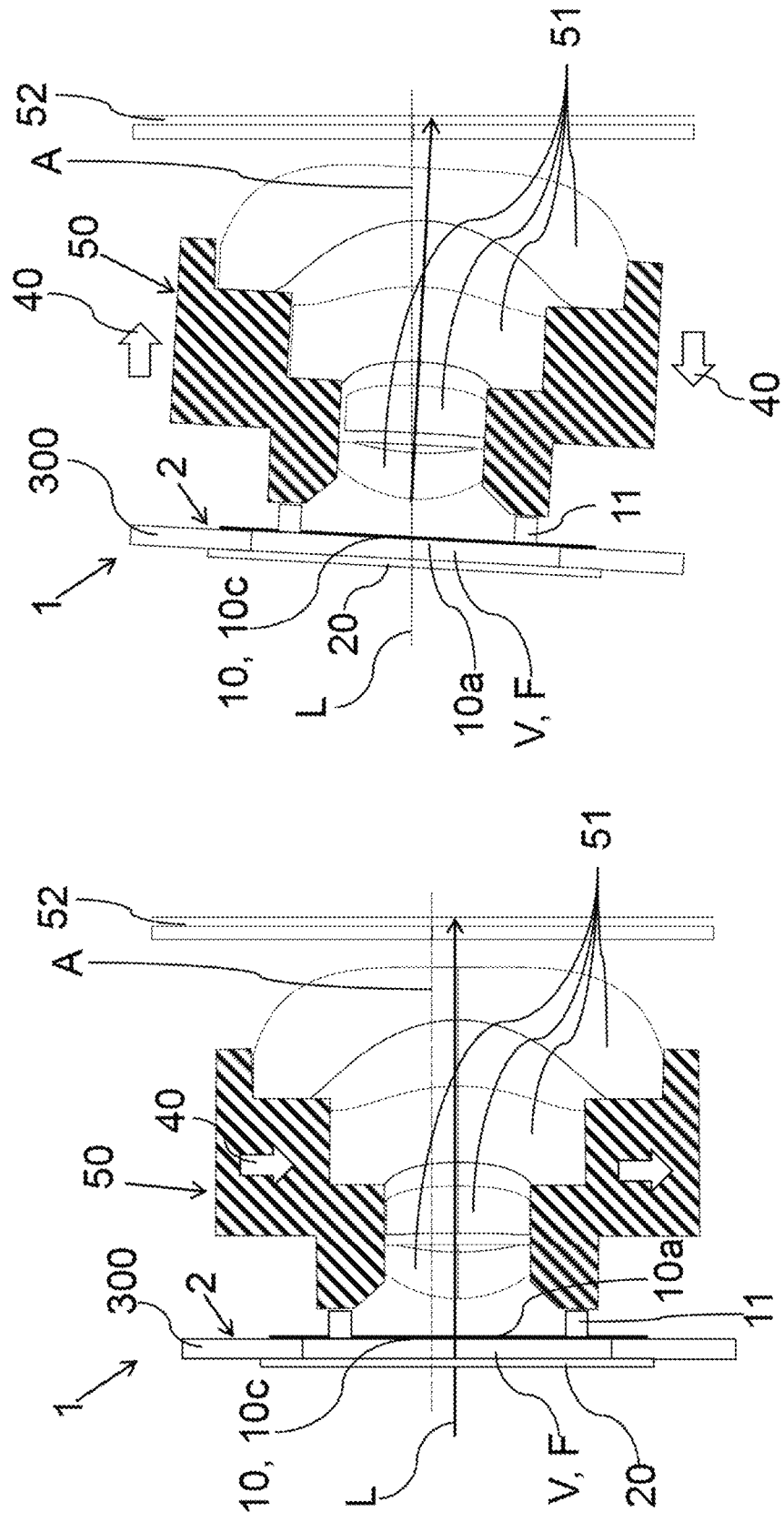

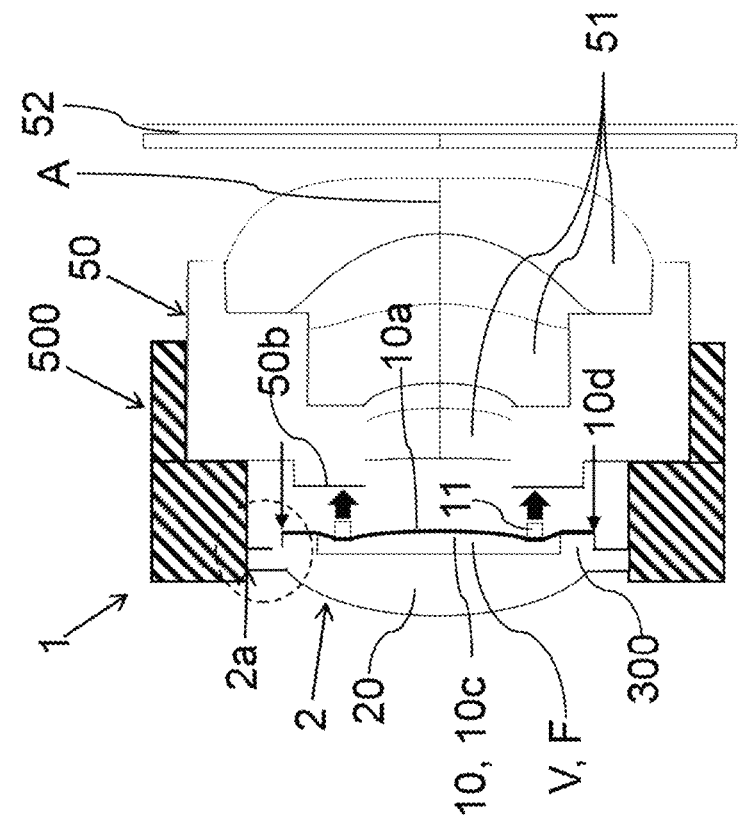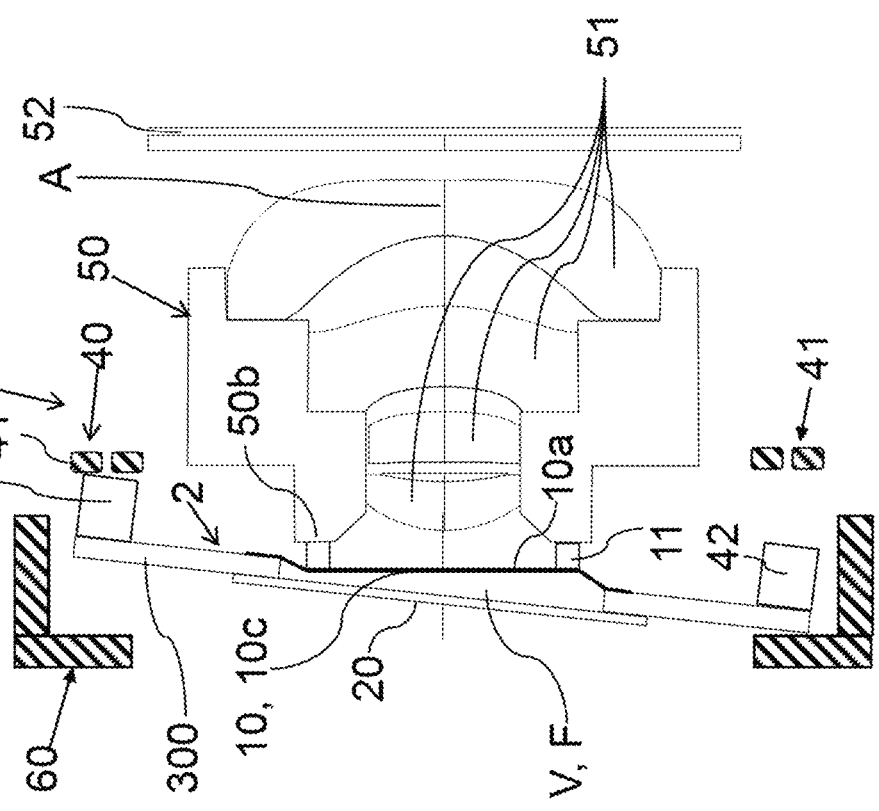

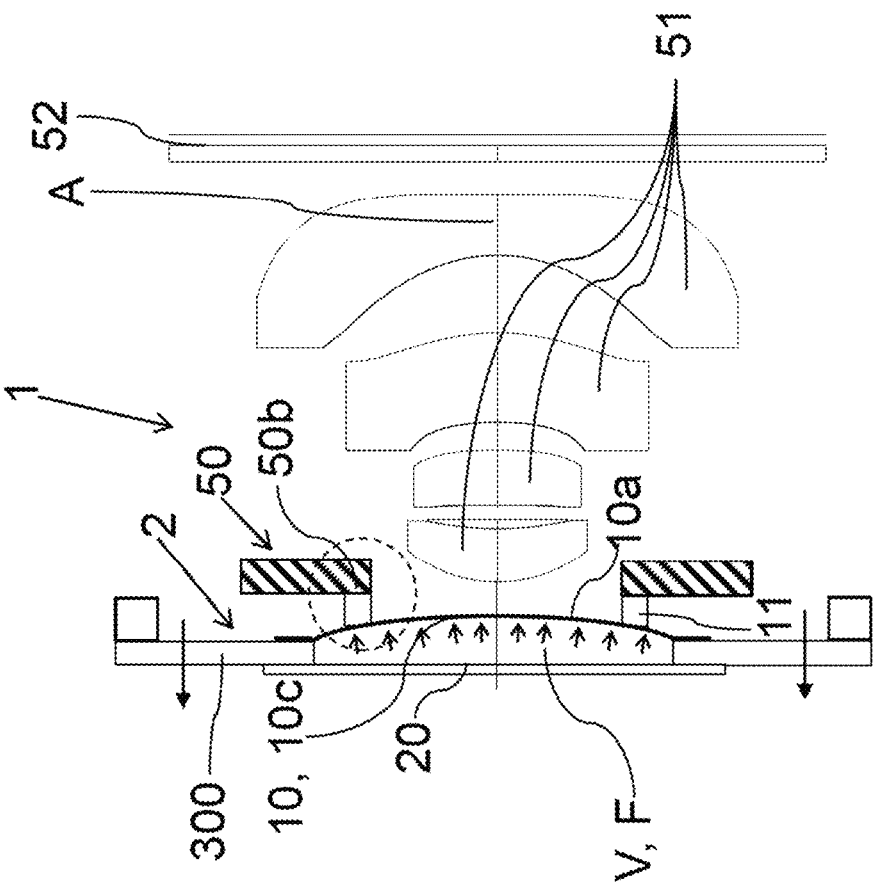
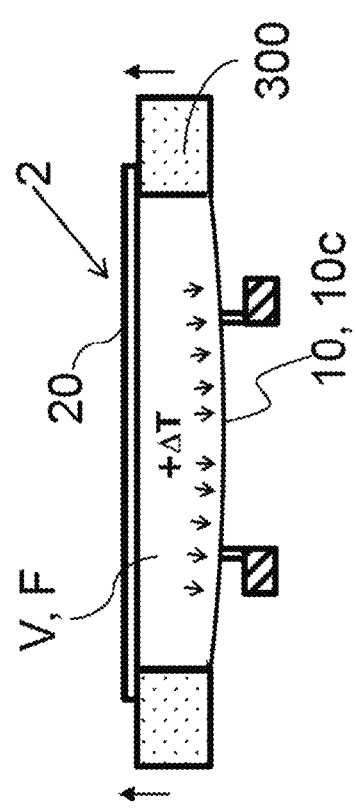
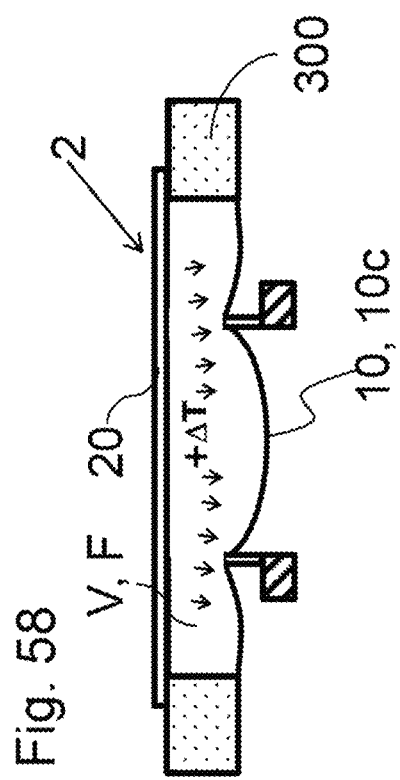

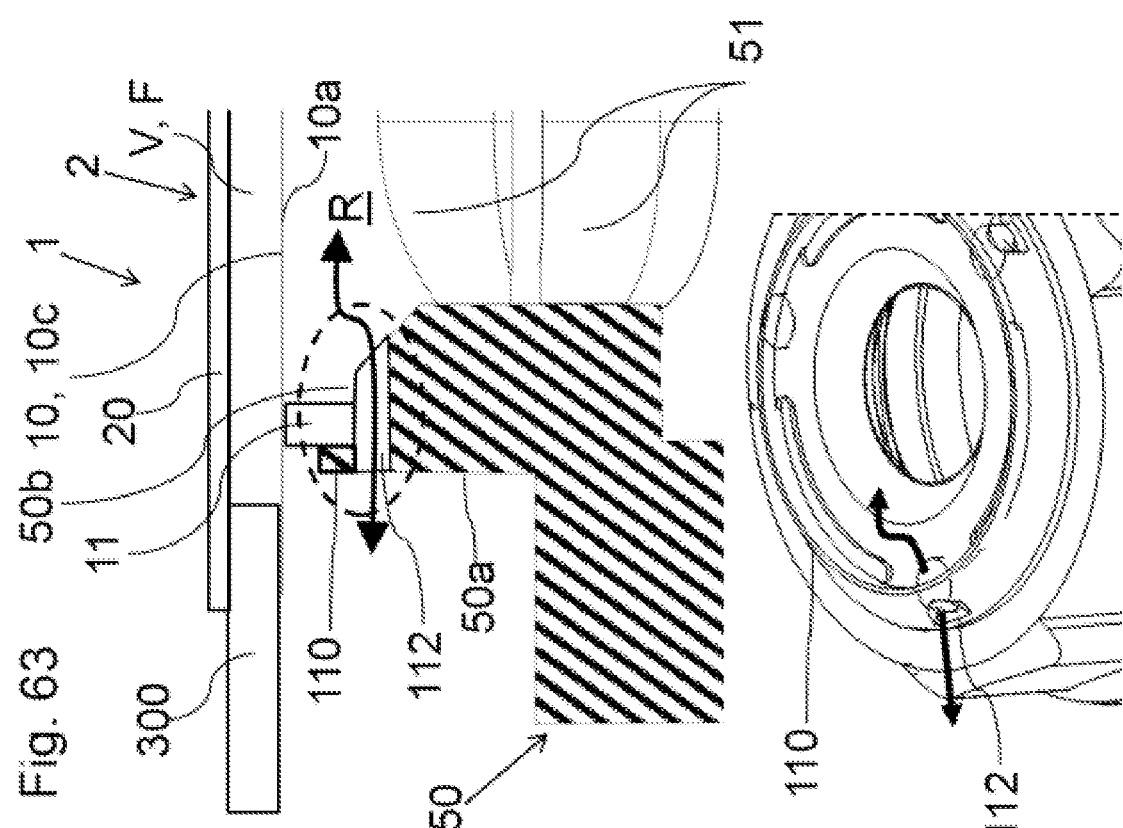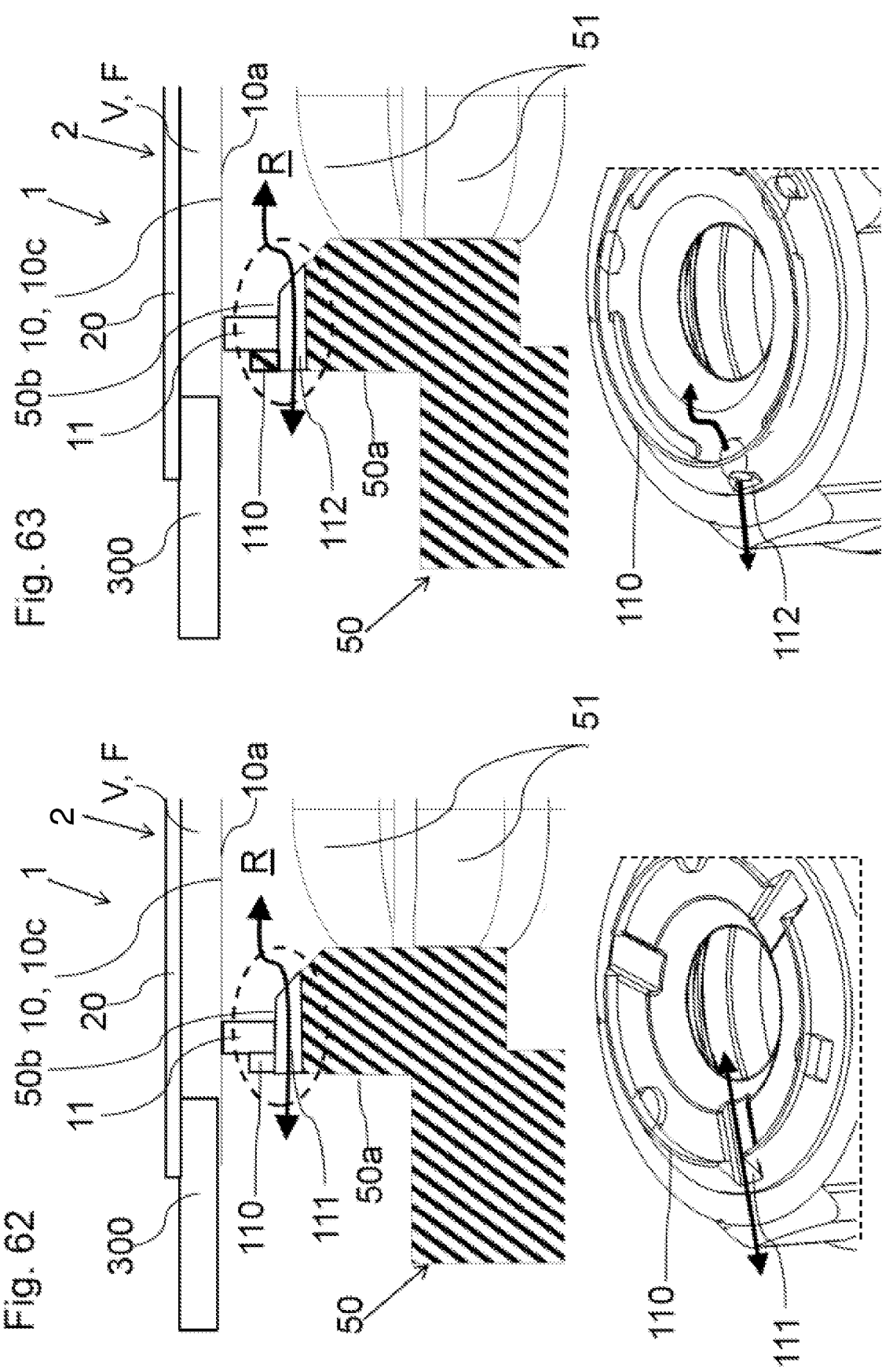

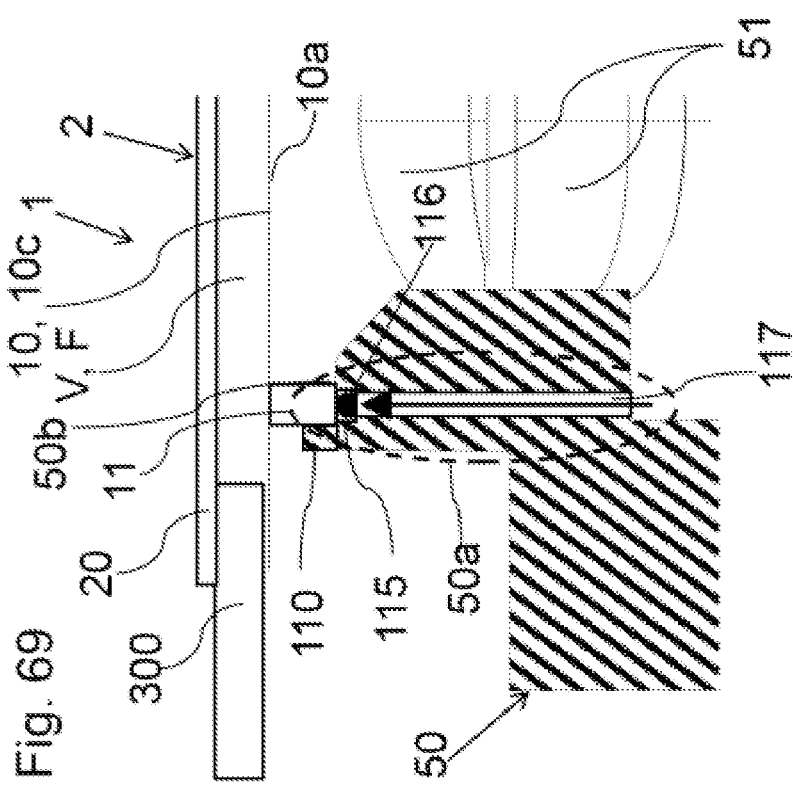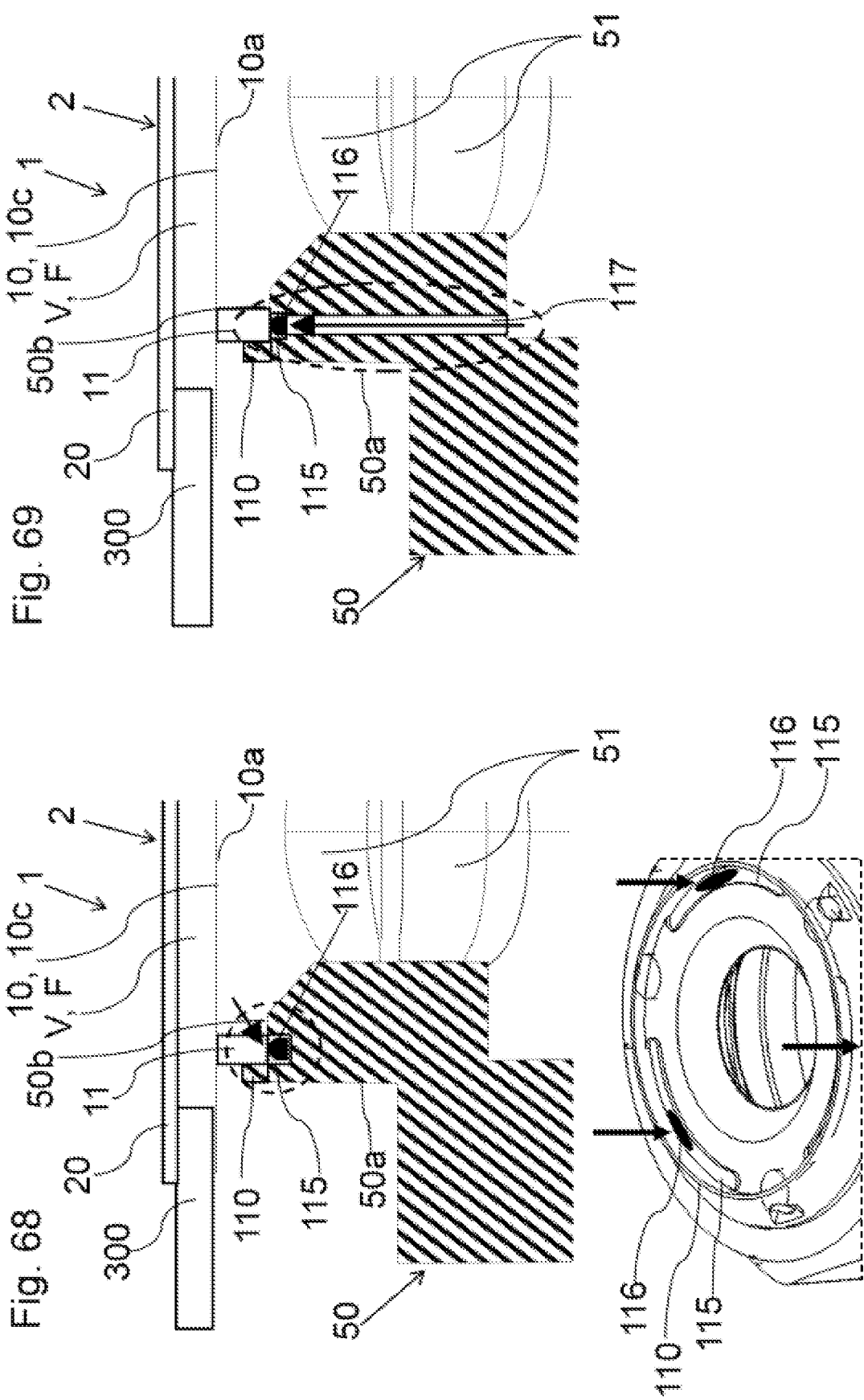

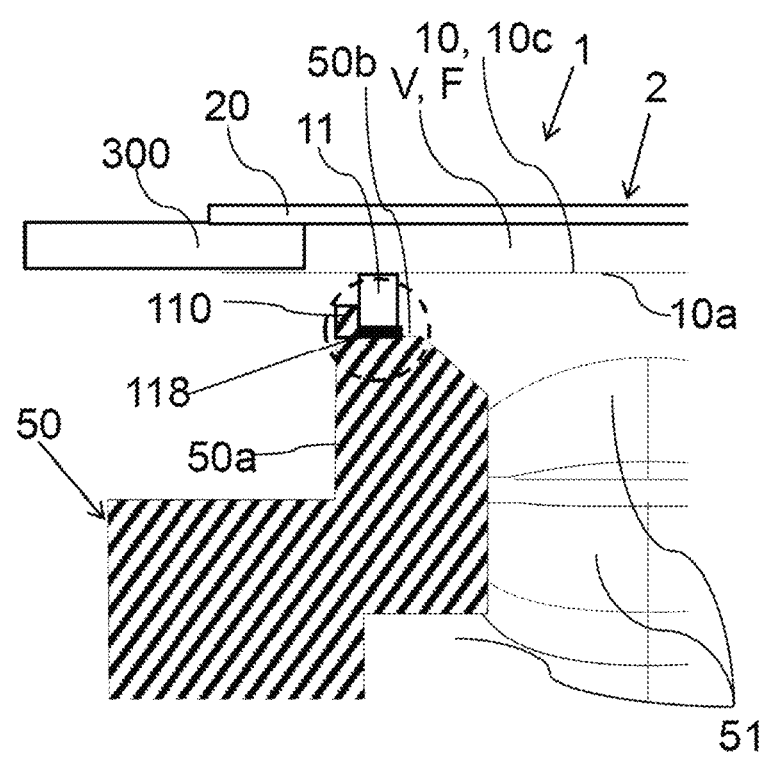

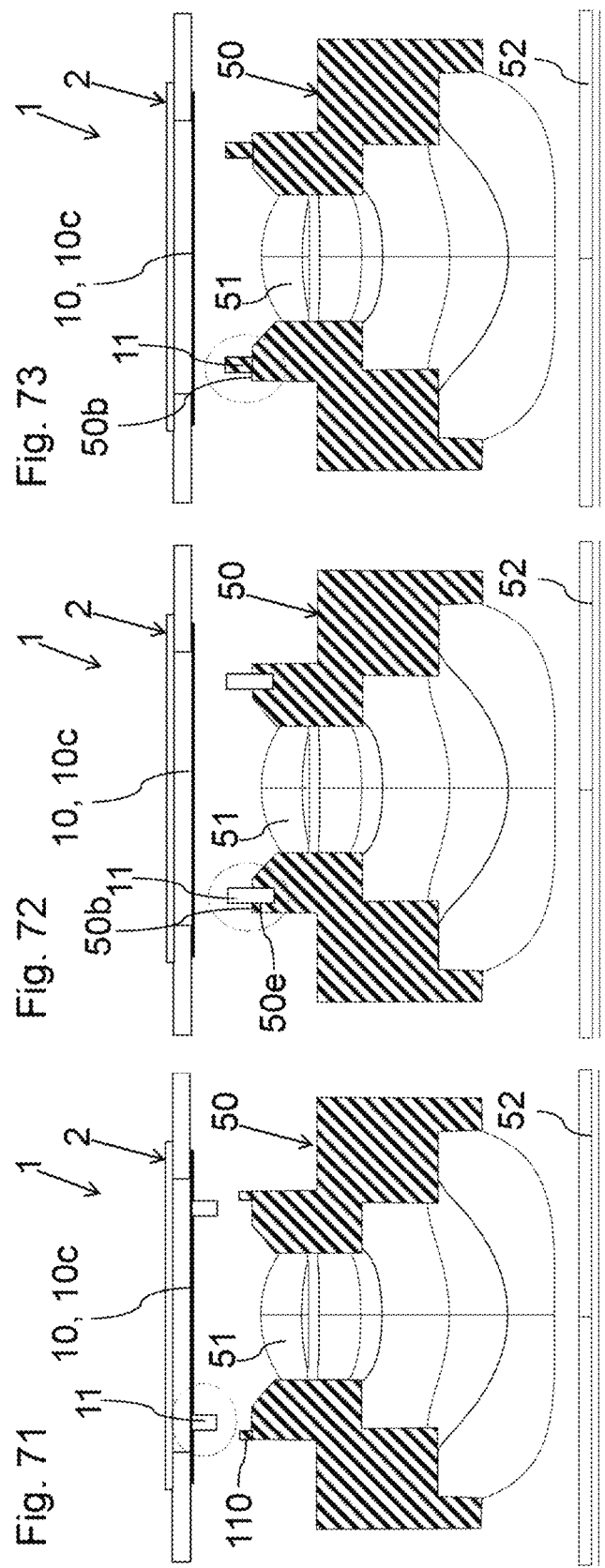

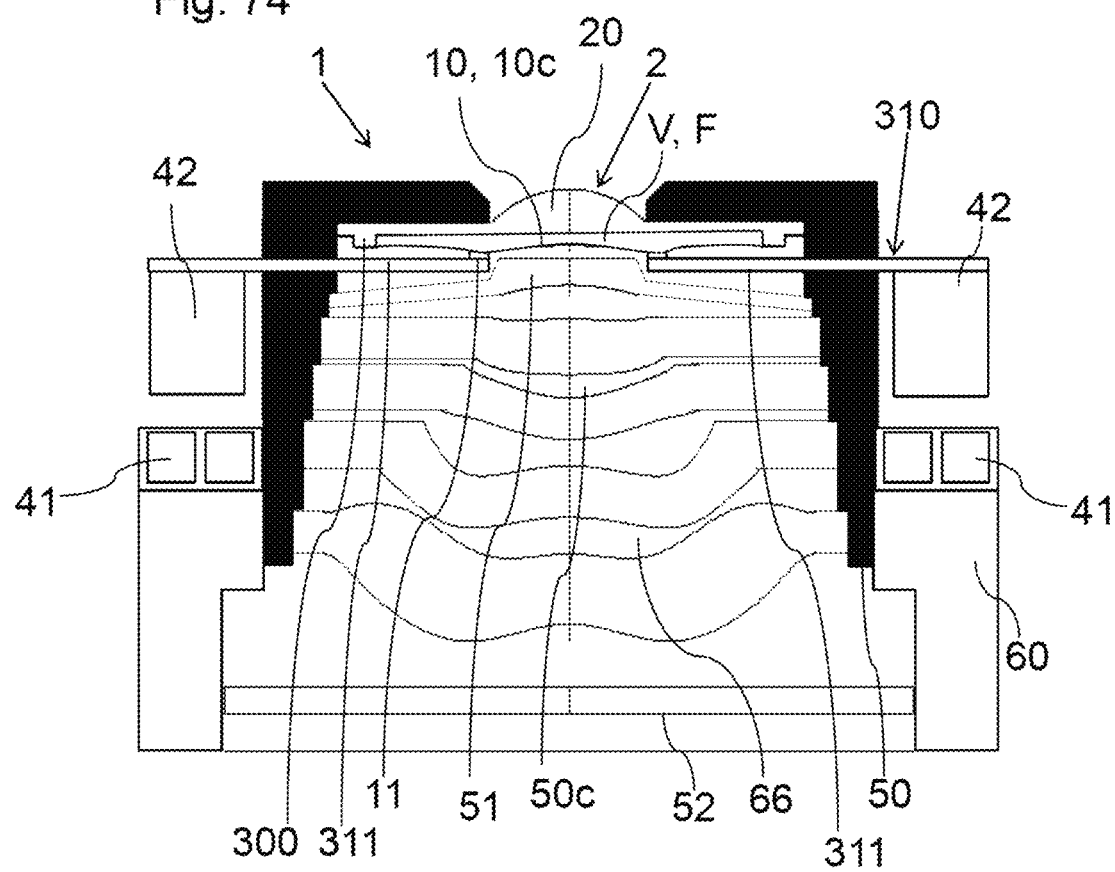

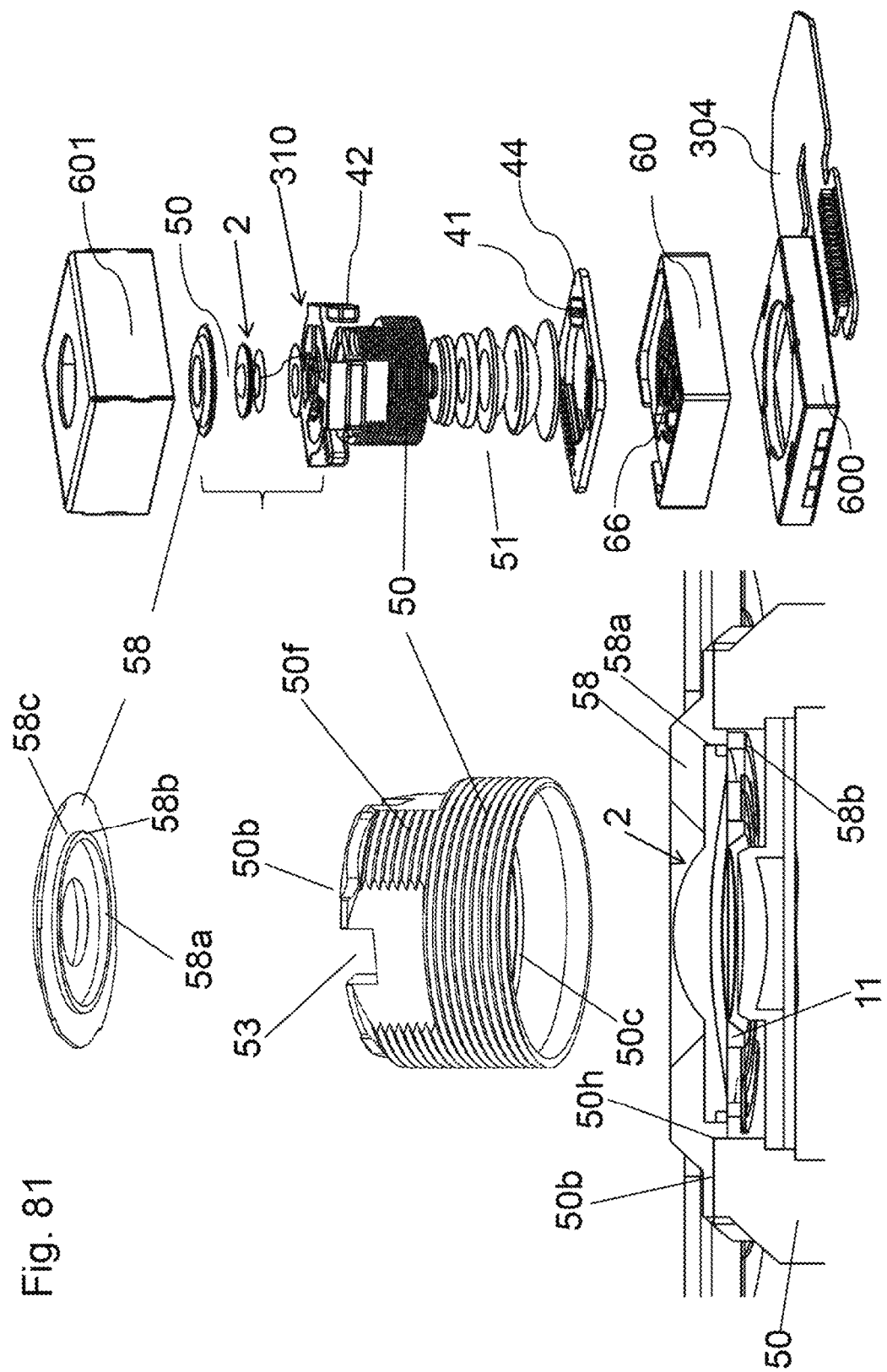

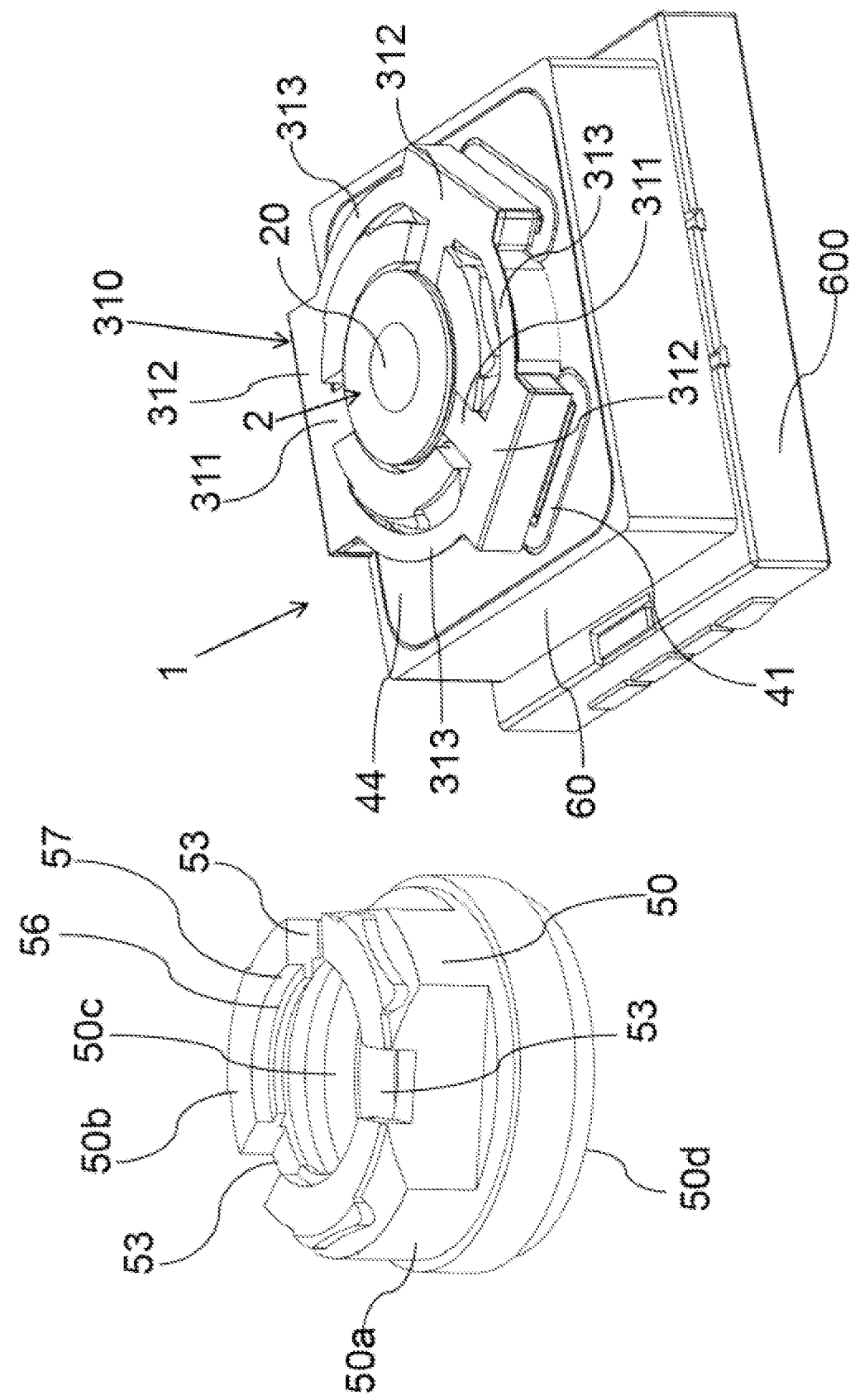

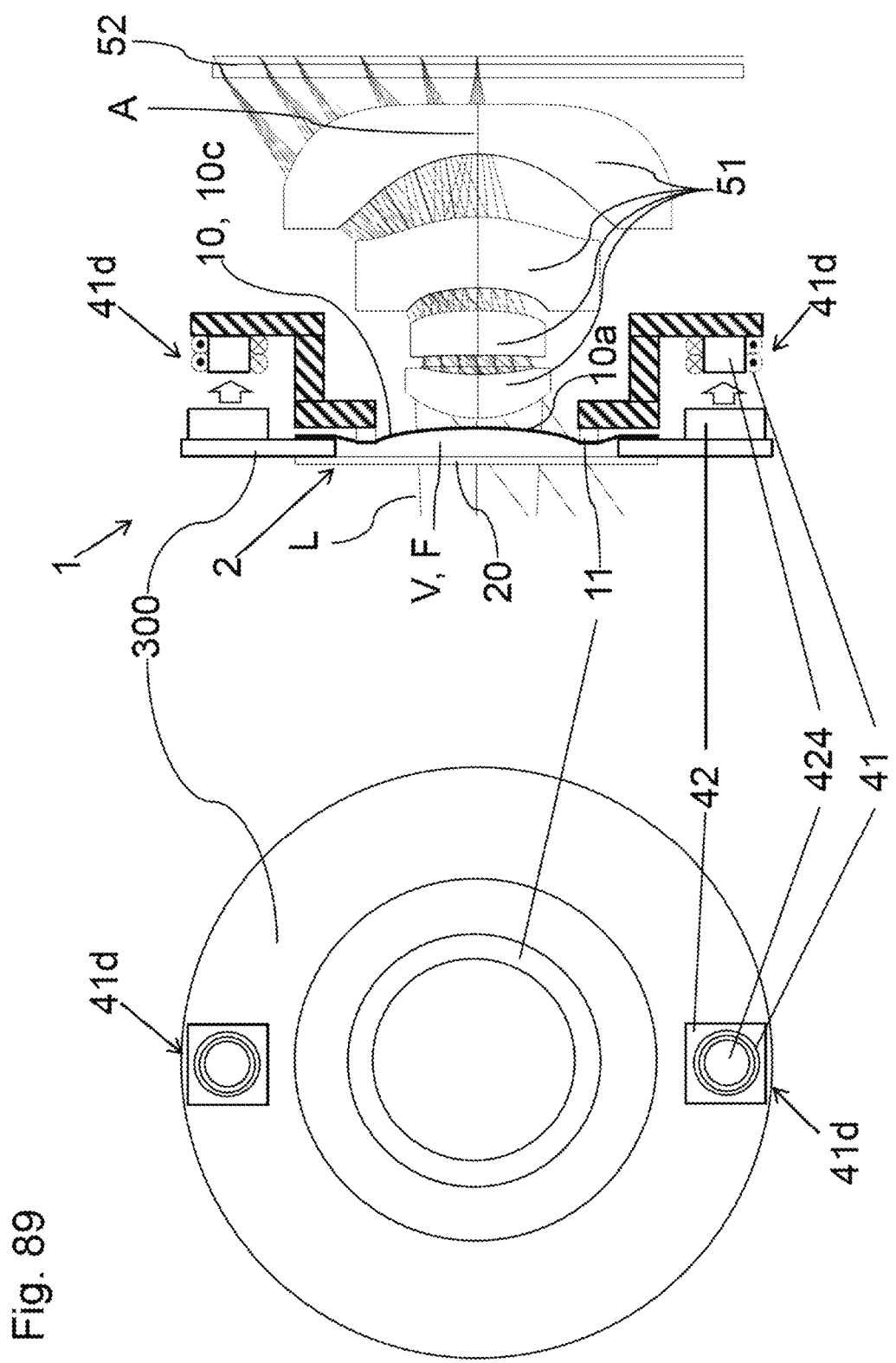

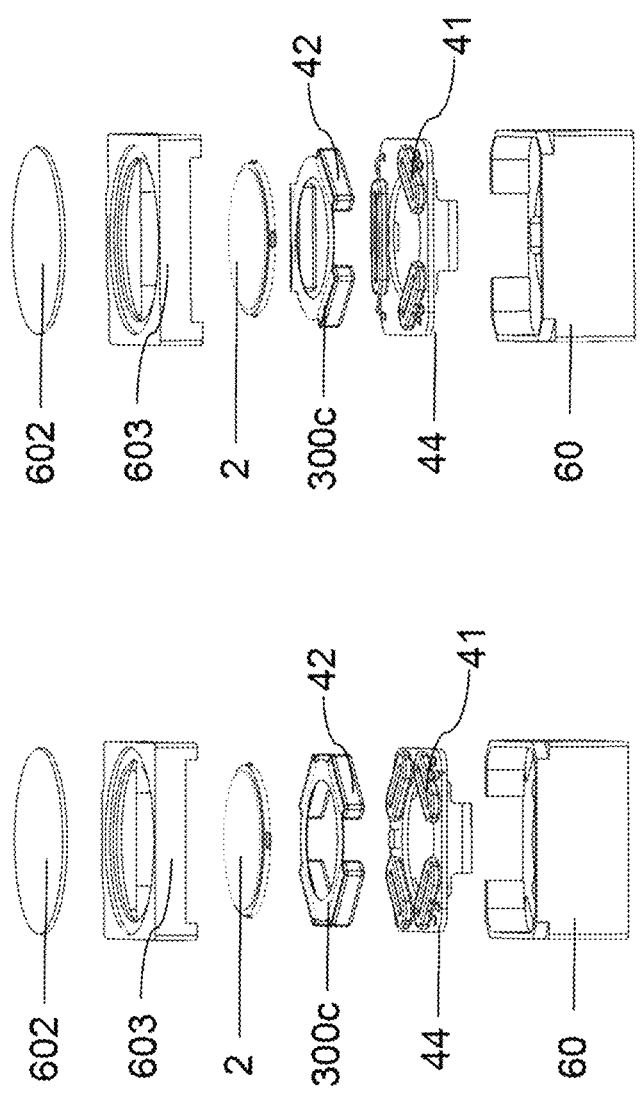

OPTICAL DEVICE, PARTICULARLY CAMERA, PARTICULARLY COMPRISING AUTOFOCUS, IMAGE STABILIZATION AND SUPER RESOLUTION

CROSS-REFERENCE TO RELATED APPLICATIONS

This is a Continuation of International Patent Application No. PCT/EP2017/054954, filed on Mar. 2, 2017, which claims priority to European Patent Application Nos. 16158246.5, filed on Mar. 2, 2016; 16178616.5, filed on Jul. 8, 2016; and 17150731.2, filed on Jan. 9, 2017. The contents of the foregoing patent applications are incorporated by referenced herein in their entirety.

FIELD

The invention relates to an optical device according to the preamble of claim 1. Further, the invention relates to a method for producing such an optical device.

BACKGROUND

An optical device of the afore-mentioned kind usually comprises a transparent and elastically expandable membrane, an optical element opposing or facing the membrane, a wall member, wherein the optical element and the membrane are connected to the wall member such that a container having a volume is formed, wherein at least the membrane, the optical element, and said wall member delimit said volume, a fluid residing in said volume, and a lens shaping member attached to an outside of the membrane, which outside faces away from said volume.

SUMMARY

Based on the above, the problem underlying the present invention is to provide an optical device that allows for tuning the focal length of the device as well for adjustments of the light beam direction (e.g. for the purpose of image stabilization, beam redirecting or super resolution) in a simple manner while allowing at the same time an easy calibration of the optical device.

This problem is solved by an optical device having the features of claim 1.

Preferred embodiments of the optical device are stated in the corresponding sub claims and are described below.

Further features and advantages of the present inventions as well as embodiments of the present invention shall be described in the following with reference to the Figures.

BRIEF DESCRIPTION OF THE FIGURES

FIG. 48 shows the realization of optical image stabilization (OIS), wherein the container is tilted with respect to a fixed lens shaping part to deflect light travelling towards the image sensor;

FIG. 49 shows the realization of OIS, wherein the lens shaping part is tilted with respect to a fixed container to deflect light travelling towards the image sensor;

FIG. 50 shows the realization of optical image stabilization (OIS), wherein the container is moved parallel to the image sensor with respect to the lens shaping part to shift light on the image sensor;

FIG. 51 shows the realization of OIS, wherein the lens shaping part is moved parallel to the image sensor with respect to the container to shift light on the image sensor;

FIG. 52 shows the realization of optical image stabilization (OIS), wherein the container is moved together with the lens barrel parallel to the image sensor to shift light on the image sensor;

FIG. 53 shows the realization of OIS, wherein the container together with the lens barrel is tilted/rotated to shift light on the image sensor;

FIG. 54 shows how the housing and/or coils may provide stops that delimit the travel of the container that is suspended via its membrane on the lens shaping part which in turn is connected to the lens barrel;

FIG. 55 shows centering of the container with respect to the lens barrel using a centering tool, wherein the container comprises a container centering face that is inserted into the tool in a form fitting manner;

FIGS. 56 to 58 demonstrate the reduction of temperature effects on the curvature of the membrane when the container is suspended merely via its membrane on the lens shaping part that is connected to the lens barrel;

FIGS. 62 to 65 show different possibilities for implementing air exchange channels or tunnels to allow venting of displaced air volumes;

FIGS. 66 to 70 show different possibilities for connecting the lens shaping part to the lens barrel;

FIGS. 71 to 73 show different embodiments of lens shaping parts;

FIG. 74 shows an embodiment of an optical device according to the invention of the kind shown in FIG. 44(C), wherein the container is embedded into the lens barrel and also forms a topmost rigid lens of the lens barrel;

FIGS. 80 to 82 show different ways of centering and assembling components of the optical device;

FIG. 89 shows a modification of the embodiment shown in FIG. 88;

FIGS. 90 to 92 show that four, three or even one magnet-coil pair can be used for actuating the container/focus adjustable lens;

DETAILED DESCRIPTION

Figure 1:
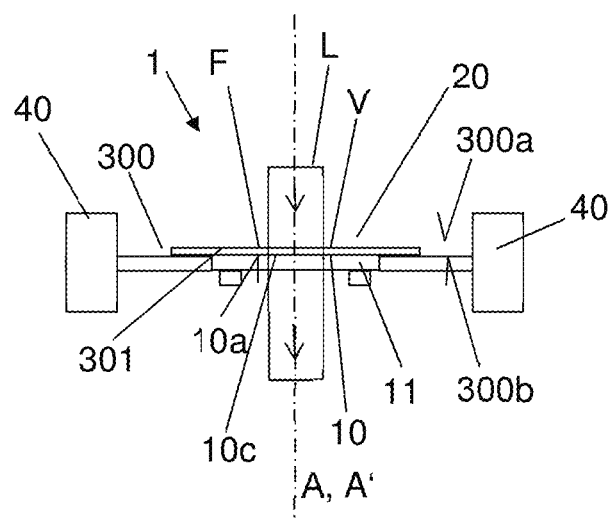
FIGS. 1-3 show schematical cross sectional views of an optical device according to the invention having a transparent optical element that is oriented parallel to the membrane (FIG. 1) or tilted with respect to the membrane (FIGS. 2 and 3) for deflecting a light beam passing through the volume of the tunable lens.

According to claim 1, the optical device according to the invention comprises a transparent and elastically expandable membrane, an optical element facing the membrane, a wall member, wherein the optical element and the membrane are connected to the wall member such that a container with a volume (internal space of the container) is formed, a fluid residing in said volume, and a lens shaping part that is in contact to the membrane for defining a curvature adjustable area of the membrane (and particularly for adjusting the curvature of said area of the membrane), which area faces said optical element, a circumferential lens barrel that surrounds an opening of the lens barrel in which at least one rigid lens is arranged that is held by the lens barrel (particularly. the lens barrel holds a plurality of stacked rigid lenses), and an actuator means that is designed to move the optical element in an axial direction with respect to the lens shaping part so as to adjust the pressure of the fluid residing in the container and therewith a curvature of said area (and therewith the focal length of the fluid lens/focus adjustable lens formed by the container and the fluid residing therein), particularly for providing autofocus (AF) of the optical device, wherein said axial direction is oriented perpendicular to a (fictitious) plane along which the lens shaping part extends (e.g. a plane spanned by the lens shaping part, see below. Alternatively, the actuator means is designed to move the lens shaping part in an axial direction with respect to the optical element/container, which axial direction is oriented perpendicular to a (fictitious) plane along which the rigid lens extends, so as to again adjust the pressure of the fluid residing inside the volume and therewith a curvature of said area (and therewith the focal length of the fluid lens/focus adjustable lens formed by the container and the fluid residing therein), particularly for providing autofocus of the optical device.

Particularly, the actuator means be any suitable actuator that is adapted for generating the above-stated movements. Particular embodiments of such actuators are described herein in detail.

Furthermore, generally, according to certain embodiments of the present invention, the optical device may be designed to at least one of:

tilt the optical element with respect to said plane along which the lens shaping part extends, particularly so as to form the volume into a prism, particularly for providing optical image stabilization (OIS);

tilt the lens shaping part with respect to said plane along which the rigid lens extends, particularly so as to form the volume into a prism, particularly for providing OIS;

move the container parallel to said plane along which the lens shaping part extends with respect to the lens barrel, particularly for providing OIS;

move the lens shaping part parallel to said plane along which the rigid lens extends with respect to the lens barrel and/or with respect to said container, particularly for providing OIS;

move the lens barrel together with said container (particularly for providing OIS), particularly parallel to an image sensor of the optical device, wherein the lens barrel is arranged in front of the image sensor;

tilt the lens barrel together with the container (particularly for providing OIS), particularly with respect to an image sensor of the optical device, wherein the lens barrel is arranged in front of the image sensor, According to an embodiment of the present invention, the lens shaping part is connected to said lens barrel (wherein particularly said at least one rigid lens of the lens barrel faces said area and said optical element such that light that passes through the optical element or is reflected by the optical element passes through said area and through said at least one rigid lens of the lens barrel), and wherein the optical device is designed to at least one of: tilt the optical element with respect to said plane, particularly so as to form the volume into a prism (or a wedge or a similar body), move the container parallel to said plane with respect to the lens barrel, or move the lens barrel together with the container (particularly parallel to an image sensor of the optical device).

Due to the fact, that the membrane can be elastically deformed for adjusting the curvature of said area, said container and the fluid residing therein form a focus adjustable (or tunable) lens.

Further, according to an embodiment of the optical device according to the invention, the actuator means is designed to tilt the optical element with respect to said plane along which the lens shaping part extends, particularly so as to form the volume into a prism for deflecting light passing through the volume.

Further, according to an embodiment of the optical device according to the invention, the actuator means is designed to tilt the lens shaping part with respect to said plane along which the rigid lens extends, particularly so as to form the volume of the container into a prism for deflecting light passing through the volume. Here, particularly, the lens shaping part is not fixed to the lens barrel but can be moved with respect to the lens barrel, wherein particularly the container is now fixed to the lens barrel.

Further, according to an embodiment of the optical device according to the invention, the actuator means is designed to move the container parallel to said plane along which said rigid plane extends with respect to the lens barrel for deflecting light passing through the volume. Also here, the lens shaping part is fixed to the lens barrel.

Further, according to an embodiment, the actuator means is designed to move the lens shaping part parallel to said plane along which the rigid lens extends with respect to the lens barrel and/or with respect to said container, particularly for deflecting light passing through the volume, Particularly, in this embodiment, the lens shaping part moves with respect to the lens barrel and is not fixed to the lens barrel.

Furthermore, according to an embodiment, the lens shaping part is connected to the circumferential lens barrel.

Furthermore, according to an embodiment, the actuator means is designed to move the lens barrel in the axial direction for moving the lens shaping part (that is fixed to the lens barrel) in said axial direction.

Particularly, according to an embodiment, the lens shaping part is plasma bonded to the membrane.

Further, particularly, a further actuator means/actuator may be provided that is designed to move said lens barrel parallel to an image sensor of the optical device, which image sensor faces the lens barrel, wherein said image sensor is arranged on a side of the lens barrel that faces away from the container (see also below).

Particularly, the fact that the lens shaping part contacts the membrane can mean that the lens shaping part contacts the membrane directly or indirectly via another material layer (e.g. formed by a glue etc.). The lens shaping part can further be attached to the membrane by bonding it directly to the membrane or via another material layer such as a glue layer.

Thus, particularly, the invention allows to axially shift and tilt a single component comprising the optical element, e.g. a glass plate, or a component comprising the lens shaping part for providing optical image stabilization, beam redirecting and/or super resolution while allowing at the same time to adjust the focal length of the focus adjustable lens comprising said membrane, the wall member, the fluid, and the optical element for providing e.g. an autofocus function.

Furthermore, advantageously, the optical device allows in principle a simple adjustment/calibration of the optical device due to the fact that the lens shaping part is arranged on the lens barrel. By moving the lens barrel with respect to e.g. an image sensor of the optical device or a projection plane and then fixing the lens barrel with respect to said image sensor/projection plane (i.e. upon production of the optical device) the optical device can be calibrated in a simple and efficient manner.

In an embodiment, the optical element is a transparent (e.g. flat) plate (e.g. glass plate) or a rigid lens and the optical device is a camera or a part of such a camera, which due to the invention, is particularly capable of automatically adjusting the focal length of the focus tunable lens, to perform image stabilization and/or super resolution. In an alternative embodiment, the optical element may be a mirror and the optical device is an optical scanning device or a part of such a device that can automatically deflect and focus a light beam.

Further, the integration or embedding of the lens shaping part into the lens barrel allows for a tolerance insensitive design, i.e. the optical element (e.g. flat glass plate) can be moved in x-y direction without reducing the optical quality meaning that the modulation transfer function is not affected by a lateral shift of the optical element (e.g. flat glass plate) with respect to the optical axis. In other words, all optical components that are alignment critical are referenced to the lens barrel, preventing a large tolerance chain.

Further, in an embodiment, the actuator means is designed to move the optical element/lens shaping part axially and to tilt it at the same time. For this, the actuator means is particularly designed to act on the wall member/optical element for moving the optical element axially and for tilting the optical element or to act on the lens shaping part for axially moving it and tilting it (see also below).

In other words, the current invention describes a new approach to make autofocus and image stabilization by deforming a tunable lens and integrating a tunable prism by moving only one element (optical element/wall member or lens shaping part). Furthermore, the same structure can be used to make super resolution imaging using image shifting. The optical resolution of current cameras especially in mobile phones is limited by the number of pixels available on an image sensor. The implementation of an optical zoom is difficult, expensive and requires a large volume. Particularly, by shifting the image by sub pixels and doing image post processing, the image resolution can be enhanced by a factor of 4 or 9 or even more resulting in a 2× or 3× or even higher zoom factor.

Particularly, the fluid resides in the volume such that the curvature of the membrane can be adjusted by adjusting the pressure (or force) exerted on the membrane (e.g. via the lens shaping part). Particularly, the fluid fills the volume completely.

Further, particularly, the notion, that e.g. the lens shaping part spans a plane or extends along a plane means that the lens shaping part spans or defines a fictitious plane or extends along such a fictitious (extension) plane. This plane being particularly a fictitious plane may be used for defining directions, such as an axial direction running perpendicular to said plane. Particularly, one may also state that said axial direction runs perpendicular to the lens shaping part. In embodiments, where the lens shaping part is a circumferential structure said structure or a surface thereof extends in said plane (and thus defines or spans said plane).

Particularly, when the optical element or lens shaping part is moved along the axial direction the lens shaping part presses against the membrane or pulls the membrane accordingly.

Particularly, the notion according to which the lens shaping part defines an area of the membrane that has an adjustable curvature may mean that the lens shaping part delimits, by being attached to the membrane or by contacting the latter, an elastically expandable (e.g. circular) area of the membrane, wherein particularly said area extends up to an (e.g. circumferential) inner edge of the lens shaping part. This area may also be denoted as optically active area since the light passes through this area of the lens and is affected by the curvature of this area.

When the lens shaping part presses against the membrane due to the movement of the optical element/wall member towards the fixed lens shaping part or due to the motion of the lens shaping part towards the container, the pressure of the fluid increases due to the essentially constant volume of the fluid in the container causing the membrane to expand and said curvature of said area of the membrane to increase. Likewise when the lens shaping part pushes less against the membrane or even pulls the membrane, the pressure of the fluid decreases causing the membrane to contract and said curvature of said area of the membrane to decrease. Increasing curvature thereby means that said area of the membrane may develop a more pronounced convex bulge, or that said area of the membrane changes from a concave or a flat state to a convex one. Likewise, a decreasing curvature means that said area of the membrane changes from a pronounced convex state to a less pronounced convex state or even to a flat or concave state, or changes from a flat or concave state to an even more pronounced concave state.

Further, when tilting, the actuator means is preferably designed to be controlled such that the pressure in the fluid is kept constant, so that the curvature of the membrane is kept constant upon tilting the wall member/optical element.

The membrane can be made of at least one of the following materials: a glass, a polymer, an elastomer, a plastic or any other transparent and stretchable or flexible material. For example, the membrane may be made out of a silicone-based polymer such as poly(dimethylsiloxane) also known as PDMS or a polyester material such as PET or a biaxially-oriented polyethylene terephtalate (e.g. "Mylar").

Further, the membrane can comprise a coating. Further, the membrane can also be structured, e.g. comprises a structured surface or have a variable thickness or stiffness across the membrane.

Further, said fluid preferably is or comprises a liquid metal, a gel, a liquid, a gas, or any transparent, absorbing or reflecting material which can be deformed. For example, the fluid may be a silicone oil (e.g. Bis-Phenylpropyl Dimethicone). Additionally the fluid may include fluorinated polymers such as perfluorinated polyether (PFPE) inert fluid.

Furthermore, the optical element and/or the at least one rigid lens in the lens barrel is preferably rigid compared to the membrane. Preferably, the optical element is formed out of or comprises: a glass, a plastic, a polymer, or a metal. It can comprise or can be formed as a (e.g. glass) flat window, a lens, a mirror, a micro structured element with refractive, diffractive and/or reflective structures.

Further, in an embodiment of present invention the optical element may comprise a coating (e.g. anti-reflection).

Further, according to an embodiment of the present invention, the actuator means is designed to move the optical element or the lens shaping part axially and to tilt it at the same time, preferably such that the axial movement and the tilt movement can be defined as control variables. Further, particularly, the actuator means is designed to act on the wall member for moving the optical element axially and for tilting the optical element, or to act on the lens shaping part or members connected thereto for moving the optical element axially and for tilting the optical element.

Preferably, in an embodiment, the optical device comprises a guiding means for guiding a movement of the lens barrel with respect to the membrane upon mounting of the lens barrel in the optical device. This guiding means may be formed by a housing of the optical device that may form a recess for receiving the lens barrel such that the latter is guided towards the membrane upon mounting (e.g. pushing or screwing) of the lens barrel in the optical device or housing.

Furthermore, according to an embodiment of the present invention, the lens shaping part is integrally formed with the lens barrel and forms a face side or at least a part of the face side of the lens barrel (e.g. protrudes from said face side), wherein particularly said face side or said lens shaping part is attached to the membrane.

Furthermore, according to an alternative embodiment of the present invention, the lens shaping part is formed by a circumferential member or material layer (e.g. out of silicone or metal) that is connected to a face side of the lens barrel that faces the membrane.

Furthermore, according to an embodiment of the present invention, the lens shaping part is plasma bonded to the membrane using for example an oxygen plasma activation of the membrane and the lens shaper before putting the two elements in contact resulting in a bond between them.

Further, according to an embodiment of the present invention, the membrane is plasma bonded to said wall member of the container.

Further, according to an embodiment of the present invention, the lens shaping part or said circumferential member is a mold insert that is connected to the lens barrel upon injection molding of the lens barrel, which member/lens shaping part is embedded in a recess of the face side of the lens barrel.

Further, according to an embodiment of the present invention, the lens shaping part (e.g. circumferential member) is glued to the lens barrel with a glue so as to connect the lens shaping part to the lens barrel.

Further, according to an embodiment of the present invention, the lens barrel comprises a protrusion protruding from the face side of the lens barrel, which protrusion is configured to center the lens shaping part (that is to be connected/glued to the lens barrel) with respect to the lens barrel when the lens shaping part engages with the protrusion in a form fitting manner.

Further, according to an embodiment of the present invention, the lens shaping part is configured to encompass the protrusion when the lens shaping part is engaged with the protrusion.

Further, according to an alternative embodiment of the present invention, the protrusion is configured to encompass the lens shaping part when the lens shaping part is engaged with the protrusion.

Further, according to an embodiment of the present invention, the face side of the lens barrel comprises at least one recess that forms a discontinuity of the protrusion so that air can pass through said recess (and below the lens shaping part) from an outside of the lens barrel into a region adjacent said membrane and surrounded by the lens shaping part (i.e. a region between the membrane and a topmost rigid lens of the lens barrel). This allows venting of said region when the curvature of said curvature adjustable area of the membrane changes, which corresponds to a change of the volume of said region.

Further, according to an embodiment of the present invention, the lens barrel comprises at least one channel extending beneath said protrusion, and particularly beneath said face side of the lens barrel, so that air can pass through said at least one channel from an outside of the lens barrel into a region adjacent said membrane and surrounded by the lens shaping part (i.e. a region between the membrane and the topmost rigid lens of the lens barrel), so that again a venting of said region is possible, see above. Particularly, here, the protrusion comprises no discontinuity, but forms an annular protrusion.

Further, according to an embodiment of the present invention, the lens barrel comprises at least one channel, so that air can pass through said at least one channel from an outside of the lens barrel into a region adjacent said membrane and surrounded by the lens shaping part (i.e. a region between the membrane and topmost rigid lens of the lens barrel), so that a venting of said region is possible, see above, wherein said at least one channel comprises a first section extending from a lateral outside of the lens barrel in a radial direction of the lens barrel (i.e. perpendicular to the optical axis of the lens barrel) into the lens barrel and a second section which is in fluid communication with the first section, which second section extends parallel to the optical axis of the lens barrel and leads to the face side of the lens barrel.

Further, according to an embodiment of the present invention, for applying glue for connecting the lens shaping part to the face side of the lens barrel, the lens barrel comprises at least one or several glue pockets on the face side of the lens barrel for receiving said glue, wherein the at least one glue pocket is arranged beneath the lens shaping part.

Further, according to an embodiment of the present invention, the at least one glue pocket extends further outward in the radial direction of the lens barrel than the protrusion, i.e., the lens shaping part is configured to encompass said centering protrusion. Particularly, in this way, the at least one glue pocket is accessible for applying glue to the at least one glue pocket from a lateral outside of the lens barrel.

Further, according to an alternative embodiment, the at least one glue pocket extends further inward in the radial direction of the lens barrel than the protrusion. Here, the lens shaping part is configured to be encompassed by said centering protrusion of the lens barrel.

Further, according to an embodiment of the present invention, the at least one glue pocket extends beneath the protrusion, and particularly leads to a lateral outside of the lens barrel so that at least one glue pocket is accessible from said outside for applying said glue to the at least one glue pocket.

Further, according to an embodiment of the present invention, the at least one glue pocket comprises an elongated curved shape, and particularly extends along the protrusion along an inside of the protrusion, i.e. further inward in the radial direction of the lens barrel/protrusion than the protrusion.

Further, according to an embodiment of the present invention, the lens barrel comprises at least one through hole (e.g. formed in a circumferential wall of the lens barrel), which through hole extends along the optical axis of the lens barrel and leads to the at least one glue pocket (i.e., is in fluid communication with the glue pocket) so that the glue can be applied to the at least one glue pocket via said through hole.

Further, according to an embodiment of the present invention, said glue used for connecting the lens shaping part to the face side of the lens barrel is a double-faced adhesive tape that is arranged on the face side of the lens barrel between the face side of the lens barrel and the lens shaping part, wherein particularly the tape is surrounded by the protrusion for centering the lens shaping part, which protrusion extends further outward in the radial direction of the lens barrel than the tape.

Further, according to an embodiment of the present invention, the container is arranged outside the lens barrel in front of the lens barrel, particularly in front of the face side of the lens barrel. Particularly, in this embodiment, the container, i.e., the fluid lens, can be provided as an add-on assembly that can be used together with a conventional lens barrel, wherein the lens shaping part is provided on a face side of the lens barrel.

Further, according to an embodiment of the present invention, the container (i.e. the optical element, wall member and membrane and the fluid enclosed by the container) is suspended (or supported) via the membrane on the lens shaping part. By suspending/supporting the container (also denoted as lens core) with the membrane on the lens shaping part, the entire container/fluid lens moves up in case of a temperature expansion of the fluid and strongly reduces the optical effect of temperature changes.

Further, according to an alternative embodiment of the present invention, the container is at least partially, particularly completely, arranged in said opening of the lens barrel so that the container is embedded into the lens barrel.

Further, according to an embodiment of the present invention, the optical element forms of the container forms a topmost rigid lens of the lens barrel (which topmost rigid lens can be said at least one rigid lens). Particularly, the optical device may comprise several rigid lenses arranged in the opening of the lens barrel, which rigid lenses are arranged on top of one another, i.e., all other rigid lenses contained in the lens barrel are arranged between the topmost rigid lens and an image sensor of the optical device.

Furthermore, according to an embodiment of the present invention, the optical device comprises a housing that surrounds the lens barrel. The housing may comprise a top side having an opening through which light can enter the housing, pass through the focus adjustable lens and the lens barrel with its at least one rigid lens in order to e.g. impinge on an image sensor such as a CMOS, CCD, avalanche diode array or an retina.

Particularly, in an embodiment, the housing forms stops for limiting the travel of the container. Particularly, the movement of the container towards the image sensor can be limited by the coils of the actuator means/actuator (when the coils are arranged on the housing and the magnets are connected to the container/wall member, see below) or by the magnets (when the coils are connected to the container/wall member and the magnets are arranged on the housing, see below).

Particularly, in all embodiments the housing can comprise a shield configured for shielding the optical device against electromagnetic radiation. Particularly in dual-camera configurations, the cameras can be shielded form each other. Particularly the shield serves for shielding the actuator means from outside influences. Particularly, in an embodiment, the shield may form said stops for limiting the travel of the container.

Further, according to an embodiment of the present invention, the housing comprises a recess configured for receiving the lens barrel in a form-fitting manner, wherein particularly said recess is further configured to guide the lens barrel upon mounting of the lens barrel into the housing (see also above).

Further, according to an embodiment of the present invention, said recess comprises an internal thread that is configured to engage with an external thread of the lens barrel, which external thread is formed on the lateral outside of the lens barrel, for adjusting a distance of the lens barrel to an image sensor of the optical device.

Further, according to an embodiment of the present invention, the recess comprises a circumferential step that forms a stop for positioning the lens barrel with respect to an image sensor of the optical device, wherein particularly the lens barrel comprises a surface region on its lateral outside for butting against the stop formed by the recess.

Further, according to an embodiment of the present invention, the lens shaping part is connected to a lens shaping part carrier for carrying the lens shaping part, wherein the lens shaping part carrier comprises legs connected to the lens shaping part, wherein the legs are particularly integrally connected to the lens shaping part, and wherein the respective leg particularly extends from the lens shaping part outward through an associated slot formed in the lens barrel, wherein particularly the respective leg interacts with the actuator means/actuator for moving the lens shaping part in the axial direction and/or for tilting the lens shaping part (see also above).

Further, according to an embodiment of the present invention, the respective leg is connected an associated holding member for holding a magnet of the actuator means. Particularly, the respective leg is integrally connected to its associated holding member. Further, particularly, the respective holding member is arranged outside the lens barrel, wherein particularly each two neighboring holding members are connected by a connecting member. Particularly, the respective connecting member integrally connects the respective neighboring holding members to one another, wherein particularly the respective connecting member also extends outside the lens barrel along the lateral outside of the lens barrel.

Further, according to an embodiment of the present invention, the lens shaping part carrier comprises spring members, wherein the respective spring member is (e.g. integrally) connected to an associated leg of the lens shaping part carrier, wherein the spring members are configured to center/position the lens shaping part with respect to the lens barrel.

Further, according to an embodiment of the present invention, the respective slot is formed into a bottom of the lens barrel, which bottom faces away from the container, wherein particularly the respective slot extends along the optical axis of the lens barrel.

Further, according to an embodiment of the present invention, the container is inserted from the bottom into the opening of the lens barrel and is centered by a circumferential surface region of an inside of the lens barrel, wherein the container engages in a form fitting manner with said surface region.

Further, according to an embodiment of the present invention, the lens shaping part carrier together with the lens shaping part is inserted from the bottom into the opening of the lens barrel so that particularly the lens shaping part contacts said membrane, wherein each spring member is arranged with an end section on an associated surface area of an inside of the lens barrel so as to center the lens shaping part with respect to the lens barrel/container.

Further, according to an alternative embodiment of the present invention, the respective slot is formed not into the bottom of the lens barrel but into a face side of the lens barrel, which face side faces away from an image sensor of the optical device/bottom of the lens barrel, wherein particularly the respective slot extends along the optical axis of the lens barrel.

Further, according to an embodiment of the present invention, the container is inserted together with the lens shaping part and the lens shaping part carrier into a separate lens barrel top part to form a sub assembly that is then inserted into the lens barrel from the face side so that the container and the lens shaping part are centered with respect to the lens barrel and the respective leg of the lens shaping part carrier is arranged in its associated slot. Here, particularly, the container engages in a form fitting manner with an associated circumferential surface region of an inside of the lens barrel top part, wherein particularly each spring member is arranged with an end section on an associated surface area of the lens barrel top part, and wherein the lens barrel top part engages in a form fitting manner with a further circumferential surface region with an inside of the lens barrel at the face side of the lens barrel so that the container and the lens shaping part are centered with respect to the lens barrel.

Further, according to an alternative embodiment of the present invention, the lens shaping part carrier together with the lens shaping part is inserted from the face side of the lens barrel into the opening of the lens barrel, wherein each spring member is arranged with an end section on an associated surface area of an inside of the lens barrel so as to center the lens shaping part with respect to the lens barrel/container, and wherein said legs are arranged in the slots formed in the face side of the lens barrel.

Further, according to an embodiment of the present invention, the container is inserted from the face side into the opening of the lens barrel and is centered by a circumferential surface region of an inside of the lens barrel, wherein the container engages in a form fitting manner with said surface region.

Furthermore, according to an embodiment of the present invention, particularly when the optical element/container is moved with respect to the lens shaping part fixed to the lens barrel, the wall member of the container is connected via at least one spring member (particularly four spring members) to the housing so that the wall member is elastically coupled to the housing such that when the wall member is moved out of a resting position a restoring force is exerted on the wall member Furthermore, according to an embodiment of the present invention, the wall member is circumferential member connected via spring members to a frame member that surrounds the wall member. Particularly, in an embodiment, the wall member is integrally connected to the spring members, which are in turn integrally connected to the frame member. The wall member, the spring members and the frame members may be formed out of a metal, particularly out of a magnetic steel.

Further, according to a preferred embodiment of the present invention, the wall member is formed by a plate having a continuous recess (e.g. in the center of the plate), which recess extends from a first side of the wall member to a second side of the wall member, which second side faces away from the first side, wherein preferably the optical element is connected to the first side so as to cover said recess, and wherein preferably said membrane is connected to the second side of the wall member so as to cover said recess from the other side. In this way said closed container is formed for receiving the fluid of the focus adjustable lens.

Furthermore, according to an embodiment of the present invention, the wall member is flat (e.g. plate-like) annular member that may comprise a central recess as described above and that is connected via four spring members to the surrounding frame member, wherein the spring members are integrally connected to the wall member and integrally connected to the frame member, which frame member in turn is connected to the housing. Particularly, in an embodiment the spring members comprise a meandering course. Further, the spring member may be connected to corner regions of the (e.g. rectangular) frame member.

Furthermore, according to an embodiment of the present invention, the actuator means comprises one electrically conducting coil or a plurality of electrically conducting coils, particularly three or four coils, and at least one magnet, wherein each coil faces the at least one magnet in the axial direction, and wherein each coil is configured to interact with the at least one magnet such that when a current is applied to a coil, the respective coil is moved with respect to the at least one magnet and in particular the respective coils is either moved towards the at least one magnet or away from the at least one magnet (or the at least one magnet is either moved towards the respective coil or away from the respective coil) depending on the direction of the current in the respective coil. The at least one magnet may comprise an annular shape. Further, the at least one magnet may be arranged in a magnetic flux return structure that may be made out of a magnetically soft metal such as steel.

Alternatively, according to an embodiment of the present invention, the actuator means comprises one electrically conducting coil or a plurality of electrically conducting coils, particularly three or four coils, and a corresponding number of magnets (e.g. three or four magnets), wherein each magnet is associated to one of the coils, wherein each coil faces its associated magnet in the axial direction, and wherein each coil is configured to interact with its associated magnet such that when a current is applied to a coil, the respective coil is either moved towards its associated magnet or away from its associated magnet (or the associated magnet is either moved towards the respective coil or away from the respective coil) depending on the direction of the current in the respective coil. Further, said magnets may each be arranged in a magnetic flux return structure that may be made out of a magnetically soft metal.

Furthermore, according to an embodiment of the present invention, the respective coil comprises a conductor that is wound around a coil axis running perpendicular to said plane along which the lens shaping part extends (e.g. when the coils are arranged on the housing and the magnets on the wall member) or running perpendicular to said optical element (e.g. when the coils are arranged on the wall member and the magnets on the housing), wherein the respective coil faces its associated magnet (or the at least one magnet) so that when a current is applied to the respective coil, a Lorentz force is generated that causes the associated magnet (or the at least one magnet) and the respective coil to attract each other or to repel each other depending on the direction of the current in the respective coil.

Furthermore, according to an embodiment of the present invention, the magnets (or the at least one magnet) are magnetized in the axial direction (e.g. when the magnet are arranged on the housing) or in a direction running perpendicular to said optical element (e.g. when the magnets are arranged on the wall member).

Further, according to a preferred embodiment of the present invention the actuator means may comprise a plurality of coils (e.g. three or four coils) wherein each coil preferably surrounds an associated magnet, which magnet is preferably magnetized in a direction running parallel to the wall member (e.g. when magnets are connected to the wall member) or perpendicular to the axial direction (when the magnets are arranged on the housing), wherein the magnetization may point towards a central axis of the optical device. Further, the respective coil axis may extend parallel to the axial direction (e.g. when the coils are arranged on the housing) or perpendicular to the wall member (e.g. when the coils are connected to the wall member).

Further, according to an embodiment, the magnets (or the at least one magnet) are connected to the wall member, e.g. to the second or lower side of the wall member to which also the membrane is attached, while the coils are arranged on the housing, e.g. on a side facing the wall member. Here, the coils may be integrated or embedded into said side of the housing. Here, when the magnets are connected to the wall member, the magnets (or the at least one magnet) move with respect to the coil and in particular move towards or away from the respective coil, which particularly comprises a fixed position on the housing. The magnets can also be connected to a container carrier (e.g. a lower side of the container carrier facing the coils) on which the wall member then rests. The container carrier that carries the container is then (particularly integrally) connected to the frame member via said at least one or several (e.g. four) spring members. The spring members may connect to corner regions of the frame member.

Further, according to an alternative embodiment, the magnets (or the at least one magnet) are arranged on the housing (e.g. on said side facing the wall member) while the coils are arranged on the wall member, wherein the coils are particularly integrated into the wall member. Here, when the coils are connected to the wall member, the respective coil moves with respect to the associated magnet and in particular moves towards or away from the associated magnet (or the at least one magnet), while said associated magnets (or said at least one magnet) comprise a fixed position on the housing.

Alternatively, the actuator means may also be formed as an electrostatic actuator means that comprises a plurality of top electrodes (particularly three or four electrodes), wherein each top electrode is associated to a bottom electrode that faces the top electrode in the axial direction. By applying a voltage between the respective top and bottom electrode, the optical element can be axially moved and/or tilted as well. Here the top electrodes may be arranged on the wall member while the bottom electrodes may be arranged on the housing.

Further, in an embodiment of the present invention, the wall member is formed as a circuit board (particularly printed circuit board) comprising the (e.g. four) spring members as integral portions, wherein the coils are integrated into the circuit board (particularly in several layers arranged on top of each other). Further, particularly, said circuit board extends out of the housing for making electrical contact to the circuit board.

Further, according to an embodiment the housing is arranged on a substrate, particularly in the form of a circuit board, particularly a printed circuit board.

Further, in an embodiment, an image sensor is arranged on said substrate such that the lens barrel is arranged above said image sensor wherein said axial direction runs perpendicular to the sensor surface formed by a plurality of photo sensors of the image sensor. Particularly, the image sensor may be a semiconductor charge-coupled device (CCD), a metal-oxide-semiconductor (CMOS) or an N-type metal-oxide-semiconductor (NMOS) sensor or any other light sensitive sensor.

Further, the optical element facing the image sensor preferably is a transparent optical element. Here, the optical device particularly forms a camera (e.g. for mobile phone).

Further, in an embodiment, the housing of the optical device comprises a spacer element for supporting the at least one spring element, wherein particularly the spacer supports said frame member to which the spring members extending outwards from the wall member are connected, wherein the spacer element is configured to expand in the axial direction with increasing temperature for compensating a temperature-induced increase of said fluid volume, which is residing in the container volume by moving the frame member and therefore the wall member away from the lens shaping part, thereby reducing the increased convexity of the membrane due to the thermal expansion of the fluid.

Furthermore, according to an embodiment of the present invention, the actuator means comprises one electrically conducting coil or a plurality of electrically conducting coils, particularly three or four coils, and a corresponding number of magnets, wherein each magnet is associated to exactly one of the coils, wherein each coil faces its associated magnet and wherein each coil is configured to interact with its associated magnet such that when a current is applied to a coil the respective coil and its associated magnet move with respect to each other depending on the direction of the current in the respective coil.

Particularly, according to an embodiment, each magnet is connected to an associated holding member, wherein particularly said plurality of electrically conducting coils is arranged on/fixed to the housing. Thus, here, the magnets particularly move with respect to the coils which are fixed to the housing of the optical device. Further, according to an embodiment, said plurality of electrically conducting coils is arranged on a circuit board that is arranged on/fixed to the housing. Further, particularly, the circuit board comprises an (e.g. central) through hole that is aligned with said recess of the housing for receiving the lens barrel.

Further, generally, each coil of the actuator means/actuator is one of or comprises one of: an air coil, a planar coil, or a PCB coil (i.e. a coil integrated into a printed circuit board (PCB)), wherein a planar coil comprises an electrically conducting conductor that is wound in a single plane about a winding axis that runs perpendicular to said single plane.

Furthermore, according to an embodiment the circuit board (particularly printed circuit board) comprises a plurality of (e.g. flexible) sheets that are folded on one another so that the circuit board comprises a stack of said sheets, wherein each sheet comprises a plurality of planar coils so that said stack of sheets forms said plurality of electrically conducting coils.

Further, according to an embodiment, the actuator means/actuator comprises one or a plurality of electropermanent magnets arranged on the housing, particularly, two, three or four electropermanent magnets, and a corresponding number of soft magnetic members connected to the container (particularly to the wall member), wherein each soft magnetic member is associated to exactly one of the electropermanent magnets, and wherein each soft magnetic member is arranged adjacent its associated electropermanent magnet such that a gap is formed between the respective soft magnetic member and its associated electropermanent magnet, wherein for moving the optical element (or the container) in said axial direction and/or for tilting the optical element (or said container) the respective electropermanent magnet is configured to attract its associated soft magnetic member (e.g. by means of a reluctance force that minimizes the respective gap) when a corresponding voltage pulse is applied to the respective electropermanent magnet that adjusts the magnetic strength of the external magnetic field of the respective electropermanent magnet that causes said attraction.

Further, according to an embodiment of the present invention, the actuator means/actuator comprises one or a plurality of electropermanent magnets arranged on the housing, particularly, two, three or four electropermanent magnets, and a single soft magnetic member formed by the wall member, wherein each electropermanent magnet faces the wall member in the axial direction such that a gap is formed between the wall member and the respective electropermanent magnet, wherein for moving the optical element (or the container) in said axial direction and/or for tilting the optical element (or said container) the respective electropermanent magnet is configured to attract said wall member (e.g. by means of a reluctance force that minimizes the respective gap) when a corresponding voltage pulse is applied to the respective electropermanent magnet that generates an external magnetic field of the respective electropermanent magnet that causes said attraction.

Further, according to an embodiment of the present invention, the respective electropermanent magnet comprises a first magnet having a first coercivity and a second magnet having a second coercivity being smaller than the first coercivity, and wherein an electrically conducting conductor is wound around the second magnet to form a coil enclosing the second magnet (and particularly also the first magnet), so that when a voltage pulse is applied to the coil so as to switch the magnetization of the second magnet an external magnetic field/magnetic flux of the respective electropermanent magnet is generated that causes said attraction (e.g. respective reluctance force describe above). Further, particular, the two magnets of the respective electropermanent magnet are arranged between two pole pieces for guiding magnetic flux, which pole pieces form the respective gap with the associated soft magnetic member.

Further, according to an embodiment of the present invention, the magnetizations of the magnets are oriented parallel to said plane along which the lens shaping part extends (or perpendicular to said axial direction).

Further, according to an embodiment of the present invention, the respective soft magnetic member is arranged offset perpendicular to the axial direction with respect to the associated electropermanent magnet, wherein particularly the respective electropermanent magnet extends further outward in the radial direction of the lens barrel than the associated soft magnetic member.

Further, according to an embodiment of the present invention, the actuator means comprises one or a plurality of electromagnets arranged on the housing, particularly, two, three or four electromagnets, and a corresponding number of soft magnetic members or magnets connected to the container (particularly to the wall member), wherein each soft magnetic member or magnet is associated to exactly one of the electromagnets, wherein each soft magnetic member or magnet is arranged adjacent its associated electromagnet, wherein for moving the optical element (or the container) in said axial direction and/or for tilting the optical element (or said container) the respective electromagnet is configured to attract or repel its associated soft magnetic member (e.g. by means of a magnetic force) when a corresponding current is applied to the respective electromagnet that generates an external magnetic field of the respective electromagnet that causes said attraction or repulsion.

Further, according to an embodiment of the present invention, the respective electromagnet comprises a magnetic core, wherein an electrically conducting conductor is wound around the magnetic core about a winding axis to form a coil enclosing the magnetic core, so that when a current is applied to the coil an external magnetic field/magnetic flux of the respective electromagnet is generated that causes said attraction.

Further, according to an embodiment of the present invention, the respective winding axis is oriented parallel to said plane along which the lens shaping part extends (or perpendicular to said axial direction).

Further, according to an embodiment of the present invention, the respective soft magnetic member is arranged offset perpendicular to the axial direction with respect to the associated electromagnet, wherein particularly the respective electromagnet extends further outward in the radial direction of the lens barrel than the associated soft magnetic member.

Further, according to an embodiment of the present invention, the respective winding axis runs perpendicular to said plane along which the lens shaping part extends (i.e. parallel to the axial direction).

Further, according to an embodiment of the present invention, the respective soft magnetic member or magnet faces its associated electromagnet in the axial direction.

Further, according to a preferred embodiment of the present invention, the optical device comprises a position sensor means for detecting the spatial position of the optical element or of a component connected to the optical element such as the wall member or a position of the lens shaping part or of the lens shaping part carrier, e.g. with respect to a reference position such as the position of the lens shaping part (when the container/optical element is the movable and/or tiltable component) or with respect to a reference position such as the position of the container/lens barrel (when the lens shaping part is the movable and/or tiltable component). By adjusting the spatial position of the optical element/lens shaping part to a defined state, the optical properties of the optical device can be defined. This includes the optical power of the focus adjustable lens (comprising the deformable membrane, the optical element, the wall member, the fluid and the lens shaping part) as well as the angle of the variable prism.

Furthermore, according to an embodiment of the present invention, the optical device comprises a control unit.

Further, in an embodiment, the control unit is configured to control the actuator means/actuator (e.g. such that a measured position or temperature e.g. of the optical element reaches a desired position of the optical element) for automatically adjusting the focal length of the focus adjustable lens, particularly so as to provide an autofocus function of the optical device (e.g. camera).

Further, in an embodiment, particularly when the optical element is a mirror and the optical device is an optical scanning device (or a part thereof), the control unit is configured to control the actuator means/actuator (e.g. such that a measured position of the optical element reaches a desired position of the optical element) for automatically adjusting the tilt of the optical element, particularly so as to automatically deflect a light beam passing through the focus adjustable lens (e.g. for scanning purposes).

Further, according to a preferred embodiment of the present invention, the optical device further comprises a movement sensor means for sensing an (e.g. unintended rapid) movement of the optical device that is to be counteracted. The movement sensor means may be designed to detect a yaw movement and/or pitch movement, i.e. a rotation about two orthogonal axes, which axes are each orthogonal to the optical axis/axial direction.

Here, preferably, the control unit is designed to control the actuator means/actuator depending on a movement to be counteracted sensed by the movement sensor means such that the optical element is tilted by the actuator means/actuator with respect to said plane for changing the direction of an incident light beam passing through the optical device in a way that counteracts said sensed movement.

Furthermore, according to an embodiment of the present invention, said image sensor is an RGB image sensor comprising RGB pixels, wherein each RGB pixel consists of a Bayer pattern with four pixels, namely two pixels comprising a green filter (i.e. a filter transparent to green light), a pixel comprising a blue filter, as well as a pixel comprising a red filter, which four pixels are arranged in a square array, so that each four adjacent neighbouring filters that form a square together (i.e. are arranged on a square lattice to form one RGB pixel) comprise two green filters that are diagonally arranged in said square as well as a blue and a red filter also being arranged diagonally in the said square. Particularly, the individual pixels forming the RGB pixels are arranged in parallel rows that each extend in a first direction x and parallel columns that each extend in a second direction y that runs orthogonal to the first direction x. Such a filter array having a filter pattern that comprises 50% green, 25% red, and 25% blue filters is also denoted as Bayer filter and the corresponding image sensor as Bayer sensor, which is described in detail e.g. in U.S. Pat. No. 3,971,065.

Furthermore, according to an embodiment of the present invention, when particularly the image sensor is an RGB image sensor, the control unit is configured to control the actuator means/actuator such that an image projected onto the image sensor by the optical device (e.g. by the adjustable focus lens and the at least one lens arranged in the lens barrel) is successively shifted from an initial position merely by one pixel in the first direction, from the initial position merely by one pixel in the second direction, and from the initial position by one pixel in the first direction as well as by one pixel in the second direction by tilting the wall member and therewith the optical element or by tilting the lens shaping part (which forms the volume into said prism in the respective direction for yielding a corresponding deflection of the light passing through the adjustable focus lens), wherein particularly each of these four images projected onto the image sensor are recorded by means of the image sensor, which four recorded images are then superimposed by the optical device to form a single super-resolution image having a resolution being enhanced by a factor of four.

According to another embodiment, the control unit is configured to control the actuator means/actuator such that an image projected onto the image sensor by the optical device (e.g. by the adjustable focus lens and the at least one lens arranged in the lens barrel) is moved by a fraction or multiple fractions of an RGB pixel (e.g. the fraction may be two thirds of an RGB pixel), wherein the optical device is configured to record the initial projected image as well as each shifted image by means of the image senor, and to superimpose these recorded images to form a high-resolution image. For instance, using a shift of two thirds of an RGB pixel, 9 images may be superimposed leading to an enhancement in resolution by a factor of 9.

Furthermore, according to an embodiment, the control unit is configured to control the actuator means/actuator such that the depth-of-field (DOF) of the optical device is extended, wherein particularly the optical device is configured to adjust the distance at which the optical device focuses during a single exposure, i.e., during generation of an image by means of the image sensor, for extending the DOF, or wherein particularly the optical device is configured to combine several images each being recorded by means of the image sensor at different focus distances, creating a 3D image using the so called depth from focus method.

Further, in an embodiment, the optical device comprises a supermacro capability, since the focus adjustable lens of the optical device according to the invention can focus with little deformation (e.g. 0.1 mm central thickness change assuming a lens diameter of 2 mm) very closely (e.g. 20 mm) by using a movable wall member that can cause a large change in focal length with a small movement (e.g. 0.05 mm).

Further, according to preferred embodiment of the optical device according to the invention, the latter is used in combination with an image sensor such that the resulting camera offers supermacro autofocus, optical image stabilization and/or super resolution imaging functionality and is particular used in a mobile phone camera or forms such a camera.

Particularly, the optical element can be configured to be moved in the axial direction for providing autofocus, particularly supermacro autofocus. In addition or alternatively, the optical element may be configured to be tilted to form the volume into a prism (or some other shape providing essentially the same effect) for providing optical image stabilization and/or super resolution imaging. Further, in addition or alternatively, the container may be configured to be moved parallel to said plane with respect to the lens barrel for providing optical image stabilization. Further, in addition or alternatively, said lens barrel may be configured to be moved parallel to said image sensor for providing image stabilization.

Furthermore, generally, the wall member can be integrally connected to the optical element. For instance, the optical element may comprise a recess that is covered by the membrane so as to form said container.

Further, according to an embodiment of the optical device according to the invention, said optical element forms a rigid lens, particularly a converging lens.

Furthermore, according to an embodiment of the optical device according to the invention said rigid lens formed by the optical element is a plano-convex lens.

Particularly in case of said plano-convex lens, said optical element comprises a convex surface area facing away from said membrane, and particularly comprises a flat surface facing towards the membrane.

Furthermore, the membrane generally comprises a front surface, which front surface faces away from the fluid residing in the volume of the container. Particularly, in all embodiments described herein, the front surface of the membrane can face the lens barrel and/or an image sensor of the optical device.

Alternatively, the front surface of the membrane can also face away from the lens barrel and/or from an image sensor of the optical device.

Furthermore, according to yet another embodiment (this can be applied to all containers described herein), the volume of the container tapers in a radial direction of the container towards the periphery of the volume/container, for reducing the amount of optical fluid and reducing the changes in optical performance due to temperature changes. Particularly, for this, the container may have a conically shaped periphery (e.g. instead of a flat periphery).

Further, according to an embodiment of the present invention, for protecting the membrane, and particularly for avoiding a rupture of the membrane due to a force/influence exerted on the membrane via the lens shaping part, the optical device comprises a sensor for sensing a mechanical shock of the optical device, wherein the optical device is configured to hold the actuator means in place, particularly by applying a corresponding current to the respective coils, when said sensor senses a mechanical shock of the optical device.

For instance, this safety feature could also be on standby when the optical device or a mobile phone comprising the optical device is turned off.

The sensor can be some sensor (e.g. a g-sensor) that forms a component of a smart phone/mobile phone or of some other device into which the optical device is integrated. Advantageously, the signal of said sensor can be used to apply a stabilizing current to the actuator/actuator means when the optical device is falling freely and before the optical device or the device (e.g. smart phone) that comprises the optical device according to the invention (e.g. camera) hits the ground or is shocked.

Furthermore, according to an embodiment of the present invention, the optical device comprises an image sensor for receiving light traveling through the container and through the at least one rigid lens of the lens barrel, and a memory for recording images generated with help of the image sensor, wherein the optical device is configured to conduct a series of focusing steps by corresponding adjustments of the curvature of the curvature adjustable area and to record an image for each focal length of the respective focusing step, and wherein the optical device is configured to combine the individual recorded images to a resulting image.

Particularly said combining of recorded images can be a so called focus stacking, wherein sharp regions (e.g. foreground, middle, background) of the recorded images are combined to form a single image that is particularly sharp in all its regions.

Furthermore, according to yet another aspect of the present invention, a method for producing (or calibrating) an optical device is proposed, wherein this method comprises the steps of:

arranging an adjustable focus lens in a housing of the optical device, the adjustable focus lens comprising a transparent and elastically expandable membrane, an optical element facing the membrane, and a wall member, wherein the optical element and the membrane are connected to the wall member such that a container with a volume is formed, in which a fluid is arranged, providing a lens barrel comprising a lens shaping part that is to be attached to the membrane for defining a curvature adjustable area of the membrane, and moving the lens barrel into the housing with the lens shaping part ahead towards the membrane until the lens shaping part acts on the membrane (e.g. presses against the membrane or pulls the membrane) such that the curvature of said area and therewith the focal length of the focus adjustable lens is adjusted to a desired value, and fastening the lens barrel to the housing, e.g. by gluing the lens barrel to the housing.

Alternatively, the lens shaping part is initially connected to the container. Then the process is conduct as follows instead:

arranging an adjustable focus lens in a housing of the optical device, the adjustable focus lens comprising a transparent and elastically expandable membrane, an optical element facing the membrane, and a wall member, wherein the optical element and the membrane are connected to the wall member such that a container with a volume is formed, in which a fluid is arranged, and wherein a lens shaping part is connected to the membrane such that a curvature adjustable area of the membrane is defined, providing a lens barrel, and moving the lens barrel into the housing towards the lens shaping part so that lens shaping part contacts the lens barrel, wherein that the curvature of said area and therewith the focal length of the focus adjustable lens is adjusted to a desired value, and fastening the lens barrel to the housing, e.g. by gluing the lens barrel to the housing.

Further, the lens shaping part is bonded to the membrane, particularly by means of plasma bonding, before said adjusting of the focal length.

Furthermore, according to an embodiment of the method according to the present invention, said container is formed by: providing the wall member (wherein particularly its central recess is generated by etching the wall member or by laser cutting it out or by stamping it), bonding (e.g. plasma bonding) a pre-stretched membrane to the wall member, deflecting the membrane using an underpressure (e.g. a vacuum) to form a depression for receiving the fluid, bonding the optical element to the wall member to enclose the fluid in the container, arranging the container such that the membrane is arranged on top, and degassing air through the membrane out of the volume of the container using an underpressure (e.g. vacuum).

Furthermore, in an embodiment, several containers are produced in parallel at the same time (batch processing).

Furthermore, according to an embodiment of the method according to the present invention, a plurality of connected containers is formed, wherein the individual containers are obtained by separating the containers, wherein said plurality of containers is formed by connecting transparent and elastically expandable membranes to an intermediate layer comprising a plurality of integrally connected wall members, providing said fluid in the containers and connecting optical elements to the intermediate layer to close the containers, wherein the connected wall members formed by the intermediate layer are separated to provide the individual fluid filled containers.

According to yet another aspect of the present invention, a further method for assembling an optical device according to the present invention is disclosed, comprising the steps of:

mounting the lens barrel on the image sensor and arranging the lens barrel in the housing, connecting the container (or wall member) to the at least one spring member, arranging the container on the lens barrel so that the container rests on the lens shaping part, wherein the lens shaping part contacts the membrane, and connecting, particularly gluing, the at least one spring member to the housing.

Furthermore, another method for producing an optical device according to the present invention is disclosed, comprising the steps of:

connecting a housing of the optical device to an image sensor, arranging a lens barrel in a recess of said housing, and adjusting the distance between the lens barrel and the image sensor to achieve a sharp focus for an infinite object distance, arranging electrically conducting coils on the housing, particularly by arranging a circuit board comprising said coils on the housing, providing an adjustable focus lens comprising a container having a transparent and elastically expandable membrane, an optical element facing the membrane, and a wall member, wherein the optical element and the membrane are connected to the wall member such that said container with a volume is formed, in which a fluid is arranged, arranging said container on a container carrier comprising magnets such that each magnet is associated to one of the coils, arranging the container carrier and container on the lens barrel such that a lens shaping part contacts the membrane for defining a curvature adjustable area of the membrane, wherein particularly upon arranging the container carrier and container on the lens barrel the lens shaping part is connected to the container or to the lens barrel, optionally mounting a cover glass to a cover frame;

optionally mounting the cover frame to the housing.

Furthermore, according to yet another aspect of the present invention, a further optical device is disclosed which particularly corresponds to a modification of the optical devices described above, wherein the further optical device comprises a transparent and elastically expandable membrane, an optical element facing the membrane, a wall member, wherein the optical element and the membrane are connected to the wall member such that a container with a volume is formed, a fluid residing in said volume, and a lens shaping part that is in contact with the membrane for defining a curvature adjustable area of the membrane, which area faces said optical element, and a circumferential lens barrel (50) that surrounds an opening in which at least one rigid lens is arranged that is held by the lens barrel, and an actuator means that is designed to move the lens shaping part in an axial direction with respect to the optical element (or the lens barrel) so as to adjust the pressure of the fluid residing inside the volume and therewith a curvature of said area, wherein said axial direction is oriented perpendicular to a plane along which the at least one rigid lens of the lens barrel (or an aperture of the lens barrel) extends, and wherein the optical element is rigidly to the lens barrel (particularly to a circumferential face side of the lens barrel), and wherein the optical device is designed to at least one of: tilt the lens shaping part with respect to said plane, particularly for deflecting light passing through the volume, move the lens shaping part parallel to said plane with respect to the lens barrel, particularly for deflecting light passing through the volume, move the lens barrel together with the container (e.g. parallel to an image sensor of the optical device, particularly so as to shift the image on the image sensor, e.g. to provide OIS.

Particularly, the optical element forms a rigid lens (particularly a converging lens).

Furthermore, according to an embodiment, said rigid lens is a plano-convex lens.

Further, said optical element may comprise a convex surface area facing towards the lens barrel and a flat surface facing towards the membrane.

Particularly, according to an embodiment, when the lens shaping part is moved instead of the optical element, the optical element is arranged between the lens barrel and the lens shaping part (i.e. the lens shaping part is arranged on a side of the container that faces away from the lens barrel. Thus, here, the membrane forms the first surface on which light entering the optical device impinges the optical element then forms a succeeding surface on which the light impinges after passing the liquid inside the container of the optical device.

Further, particularly, the actuator means may be configured to also tilt the lens shaping part with respect to said plane, particularly for deflecting light passing through the volume. Furthermore, the actuator means (or a further actuator means) may also be configured to move the lens shaping part parallel to said plane with respect to the lens barrel, particularly for deflecting light passing through the volume. Furthermore, the optical device may comprise a further actuator means to move the lens barrel together with the container (e.g. parallel to an image sensor of the optical device, particularly so as to shift the image on the image sensor, e.g. to provide OIS).

Also here, in an embodiment, the optical device comprises an image sensor and forms a camera, which is particularly configured to be arranged in a mobile phone, wherein at least one of the following or a combination of the following holds:

the lens shaping part is configured to be moved in the axial direction for providing autofocus, particularly supermacro autofocus, the lens shaping part is configured to be tilted for providing optical image stabilization and/or super resolution imaging;

the lens shaping part is configured to be moved parallel to said plane with respect to the lens barrel (in order to deform the volume so that light gets deflected in a defined manner) for providing optical image stabilization;

lens barrel is configured to be moved parallel to said image sensor together with the container for providing optical image stabilization.

Furthermore, in all aspects and embodiments of the present invention, it is also possible that said optical element also forms a transparent and elastically expandable membrane, so that said container comprises a membrane on both sides.

Further, yet another aspect of the present invention relates to a method for calibrating an optical image stabilization function of the optical device, particularly as described herein, wherein the optical device comprises an image sensor and forms a camera, and wherein the method comprises the steps:

measuring a movement of the optical device during an image preview modus of the optical device (e.g. when the camera displays an image that is to be recorded or may be recorded by the camera), which movement leads to a shift of an image projected onto the image sensor by the optical device, applying a signal to an actuator means of the optical device, which signal prompts the actuator means to at least partially compensate said shift of said image on the image sensor for providing optical image stabilization, automatically determining the sharpness of the image (associated to said signal) generated by the image sensor, increasing or decreasing an amplitude of the signal applied to said actuator means by a proportionality factor, determining the one signal among said signals that results in an image having the best sharpness;

storing the proportionality factor as calibration data in the optical device (e.g. in a semiconductor memory of the optical device)

Furthermore, yet another aspect of the present invention relates to a method for calibrating an autofocus function of an optical device, particularly as described herein, wherein the optical device is formed as a camera and comprises an image sensor for generating images, and wherein the method comprises the steps of:

measuring a distance between the optical device and an object using a distance sensor of the optical device, sweeping through different focal lengths of the optical device by applying a corresponding electrical current signal to an actuator means of the optical device, analyzing the image sharpness of an image generated at each focal length by means of the image sensor of the camera, storing the electrical current signal at which a generated image had the highest sharpness together with the measured distance between the optical device and the object (particularly said current signal and measured distance are stored in a semiconductor memory of the optical device).

Particularly, the optical device according to the invention can be applied in the following applications: Lighting fixtures, light shows, printers, medical equipment, fiber coupling, head worn glasses, laser processing, biometric, metrology, electronic magnifiers, robot cam, fiber coupling, motion tracking, intra-ocular lenses, mobile phones, head mounted cameras, military, digital still cameras, web cams, microscopes, telescopes, endoscopes, binoculars, research, industrial applications, surveillance camera, automotive, projectors, ophthalmic lenses, vision systems, range finders, bar code readers, virtual reality displays, augmented reality displays, automotive cameras, digital watches, tablets, TV cameras.

The optical device of the present invention can be used to read a fingerprint when focusing very close or to measure three dimensional objects. Furthermore, the optical device according to the invention can be used for iris detection. Furthermore, the optical device can be combined with a ring lighting for example made of nanoactive fibers such as provided by L.E.S.S. Particularly, the ring lighting can comprise a multitude of light sources (e.g. LEDs) arranged in a circle (ring) with the optical device (e.g camera) in the center, particularly with the focus adjustable lens/container in the center, to enable a uniform illumination of the imaged area. This is in contrast to only using the current flashlight LED of a smart phone that provides a very non-uniform illumination for very close objects as it is located to only one side of the optical device/camera.

FIGS. 1 to 12 show an optical device 1 according to the invention having an optical element 20, wherein in FIGS. 1 to 6 the optical element 20 is transparent and the optical device can be a camera (e.g. of a mobile phone), which may comprise autofocus, image stabilization and super-resolution by using one movable component comprising the optical element 20, while in FIGS. 7 to 12 the optical element 20 is a mirror and the optical device 1 is a e.g. an optical scanning device 1, that may comprise autofocus as well as the functionality of directing a light beam at the same time for scanning purposes, again by using one movable component comprising the optical element 20.

As shown in FIGS. 1 to 12, the optical device 1 comprises a transparent and elastically expandable membrane 10, an optical element 20 facing the membrane (10), a flat wall member 300, wherein the optical element 20 is connected to first (upper) side 300*a* of the wall member 300, and wherein the membrane 10 is connected to a (lower) second side 300*b* of the wall member 300, such that a container 2 enclosing a volume V is formed, which is filled by a fluid F (e.g. liquid, see also above). The device 1 further comprises a lens shaping part 11 that is attached to the membrane 10 so that a curvature adjustable area 10*c* of the membrane 10 is provided, which area 10*c* faces said optical element 20, and an actuator means 40 that is designed to move the optical element 20 in an axial direction A with respect to the lens shaping part 11, so as to adjust the pressure of the fluid F residing inside the volume V and therewith a curvature of said area 10*c*, wherein said axial direction A is oriented perpendicular to a plane along which the lens shaping part 11 extends, which preferably comprises a circular configuration, and wherein said actuator means 40 is designed to tilt the optical element 20 with respect to said plane, particularly so as to form the volume V into a prism or wedge shape for deflecting light passing through the volume V. According to the invention, the lens shaping part 11 is connected to a circumferential lens barrel 50 which is not shown in FIGS. 1 to 12 for simplicity, but is shown in detail in FIGS. 24 and 25 for instance. According thereto, the lens barrel 50 surrounds an e.g. elongated opening 50*c* in which at least one rigid lens 51 or a plurality of stacked rigid lenses 51 is arranged that is/are held by the lens barrel 50.

The optical element 20, said volume V with the fluid F residing therein, the wall member 300 and the membrane 10 form a lens body of a focus tunable lens which is also denoted as focus adjustable lens herein. For adjusting the curvature, particularly the focus of this lens, the optical device 1 utilizes the lens shaping part 11 that is attached, particularly by means of plasma bonding, to an outside (also denoted as front surface) 10a of the membrane 10, which outside 10a faces away from said volume V. The lens shaping part 11 thereby delimits said optically active and elastically expandable (e.g. circular) area 10c of the membrane 10, which area 10c extends up to an (e.g. circumferential) inner edge of the lens shaping part 11. Preferably, the lens shaping part 11 comprises an annular (e.g. circular) structure for generating a spherical tunable lens, but may also have any other suitable geometry.

Figure 2:
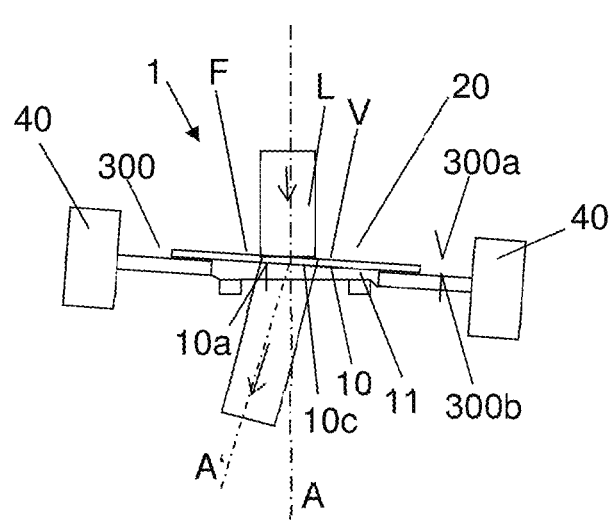
Figure 3:
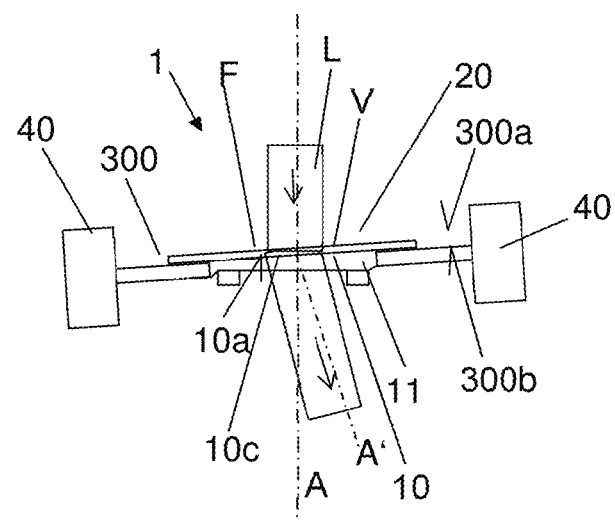

As schematically shown in FIGS. 1 to 3, the optical device 1 comprises an actuator means 40 that is designed to tilt the optical element 20 with respect to a plane spanned by the lens shaping part 11 (i.e. the lens shaping member 11 defines said fictitious plane or extends in or along said fictitious plane), which allows one to give the volume V under the optical element 20 the form of a prism or wedge, such that light L that passes the volume V is deflected as indicated in FIGS. 2 and 3. This can be employed for image stabilization as well as scanning.

When the optical device 1 is used in or as a camera, an image point on the surface of an image sensor 52 (cf. FIGS. 16, 19, 22, and 23 for instance) may be shifted due to an unintended rapid movement of the optical device 1. This can be counteracted by shifting the crossing point between the incident light beam L travelling in direction A' associated to an object point and the surface of the image sensor 52 in the opposite direction. For this, the optical device 1 may comprise a movement sensor means 64 for sensing said unintended rapid movement of the optical device 1 to be counteracted, wherein the optical device 1 may further comprise a control unit 65 connected to the movement sensor means 64, which control unit 65 is designed to control the actuator means 40 depending on the movement to be counteracted sensed by the movement sensor means 64 such that the optical element 20 is tilted by the actuator means 40 with respect to said plane spanned by the lens shaping member 11 (i.e. along which plane the lens shaping member extends) for changing the course of the incident light beam L in direction A' associated to an object point in a way that counteracts said sensed movement, i.e., the shift of an image point on the surface of an image sensor 52 (or image plane) due to a rapid and unintended movement of the optical device 1 is compensated by a shift of the crossing point of said incident light beam A' associated to an object point and the image sensor (image plane) in the opposite direction.

Figure 4:
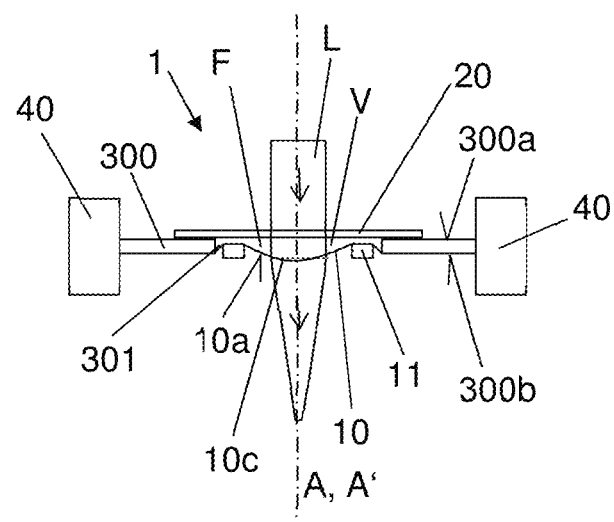
FIGS. 4-6 show schematical cross sectional views of the optical device shown in FIGS. 1-3 wherein in addition the curvature of the membrane is adjusted by means of a lens shaping part acting on the membrane for focusing the light beam, which lens shaping part is connected to a lens barrel.
Figure 5:
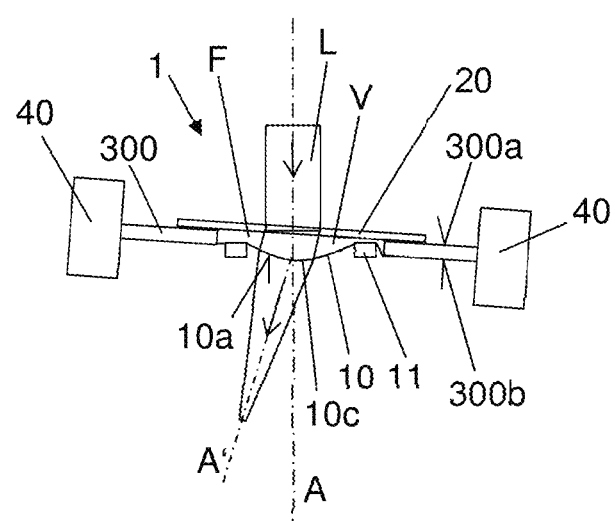
Figure 6:
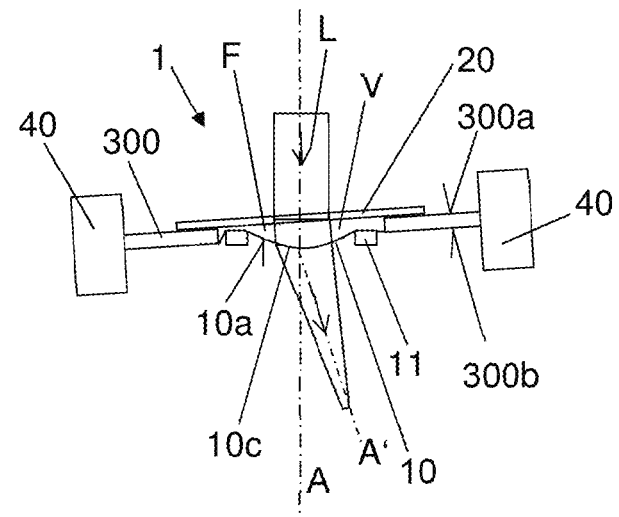

As shown in FIGS. 4 to 6 the optical device 1 according to the invention is further capable of deforming said area 10c of the membrane 10 at the same time by pressing with the lens shaping part 11 against the membrane 10 (or by pulling the membrane 10). This can be achieved by means of the same actuator means 40 that is also designed to move the optical element 20 in an axial direction A (being oriented perpendicular to the plane spanned/defined by the lens shaping part 11) with respect to the lens shaping part 11 so as to adjust the pressure of the fluid F residing inside the volume V of the container 2 and therewith a curvature of said area 10c of the membrane 10 (see also above). This particularly allows one to change the curvature between two different convex curvatures, or two different concave curvatures, or even between a convex and a concave curvature. Thus, the focus of the focus tunable lens can be altered very effectively. Preferably, the actuator means 40 is designed to act on the wall member 300 for moving the optical element 20 axially as well as for tilting the optical element 20 with respect to the fixed lens shaping member 11 which will be described in detail below.

Figure 7:
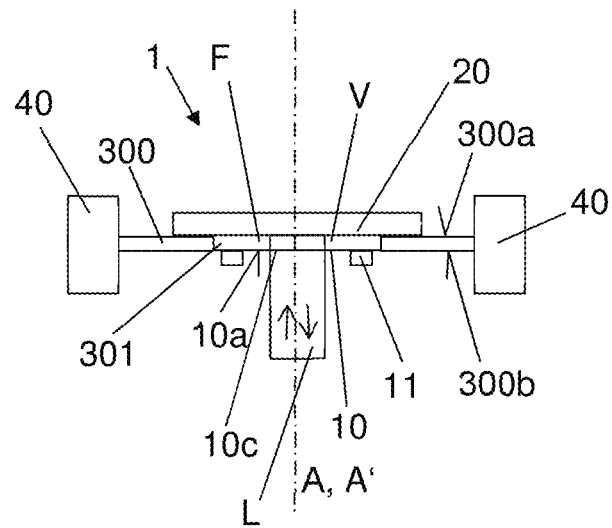
FIGS. 7-9 show schematical cross sectional views of a further optical device according to the invention having an optical element in the form of a mirror that is oriented parallel to the membrane (FIG. 1) or tilted with respect to the membrane (FIGS. 2 and 3) for deflecting a light beam passing through the volume of the tunable lens.
Figure 8:
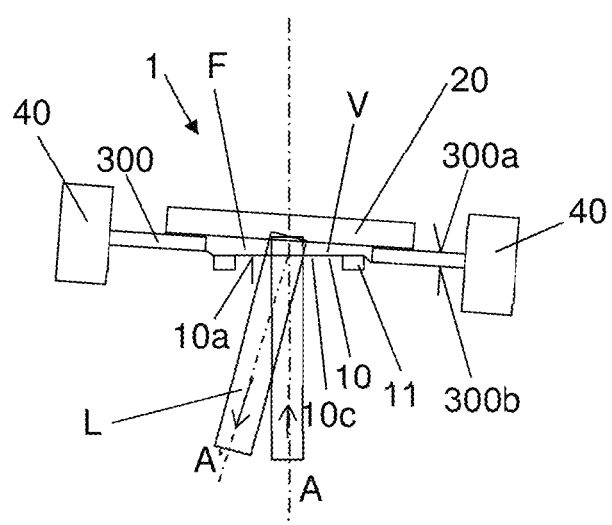
Figure 9:
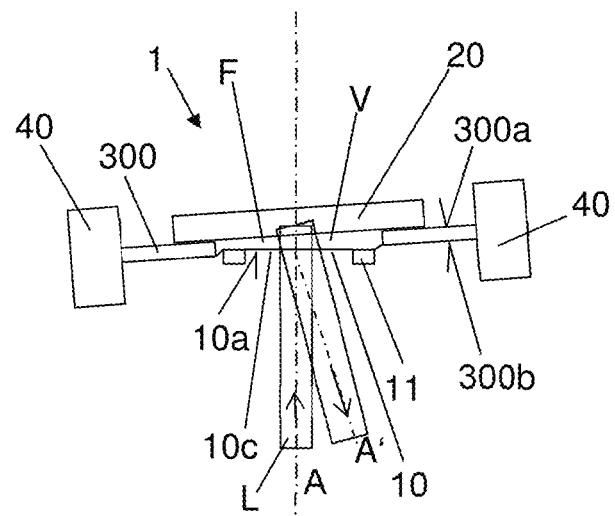

FIGS. 7 to 9 also show tilting movements of an optical device 1 according to the invention, wherein, in contrast to FIGS. 1 to 6, the optical device 1 now comprises an optical element 20 in form of a mirror that has a reflecting surface that faces the volume V of the container the focus tunable lens. Here, tilting of the optical element 20 allows e.g. for scanning a 2D image plane.

Figure 10:
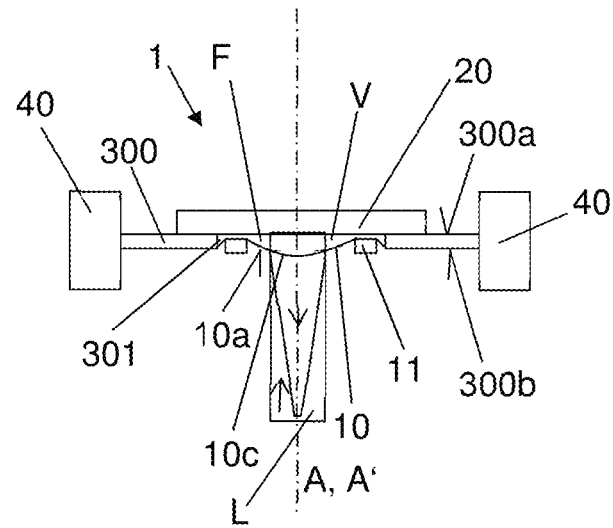
FIGS. 10-12 show schematical cross sectional views of the optical device shown in FIGS. 7-9, wherein in addition the curvature of the membrane is adjusted by means of a lens shaping part acting on the membrane for focusing the light beam, which lens shaping part is connected to a lens barrel.
Figure 11:
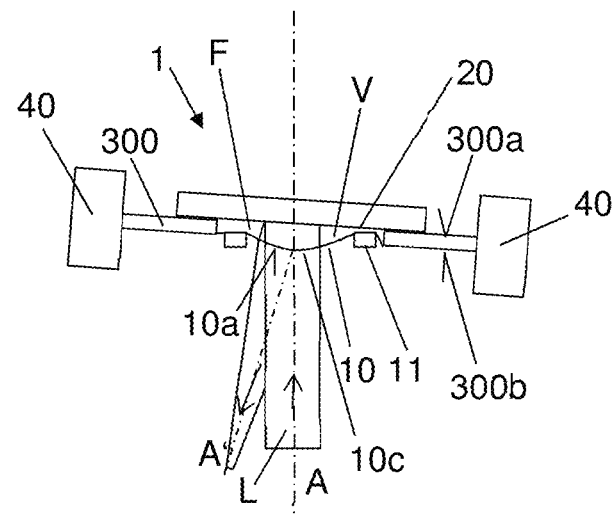
Figure 12:
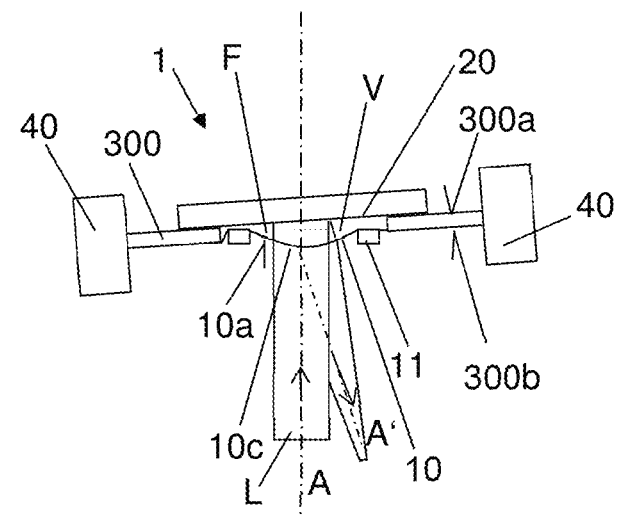

As shown in FIGS. 10 to 12 this can also be combined with deforming said area 10c of the membrane 10 for adjusting the focus of the focus tunable lens as discussed before with respect to FIGS. 4 to 6 such that also 3D scanning is possible.

Figure 13:
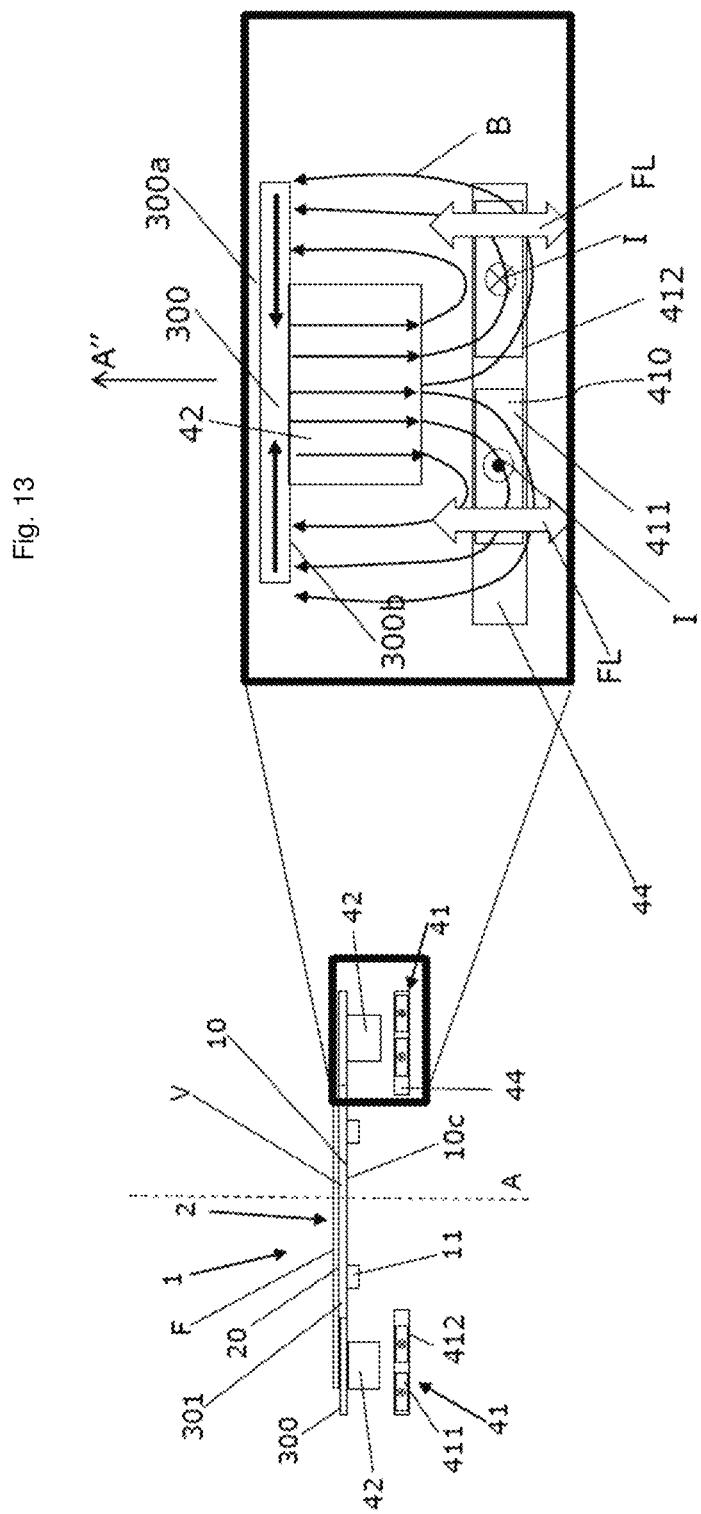
FIG. 13 shows the principle of an electromagnetic actuator means that may be used to adjust the focal length of the focus adjustable lens and/or tilt the optical element so as to form the volume of the container into a prism for deflecting a light beam.

FIG. 13 shows a schematical cross sectional view of a possible electromagnetic actuation of the optical device 1 according to the invention. For this, the optical device 1 comprises an actuator means 40 that comprises e.g. three or four magnets 42 and a corresponding number of coils 41 supported by a coil support or frame 44, wherein each magnet 42 is associated to exactly one coil 41 and faces the latter in the axial direction A. Here, as shown in the detail on the right hand side of FIG. 13, the respective magnet 42 is arranged in the axial direction above the associated coil 41 which comprises below the magnet a section 411 in which an electrical current I flows in a first direction and perpendicular to the magnetic field B of the magnet 42 while in a neighboring second section 412 the current flows in the opposite direction as well as perpendicular to the magnetic field B of the magnet 42. The magnet 42 is centered with respect to the two coil sections 411 and 412 so that the magnet field B extends parallel to the wall member 300 (or perpendicular to the axial direction A) so that a Lorentz Force FL generated when said currents are applied is oriented along the axial direction A and causes the magnet 42 and the coil 41 to attract each other or to repel each other depending on the direction of the current in the coil 41.

Due to the fact that three or four coils 41 and magnets 42 are used, the curvature of the area 10c of the membrane can be automatically adjusted by operating all coils so that an axial movement of the optical element 20 is achieved (autofocus), while a tilt of the optical element 20 can be achieved by actuating a single or several coils 41 leading to a tilt of the wall member 300 and therefore of the optical element 20 which forms the volume V into a prism and allows to deflect light passing the container 2.

Figure 14:
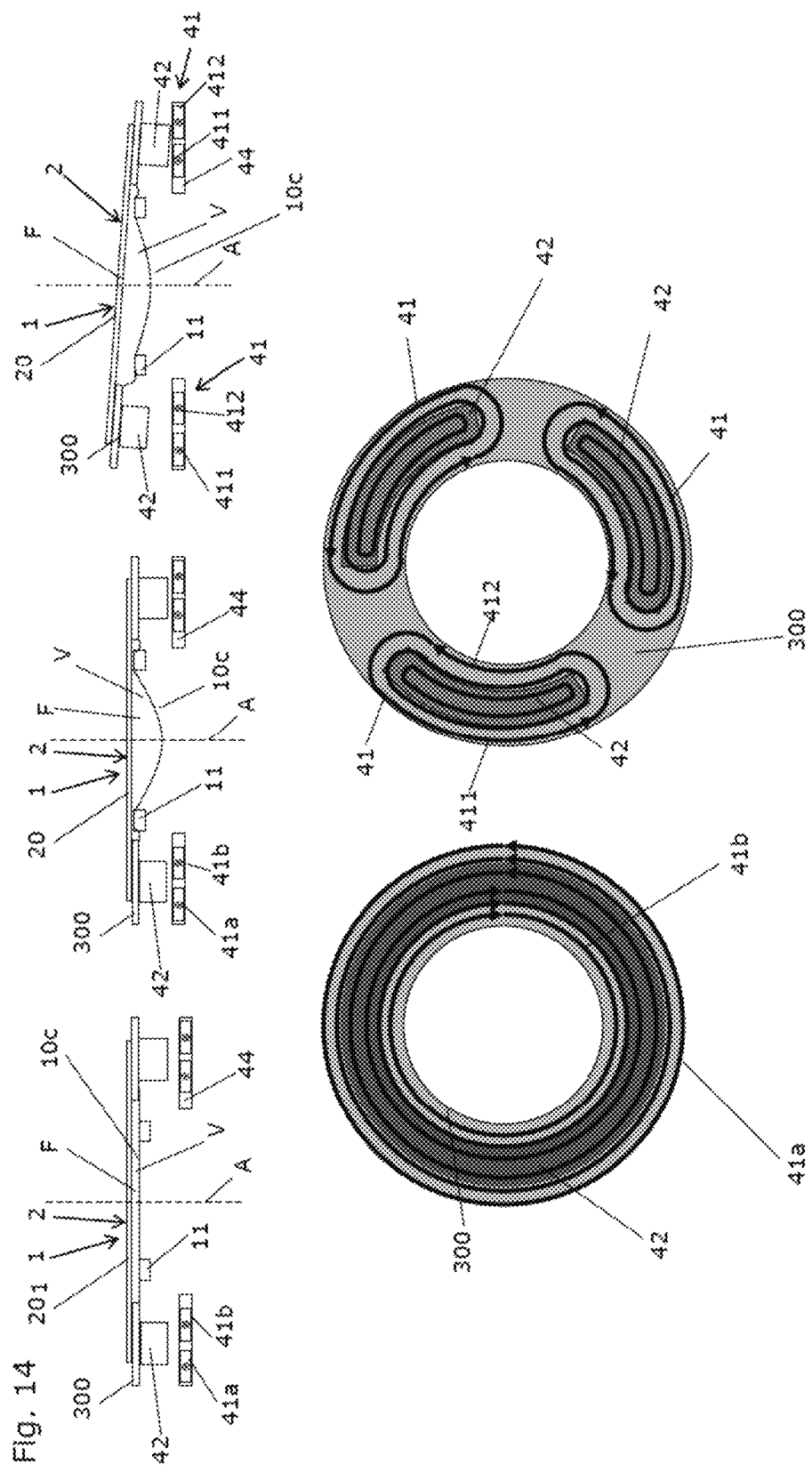
FIG. 14 shows electromagnetic actuation using two coils and a magnet as well as using three coils and a corresponding number of associated magnets.

Further, FIG. 14 illustrates that an autofocus function, i.e., an axial movement of the optical element 20/wall member 300 in the axial direction A can be generated by using an inner and an outer coil 41a, 41b in which the current I flows in opposite directions as indicated in the lower left part of FIG. 14, so that the annular magnet 42 attached to the wall member 300 can be moved towards the fixed coils 41a, 41b that are arranged with respect to the annular magnet 42 as shown in the cross section detail on the right hand side of FIG. 13.

The lower right hand side shows the configuration already addressed above regarding FIG. 13 where three magnets 42 are attached to the wall member 300, which three magnets 42 can interact with associated coils 41 that face the respective magnet 42 in the axial direction A. The magnets are arranged with respect to each other at a distance of 120° so that the optical element can be moved in the axial direction A but can also be tilted by generating a suitable Lorentz force as indicated in the upper right hand side of FIG. 14. Instead of three magnets 42 and associated coils 41 also four magnets and coils can be used as will be described further below.

Further, instead of an electromagnet actuation, the optical element 20 may also be moved axially or may be tilted by means of an electrostatic actuator means or a piezoelectric actuator means.

Figure 15:
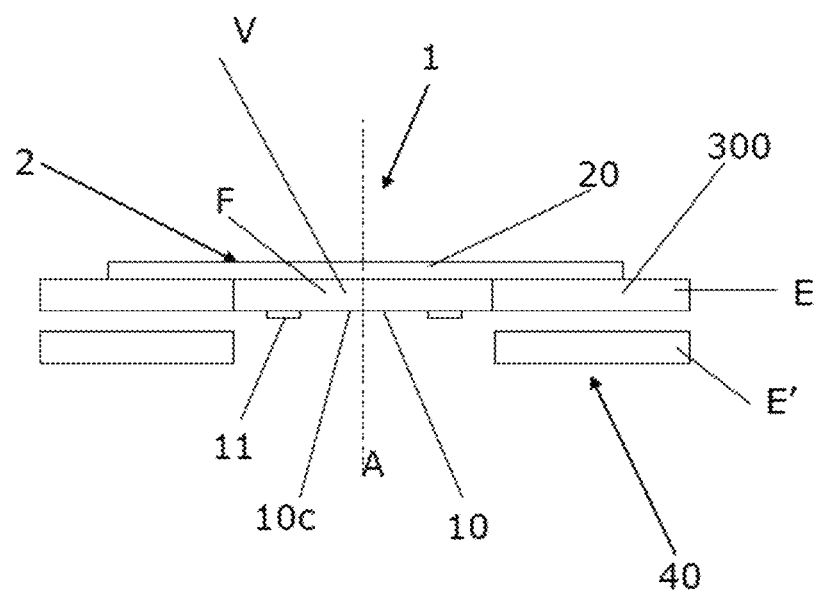
FIG. 15 shows an alternative electrostatic actuator means.

Alternatively, the actuator means 40 may also be formed as an electrostatic actuator means as shown in FIG. 15 that comprises a plurality of top electrodes (particularly three or four electrodes) E arranged on the wall member 300, wherein each top electrode E may be associated to a bottom electrode E' that faces the corresponding top electrode E in the axial direction A. By applying a voltage between the respective top and bottom electrode E, E', the optical element 20 can be axially moved and/or tilted as well. Here, the top electrodes E may be arranged on the wall member 300 such that they are moveable with the wall member 300/ optical element 20 while the bottom electrodes E' may be arranged on the housing 60 (not shown in FIG. 15) such that they comprise fixed positions with respect to the housing of the device 1. To reduce complexity it is also possible to unify the top or bottom electrodes to one electrode and only having the opposite electrode split in multiple sections.

Figure 16:
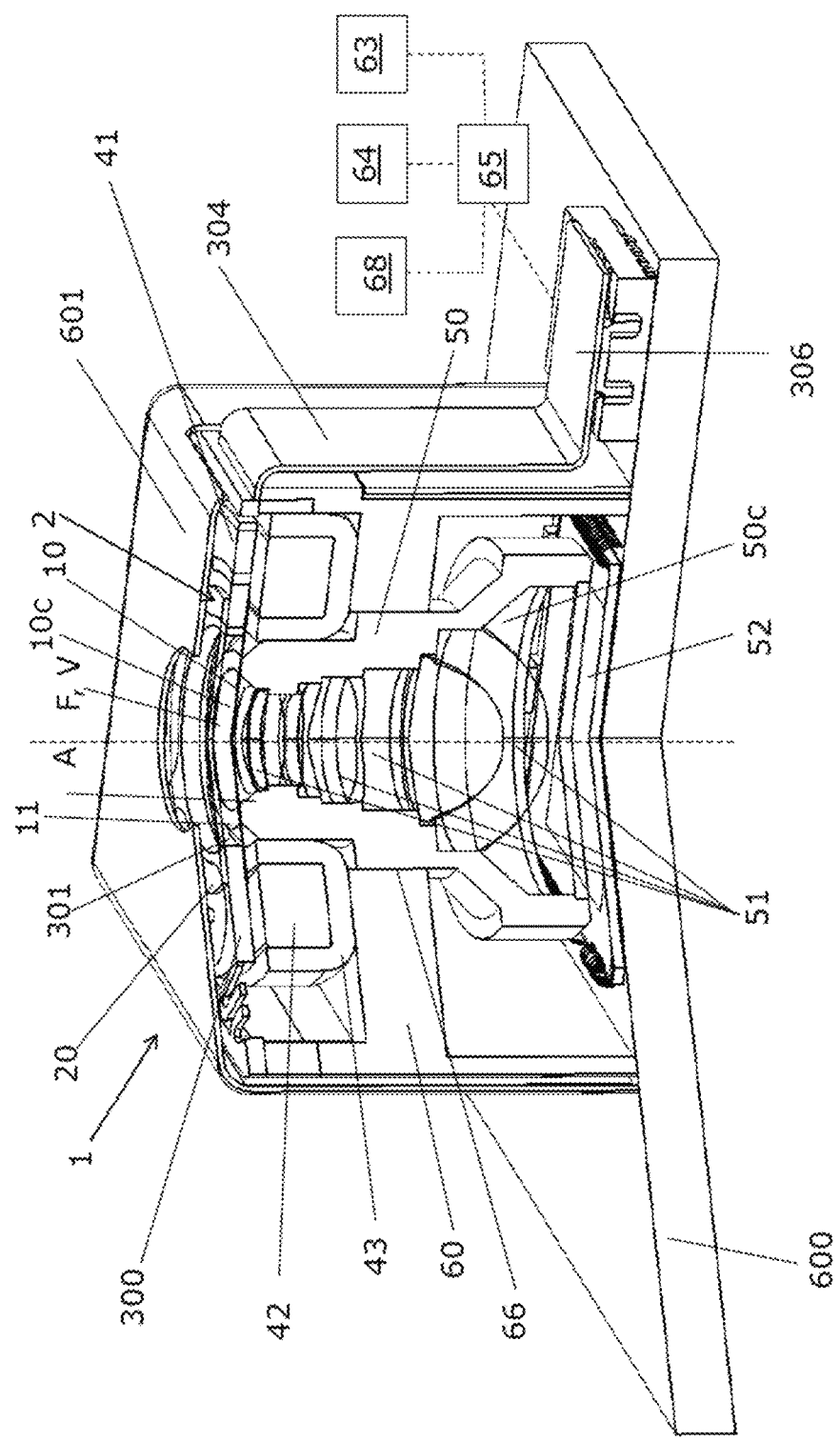
FIG. 16 shows a perspective cross sectional view of an embodiment of an optical device according to the invention using an actuator means with a circular magnet arranged on a housing of the device and four coils integrated into a wall member of the container of the focus adjustable lens.
Figure 17:
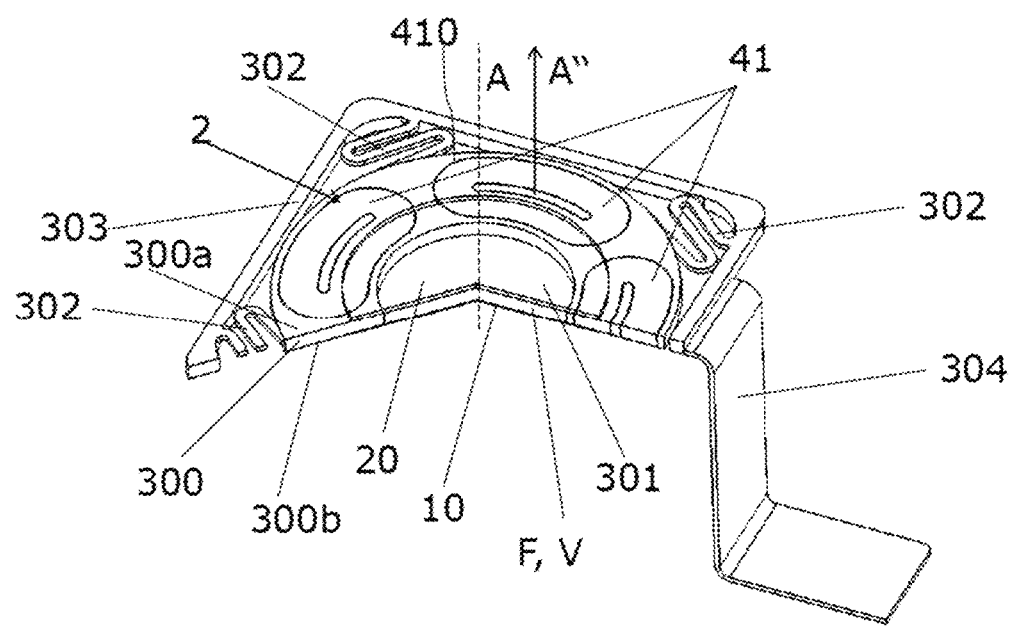
FIG. 17 shows a perspective view detail of the embodiment shown in FIG. 16.
Figure 18:
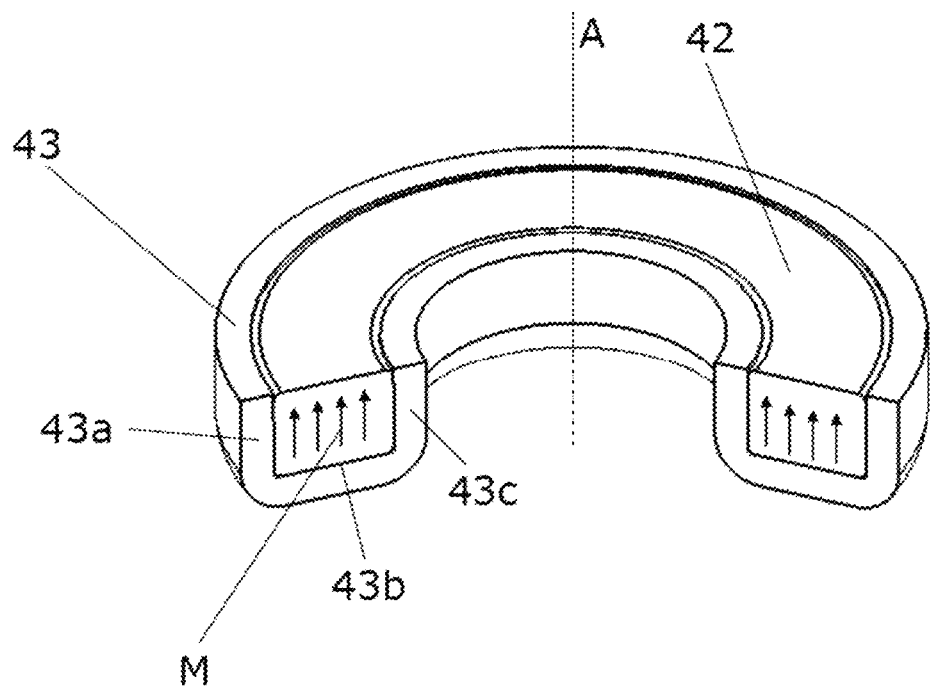
FIG. 18 shows a perspective cross sectional view of a further detail of the embodiment shown in FIG. 16.

FIG. 16 shows in conjunction with FIGS. 17 and 18 an embodiment of the optical device 1 according to the invention in form of a camera, which comprises a transparent and elastically expandable membrane 10 extending perpendicular to an axial direction A, a transparent optical element 20 (e.g. a circular glass plate) facing the membrane 10 in the axial direction A, a flat annular wall member 300 surrounding a central recess 301, wherein the optical element 20 is connected to a first (top) side 300a of the wall member 300 and the membrane 10 is connected to a second (lower) side 300b of the wall member 300 such that said recess 301 is closed and a container 2 with a volume V is formed, in which a fluid F is arranged which fills said volume V. The device 1 further comprises a lens shaping part 11 that is connected to a lens barrel 50 as shown in detail in FIGS. 24 and 25.

Figure 24:
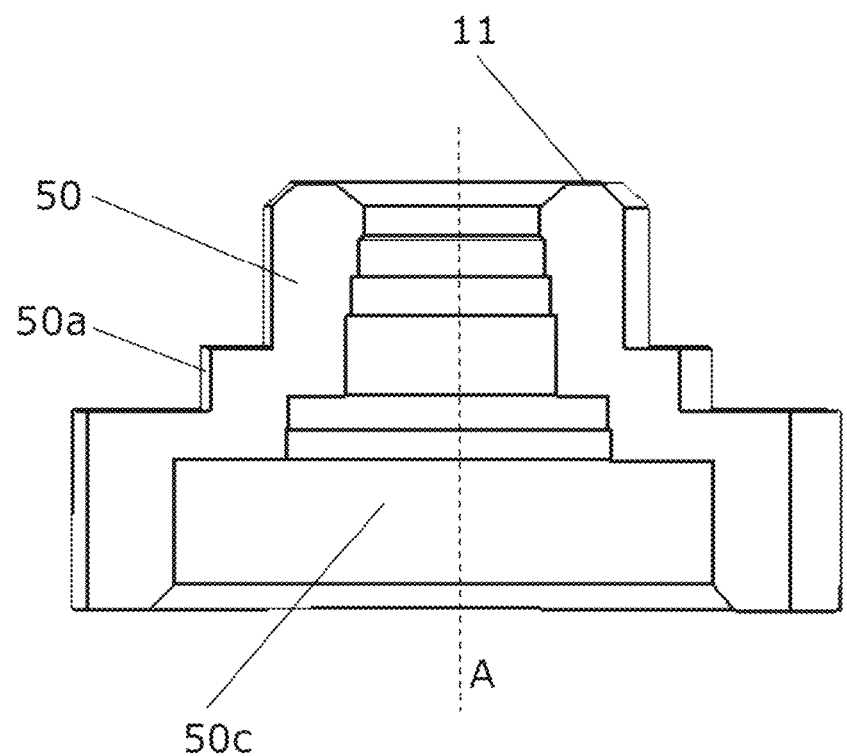
FIG. 24 shows a lens barrel of an optical device according to the invention, wherein the lens shaping part is integrally formed with the lens barrel in one piece.
Figure 25:
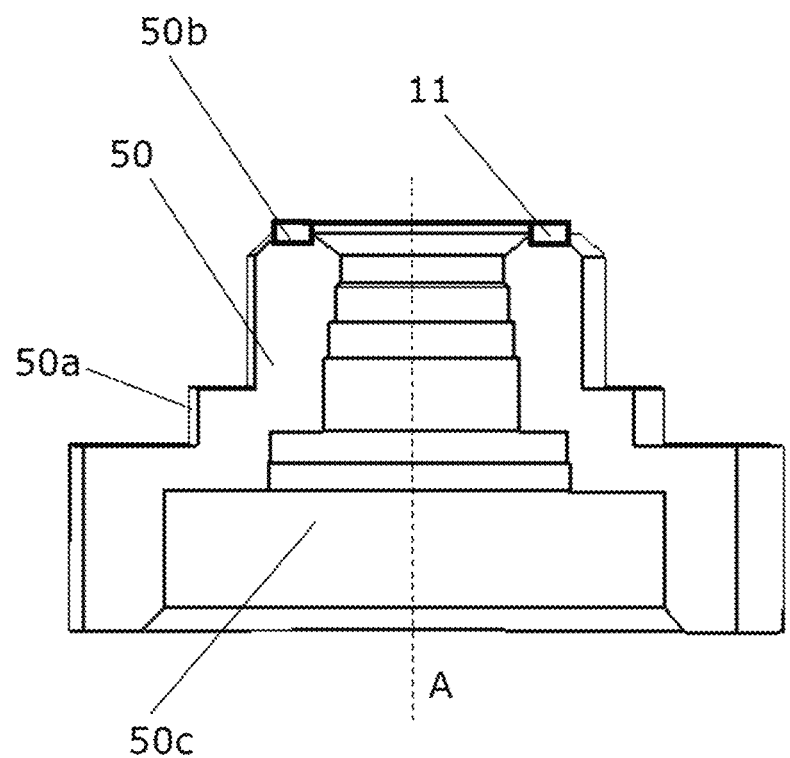
FIG. 25 shows an alternative lens shaping part/lens barrel, wherein here the lens shaping part is a separate element connected to a face side of a body of the lens barrel.

According thereto, the lens barrel 50 comprises a tubular shape and surrounds an opening 50c of the barrel 50 in which at least one rigid lens 51 or a stack of rigid lenses 51 is arranged. The barrel 50 further comprises an outer lateral side (also denoted lateral outside) 50a which may comprise circumferential steps so that the outer diameter of the barrel 50 decreases towards the lens shaping part 11 which according to FIG. 24 is formed by an annular face side 11 of the lens barrel 50. Alternatively, the lens shaping part 11 may be formed by an annular material layer 11 that is attached to a face side 50b of the lens barrel 50 that faces the membrane 10.

As shown in FIG. 16, the lens shaping part 11 is bonded, particularly by plasma bonding, to the membrane 10 such that an area 10c of the membrane 10 is formed that comprises a curvature that can be adjusted by moving the optical element 20 in the axial direction by means of an actuator means 40 as described e.g. above with respect to FIGS. 4 to 6. Further, as described above with respect to FIGS. 1 to 3, the optical element 20 may also be tilted in order to deflect a light beam for the purpose of super-resolution or image stabilization which will be described below.

In order to move the optical element 20 in the axial direction A and/or to tilt it with respect to the plane along which the lens shaping part 11 extends, the optical device 1 according to FIGS. 16 to 18 comprises an actuator means 40 which comprises a circumferential magnet 42 (cf. FIG. 18) being embedded into a circumferential magnetic flux return structure 43 that comprise a U-shaped cross section, i.e., the return structure 43 comprises a bottom portion 43b that rests on a housing 60 of the device 1 and two lateral portions 43a, 43c protruding along the axial direction A from the bottom portion 43b, which lateral portions 43a, 43c cover an inner and an outer side of the magnet 42. The magnet 42 further comprises a face side arranged between said lateral portions 43a, 43c and flush with said lateral portions 43a, 43c. Further, according to FIG. 16, the actuator means 40 comprises four coils 41 which are integrated into said wall member 300 as shown in FIG. 17, wherein said face side of the magnet 42 faces said four coils 41 in the axial direction A.

Each of the coils 41 comprises a conductor that is wound around a coil axis A" running perpendicular to said optical element 20, while the magnet 42 is magnetized in the axial direction A is indicated by the arrows M. This guarantees that the Lorentz forces FL that are generated by means of the coils 41 and the magnet 42 essentially extend along the axial direction and therefore used in an efficient manner to axially move optical element 20 or to tilt it. For this, the magnet 42 is further configured such in relation to the coils 41 that the magnetic field B above two opposing sections of each coil 41 (cf. sections 411, 412 in FIG. 13) is predominantly oriented perpendicular to the axial direction A and perpendicular to the current I in said opposing sections of the coil 41 (as demonstrated in FIG. 13).

Further, according to FIG. 17, the wall member 300 is integrally connected via four spring members 302 to a frame member 303 that rests on the housing 60 so that the wall member 300 is supported on the housing 60 via the spring members 302 and the rectangular frame member 303. The housing 60 itself rests on a substrate 600 (e.g. a printed circuit board). The spring members 302 may have a meandering shape and may connect the wall member 300 to four corner regions of the frame member 303. Thus the whole container 2 is movably coupled to the housing, wherein when the optical element 20 is moved out of a resting position, a restoring force acts on the optical element 20 due to the spring members 302 and the membrane 10.

Now, in order to be able to tilt or axially move the optical element 20, a current is applied to all coils 41 at the same time so that the optical element 20 is moved away from the lens shaping part 11 or moved towards the lens shaping part 11 in the axial direction A on the direction of the current in the coils 41 as described above. By applying currents to the coils 41 differently, the optical element 20 can further also be tilted so that the volume V is formed into a prism. Thus, a light beam passing the container 2 and the lenses 51 in the lens barrel 50 can be focused on an image sensor 52 that is arranged inside the housing 60 below the lens barrel 50 on the substrate 600 of the device 1, but can also be deflected so that an image projected onto the image sensor 52 can be shifted by small amounts to allow image stabilization and/or super-resolution. In order to be able to supply currents to the coils 41, the latter are connected via a flexible conductor 304 that extends out of the housing 60 and is connected to a connector provided on the substrate 600 outside said housing 60.

Particularly, the wall member 300, the spring members 302, and the frame member 303 may form integral portions of a printed circuit board 300, 302, 303 into which also the coils 41 are integrated, particularly in form of several stacked conductor layers. The flexible conductor 304 then connects this printed circuit board forming the container 2 together with the optical element 20 and the membrane 10 to the connector 306 on the substrate 600. Further, the housing may comprise an outer shield 601 for protecting the device 1 against electromagnetic fields and to protect the surrounding from electromagnetic fields generated by the device 1.

As indicated in FIG. 16, the optical device 1 may comprise a control unit 65, a position sensor means 63 as well as a movement sensor means 64 and a temperature sensor 68. All embodiments of devices 1 described below may also comprise these components and may be controlled as will be described now with respect to the embodiment of FIGS. 16 to 18.

Particularly, the position sensor means 63 is configured to measure a position (or displacement) of the optical element 20 or of a component connected thereto with respect to a reference position. Particularly, the position sensor means 63 can be a strain sensor measuring a deformation of the spring members 302, a capacitive sensor measuring a change in a distance between the magnet 42 and the wall member 300, a magnetoresistive sensor, or an inductive feedback sensor that uses the actuation coils 41 or separate coils embedded in the wall member 300 (e.g. Texas Instruments LDC1614EVM). Further, the position sensor means can also be a Hall sensor, particularly in case the magnet(s) 42 are arranged on the wall member 300 and the coils 41 rest on the housing as described below.

Preferably, the control unit 65 is configured to control the actuator means 40 by controlling the currents applied to the coils 41 such that the measured position of the optical element 20 reaches a desired position at a certain temperature measured by the temperature sensor 68. In this fashion, the focal length of the focus adjustable lens can be automatically adjusted to the desired value (e.g. by axially moving the optical element to adjust the curvature of the area 10c of the membrane 10)

Furthermore, using the movement sensor means 64 e.g. Gyro sensors, an unwanted movement of the whole optical device 1 that shall be counteracted can be detected. Here, the control unit 65 is designed to control the actuator means 40 depending on a movement to be counteracted sensed by the movement sensor means 64 such that the optical element 20 is tilted by the actuator means 40 for changing the direction of an incident light beam L in the direction A' passing through the optical device 1 in a way that counteracts said sensed movement.

Figure 19:
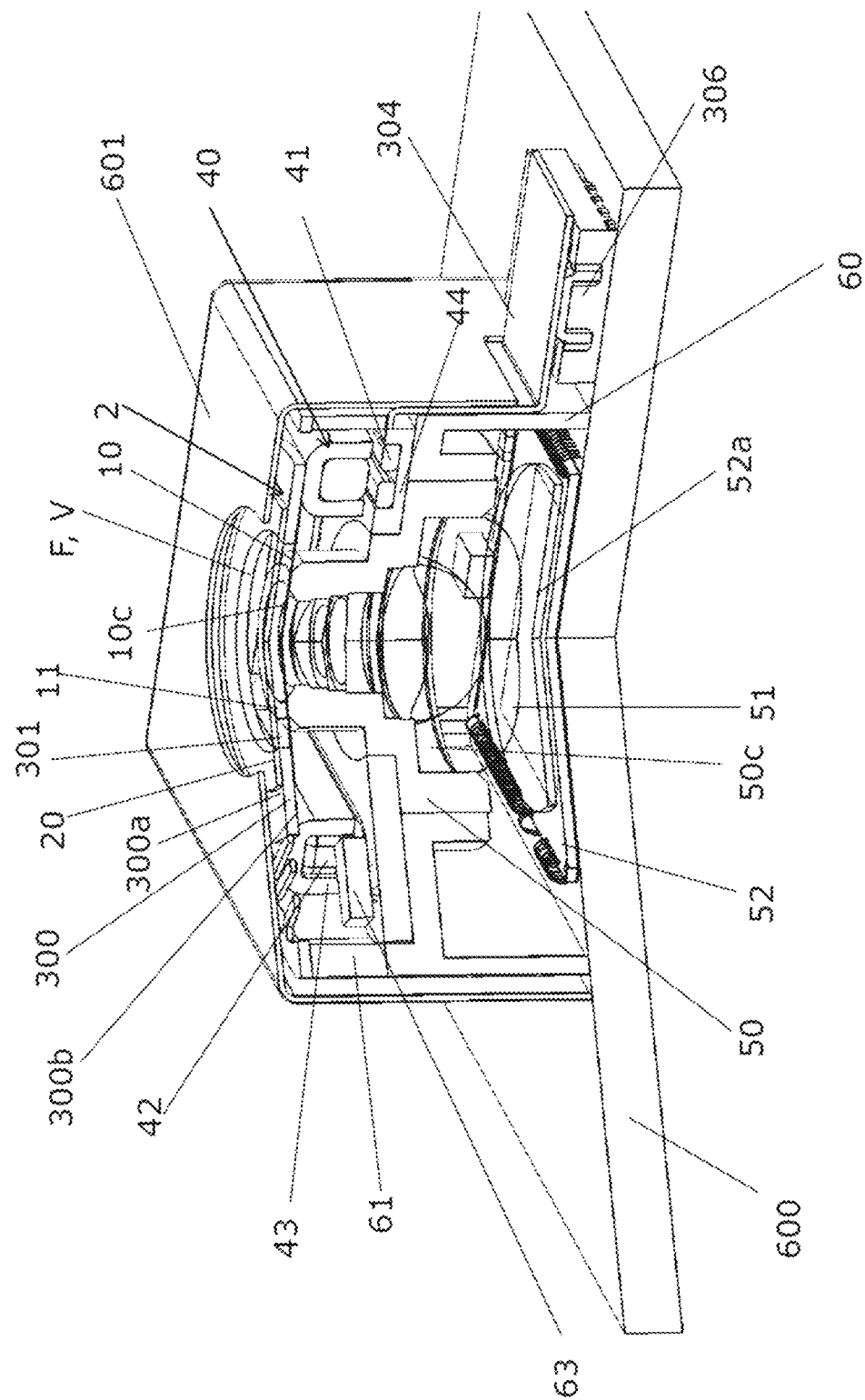
FIG. 19 shows a perspective cross sectional view of a modification of the embodiment shown in FIG. 16 wherein now four coils are arranged on the housing of the device while the associated magnets and their magnetic flux return structures are arranged on the wall member of the container.
Figure 20:
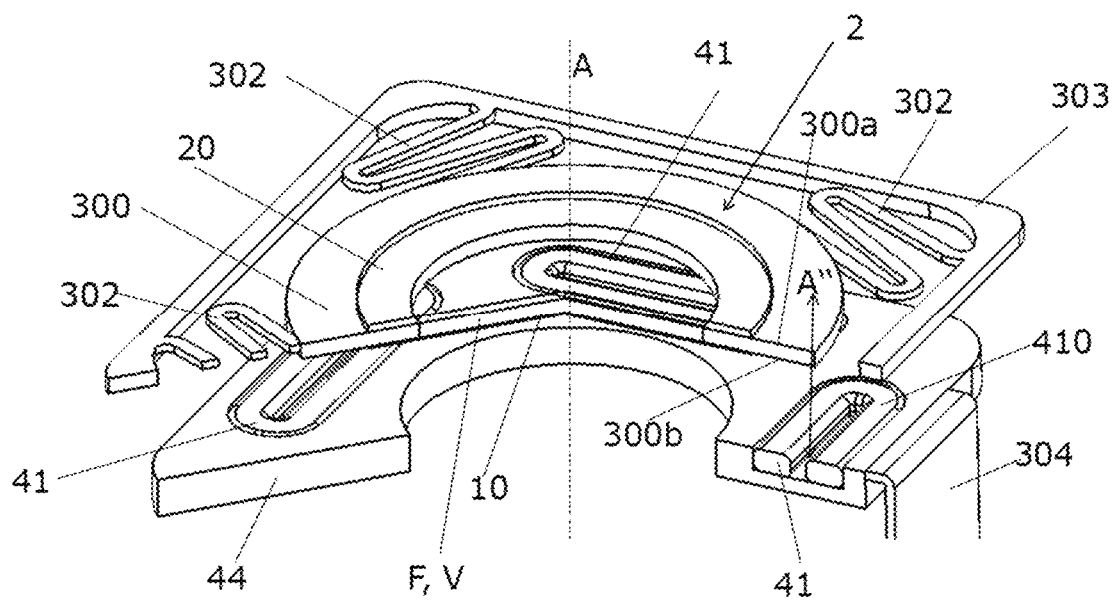
FIG. 20 shows a perspective cross sectional view of a detail of the embodiment shown in FIG. 19.
Figure 21:
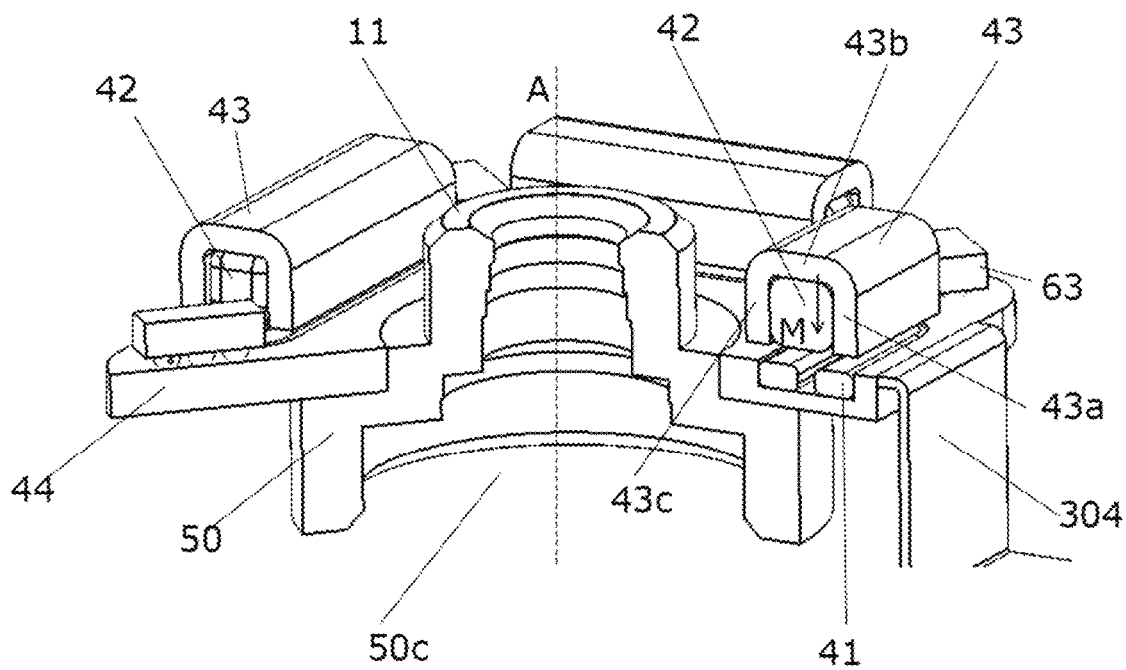
FIG. 21 shows a perspective cross sectional view of a further detail of the embodiment shown in FIG. 19.

FIG. 19 shows in conjunction with FIGS. 20 and 21 a modification of the embodiment of FIG. 16, wherein now the coils 41 are integrated into a circumferential coil frame 44 which rests on the housing 60 such that the four coils 41 each face an associated magnet 42, wherein these four magnets 42 are now arranged on a lower side 300b of the wall member 300 to which also the membrane 10 is attached. Here, in contrast to FIG. 16, the coils 41 now have a fixed position on the housing 60 while the magnets 42 can move with the optical element 20. Here, the magnets 42 are magnetized in a direction M running perpendicular to the optical element 20, while said coil axes A" run parallel to the axial direction A. Again, each magnet 42 is positioned relative to its associated coil 41 such that it faces its associated coil 41 in the axial direction A in the manner shown in FIG. 13 on the right hand side (i.e. the respective magnet 42 is centered with respect to the associated coil 41 that is arranged below the respective magnet in the axial direction A). Further as shown in FIG. 21, each magnet may be embedded into a magnetic flux return structure 43 having a top portion 43b via which the respective magnet 42 may be connected to the wall member 300 as well as two lateral portions 43a, 43c which protrude along the axial direction A from the top portion 43b so that the respective return structure 43 is again arranged with respect to the associated magnet as described before. Further, as before, the wall member 300 can be integrally connected to the frame member 303 via four (e.g. meandering) spring members 302.

Furthermore, the housing 60 may comprise a circumferential spacer element 61 on which the frame member 303 may be supported, wherein the spacer element 61 is configured to expand in the axial direction A with increasing temperature of the optical device 1 for compensating a temperature induced increase of said volume V of the container 2 (due to an increasing volume of the fluid F with temperature). Such a spacer element may also be used in the other embodiments described herein.

Figure 22:
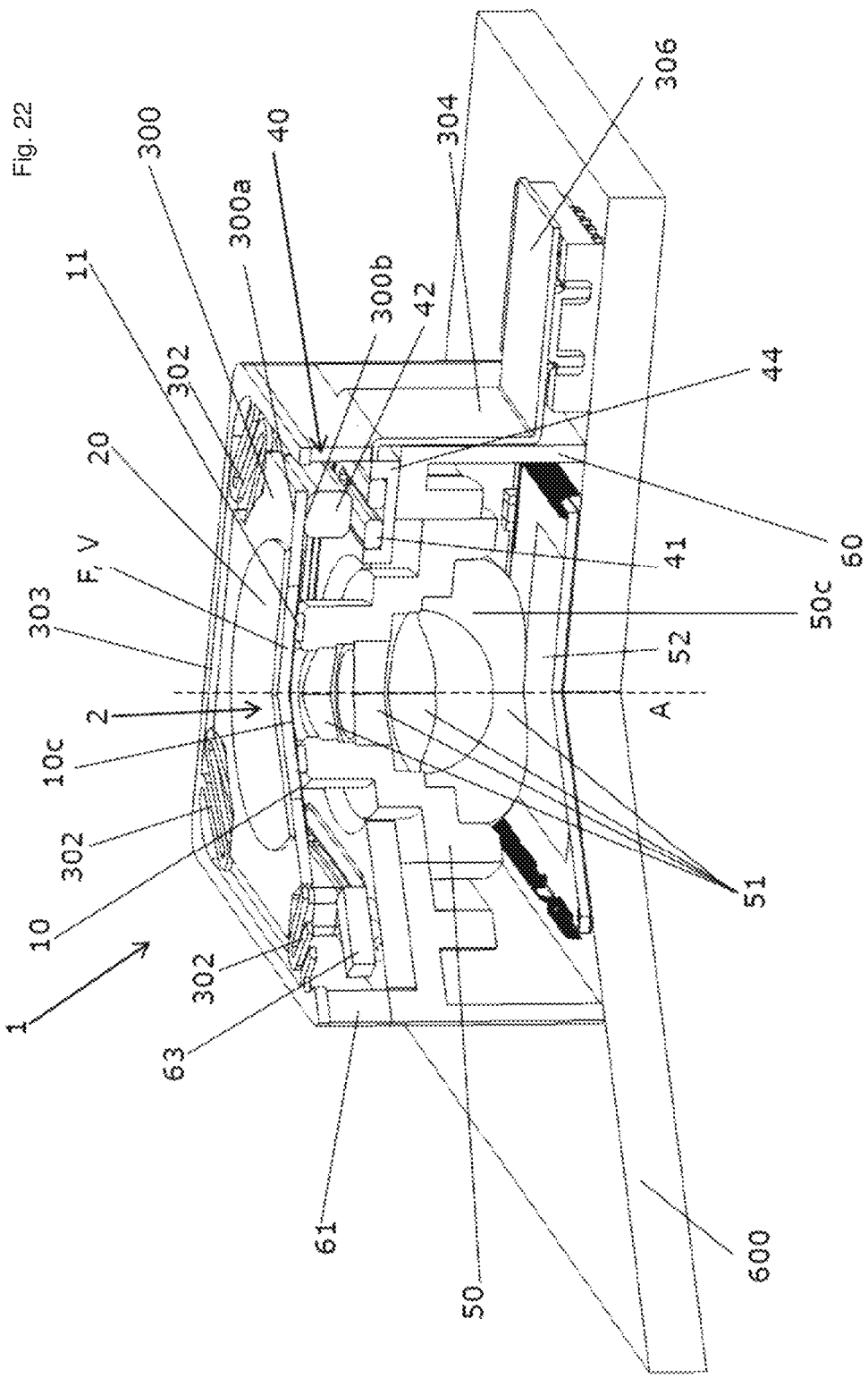
FIG. 22 shows a perspective cross sectional view of a modification of the embodiment shown in FIG. 19 wherein here the magnetic flux return structure of the magnets is formed by the wall member.

Further, according to FIG. 22, the separate return structures 43 may also be omitted. Here, the wall member 300 also forms a return structure and is therefore formed out of a magnetically soft material.

Figure 23:
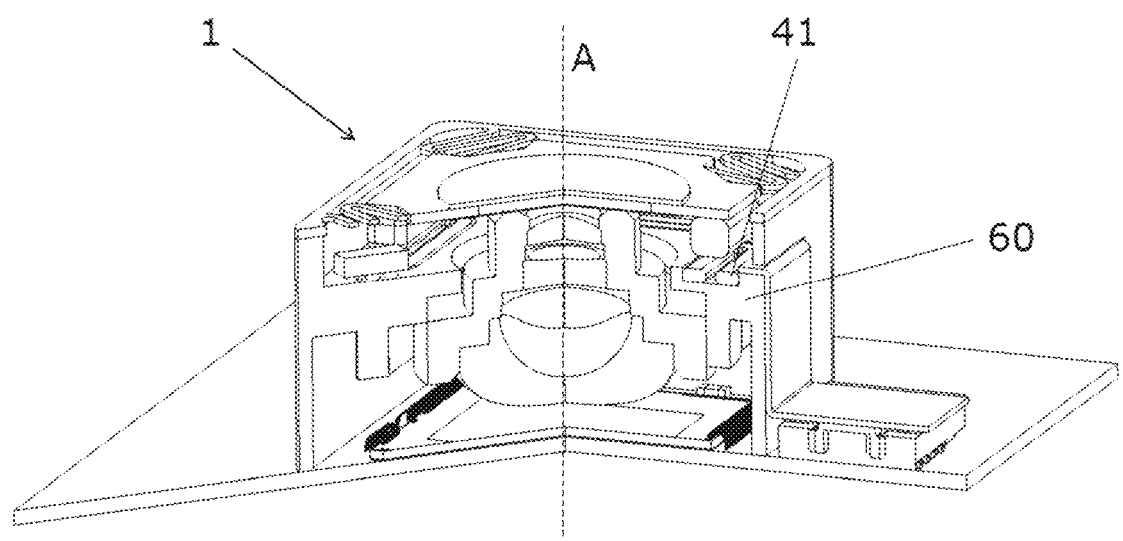
FIG. 23 shows a perspective cross sectional view of a modification of the embodiment shown in FIG. 22.

FIG. 23 shows a further modification, wherein here, the coil frame 44 is omitted and the coils 41 are directly embedded into the housing 60.

Figure 33:
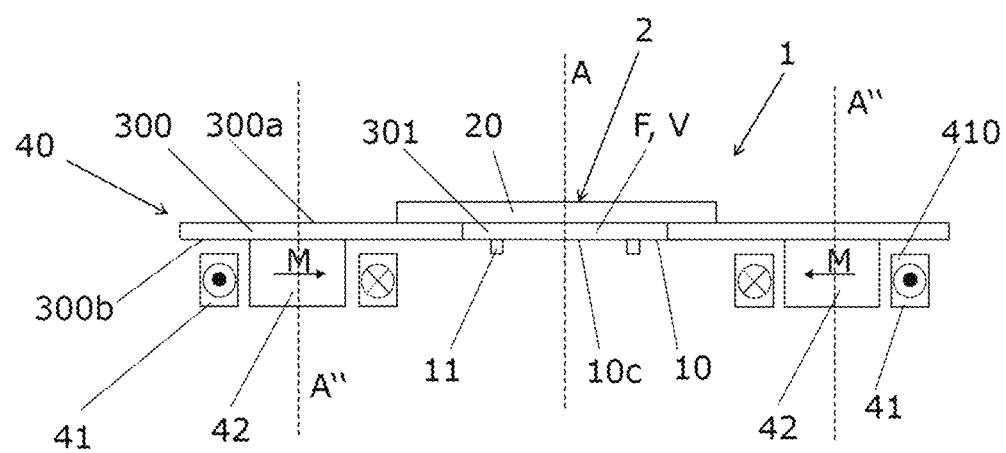
FIG. 33 shows a further embodiment, where the magnets are magnetized in a plane parallel to the optical element, wherein the magnets are surrounded by associated coils.

Further, FIG. 33 shows yet another embodiment of the optical device 1 according to the present invention, wherein here the actuator means 40 comprise a plurality of coils (e.g. three or four coils) 41 wherein each coil 41 preferably surrounds an associated magnet 42 that is connected to the lower side 300b of the wall member 300 to which also the membrane 10 is attached, and is preferably magnetized in a direction M running parallel to the wall member 300, wherein the magnetization M may point towards a central axis of the optical device 1. Further, the respective coil 41 is arranged on the housing 60 (not shown) and its coil axis A" extends parallel to the axial direction A of the optical device. Also in this configuration, Lorentz forces FL as explained earlier can be generated that extend essentially along the axial direction and allow for an efficient moving of the optical element 20 in the axial direction and/or for tilting the optical element 20 in order to form the volume V into a prism as explained herein. Also here, the above described sensor means 63, 64 and 68 as well as the control unit 65 may be used in order to control the movement of the optical element for providing autofocus, optical image stabilization and/or super resolution.

Figure 26:
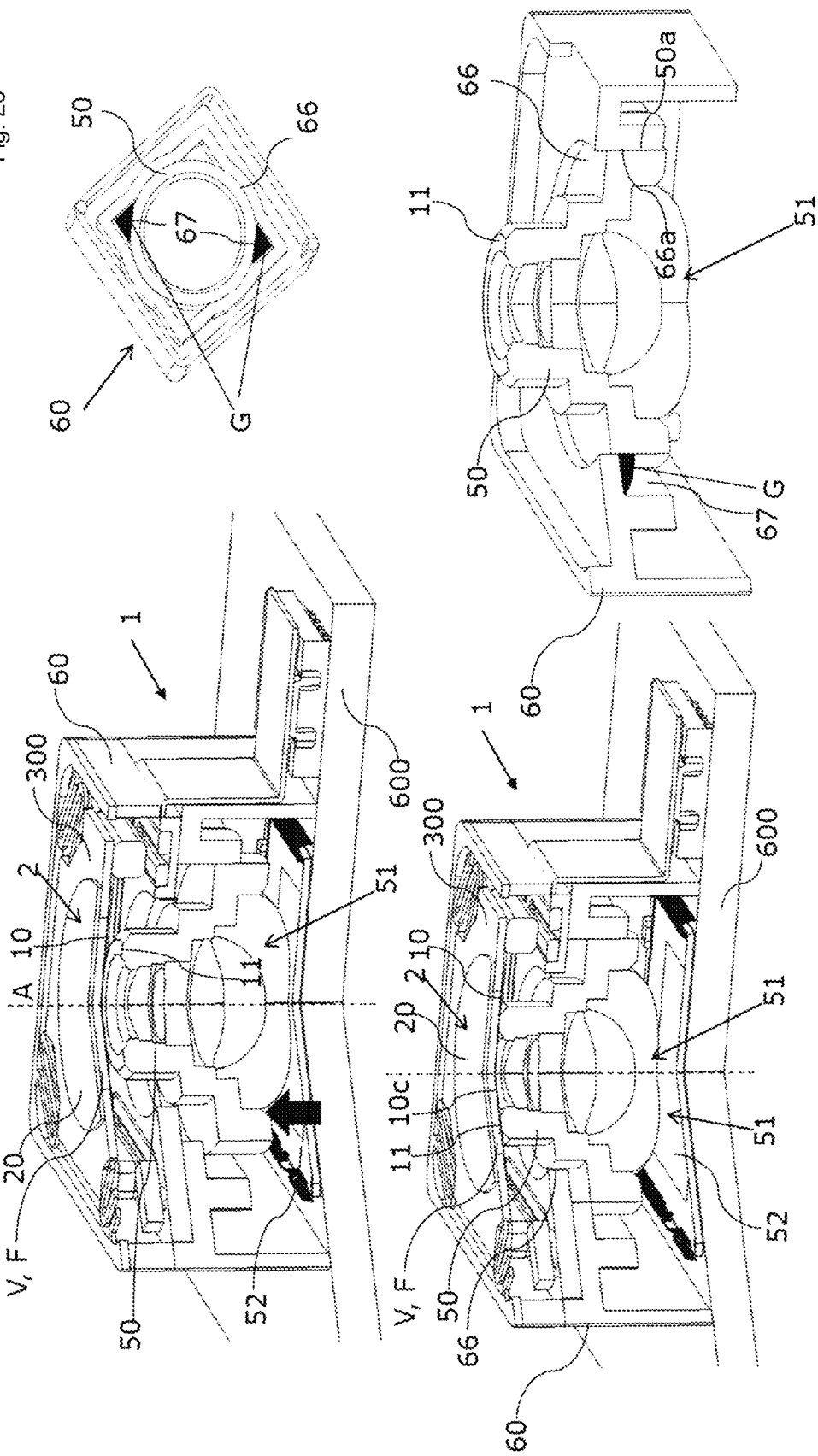
FIG. 26 shows an embodiment of the process of arranging the lens barrel in the housing of an optical device according to the invention in order to initially adjust the focal length of the focus adjustable lens.

FIG. 26 shows a procedure according to the invention for an initial adjustment or calibration of the curvature of said area 10c of the membrane 10 of the focus tunable lens. For this, the lens barrel 50 is moved/screwed into the housing 60 (upper left hand of FIG. 26) until its circular lens shaping part 11 touches the membrane 10 and thus defines said central area 10c of the membrane 10. In a second step, preferably after the membrane 10 has been connected to the lens shaping part 11, the lens barrel 50 is moved until the initial focal length of the focus adjustable lens is set to the desired value. In order to guide the lens barrel 50 upon its movement towards the membrane 10, the housing 60 comprises a recess 66 facing the membrane 10 in the axial direction A, which recess 66 is configured to receive the lens barrel 50 e.g. in a form fitting manner in order to avoid a lateral movement perpendicular to the axial direction A.

The lens shaping part is e.g. pressed against the lower side 10b of the membrane 10 to adjust the curvature of the area 10c (lower left hand side of FIG. 26) until the focal length of the focus tunable lens is correct.

Once in place, the lens barrel 50 is glued in place as shown on the right hand side of FIG. 26. For this, two opposing gaps 67 between an outside of the barrel 50 and an inside of the recess 66 are filled with a glue G which fixes the position of the lens barrel 50 with respect to the housing 60 once the glue is cured. This procedure is particularly helpful to compensate for manufacturing tolerances during the filling of the volume V with fluid F or during the production of the central recess 301.

Figure 27:
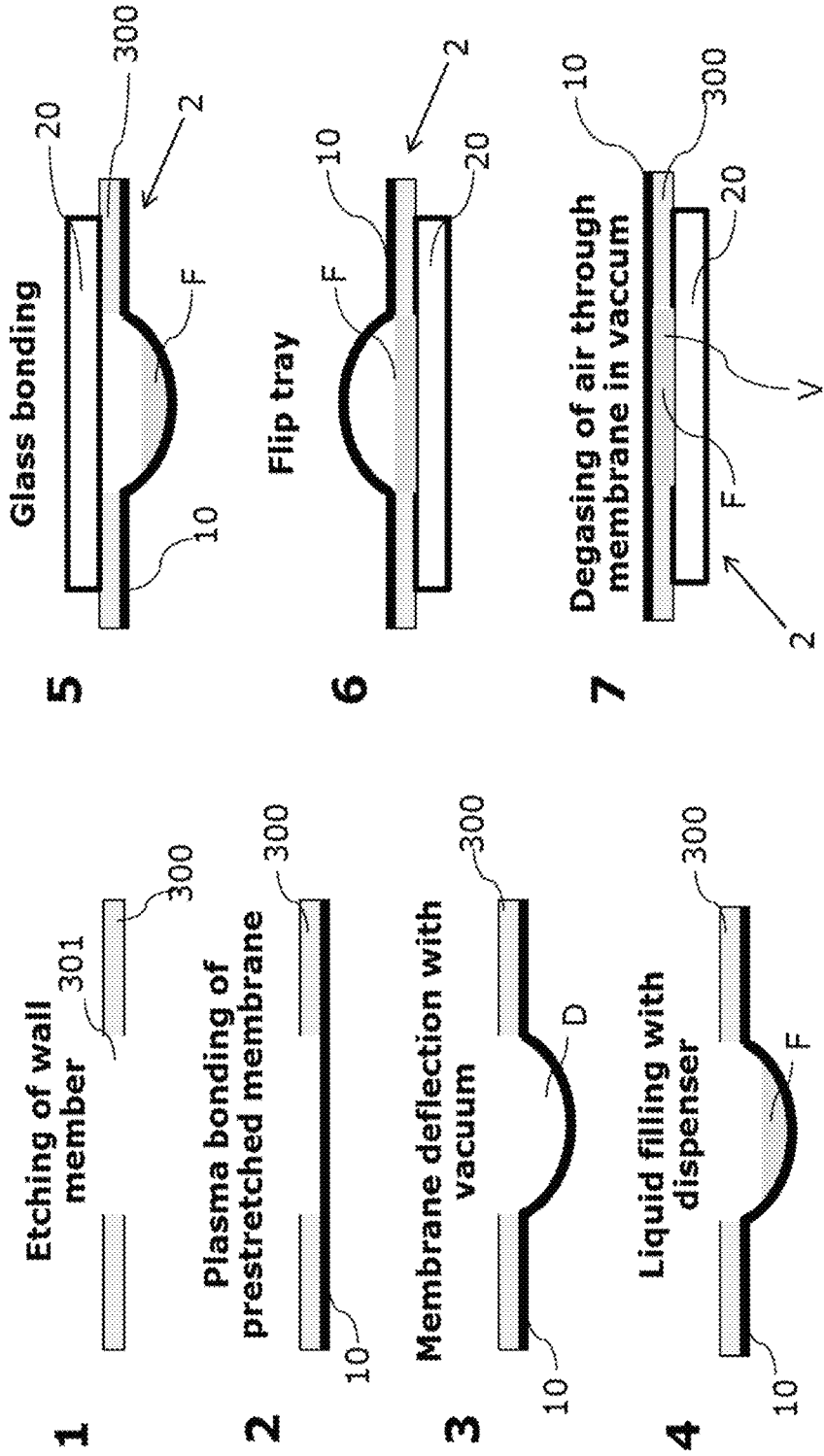
FIG. 27 schematically shows an embodiment of the process of forming the container of an optical device according to the invention and filling it with a fluid in order to form a focus adjustable lens of the device.

Further, FIG. 27 shows a way to produce a container 2 of an optical device 1 according to the invention and to fill it with said fluid F for producing a focus tunable lens. Here, said container is provided by providing the wall member 300, wherein particularly its central recess 301 is generated by etching the wall member 300 (step 1) or by laser cutting or by stamping, plasma bonding a pre-stretched membrane 10 to the wall member 300 (step 2), deflecting the membrane 10 using an underpressure (e.g. vacuum), to form a depression D (step 3) for receiving the fluid F (step 4), bonding the optical element 20 to the wall member 300 (step 5), arranging the container 2 such that the membrane 10 is arranged on top (step 6), and degassing air through the membrane 10 out of the volume V of the container 2 using an underpressure (e.g. vacuum) (step 7).

Figure 28:
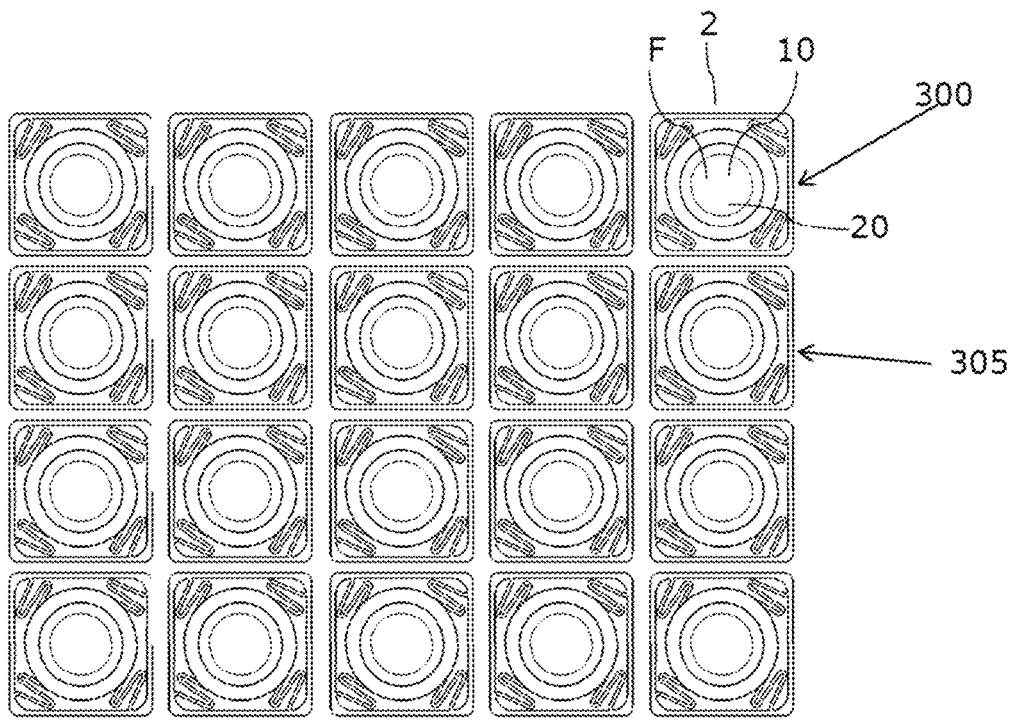
FIG. 28 shows batch processing of a plurality of containers.

FIG. 28 shows the parallel processing of a plurality of containers 2. Here, a plurality of connected containers 2 is formed, wherein the individual containers 2 are obtained by connecting transparent and elastically expandable membranes 10 to an intermediate layer 305 comprising a plurality of integrally connected wall members 300, providing said fluid F in the containers 2 and connecting optical elements 10 to the intermediate layer 305 to close the containers 2, wherein the connected wall members 300 formed by the intermediate layer 305 are separated to provide the individual fluid filled containers 2.

Figure 29:
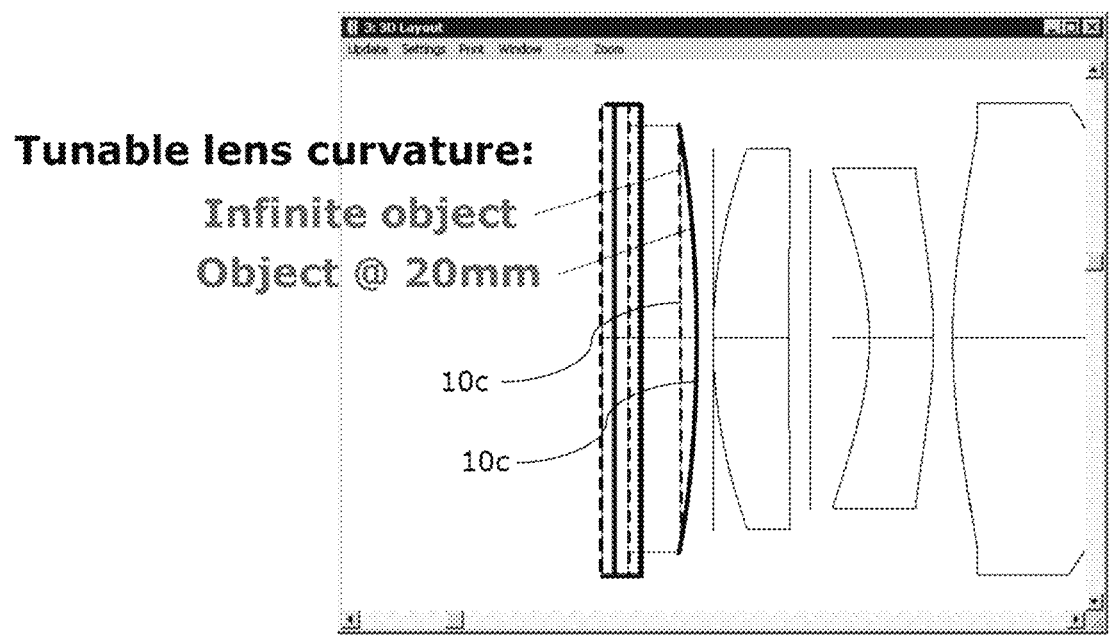
FIG. 29 demonstrates the capability of super-macro imaging of the optical device according to the invention.

Further, FIG. 29 demonstrates that the optical device 1 according to the invention comprises super-macro capabilities due to the fact that the focus adjustable lens comprising said area 10c of the membrane 10 indicated in FIG. 29 is able to focus light from infinite to below 20 mm focus distance (i.e. microscopic imaging) in hi-speed with a minimal change in the tunable lens curvature by simply moving the optical element 20 in the axial direction A.

Figure 30:
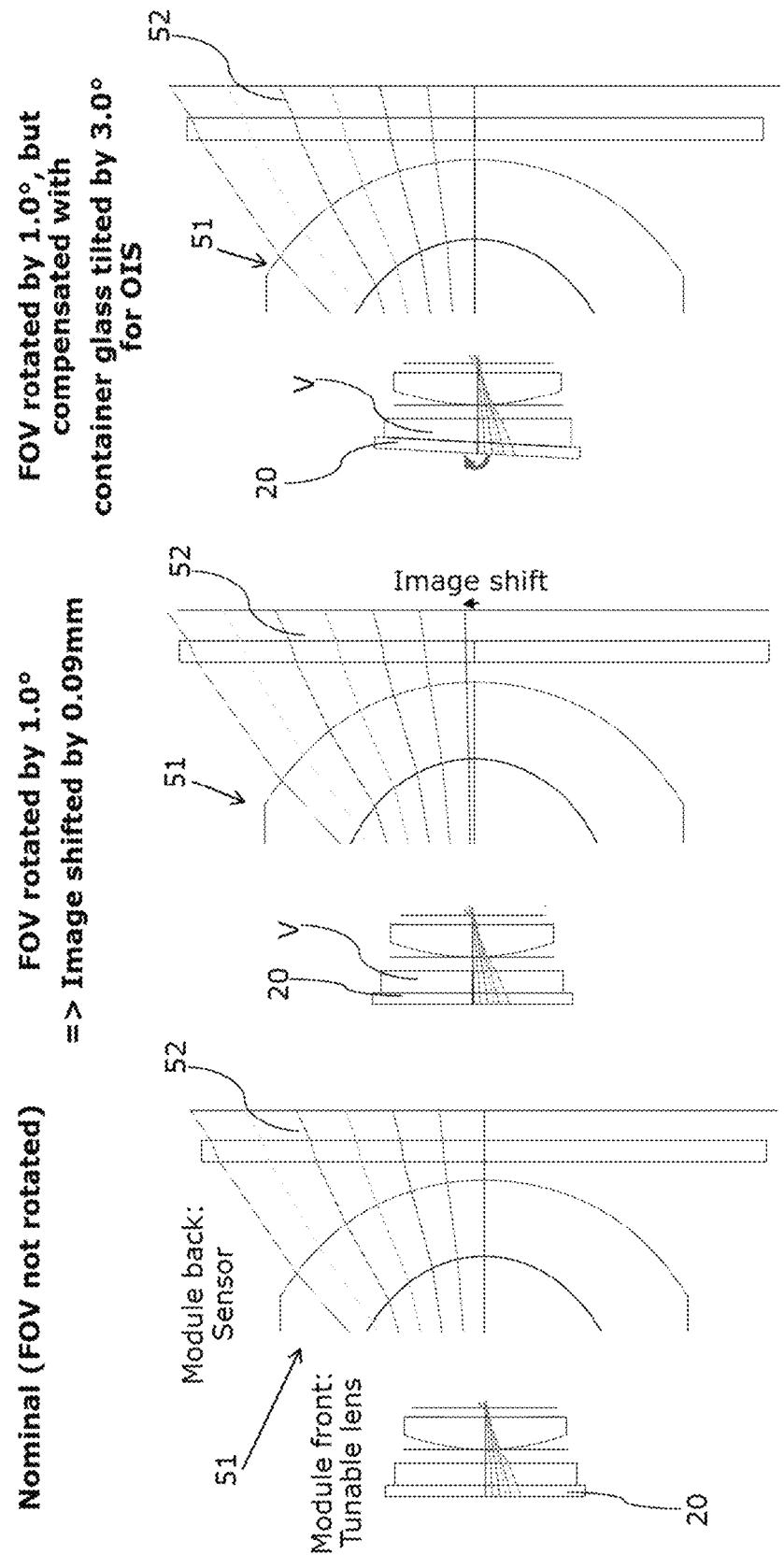
FIG. 30 shows the principle of image stabilization using tilting of the optical element so as to generate a tuneable prism.

Furthermore, FIG. 30 shows the situation where the field of view (FOV) is rotated by 1.0° resulting in a shifted image on the image sensor 52. This can be automatically compensated by tilting the optical element 20 as described herein which is shown on the right hand side of FIG. 30

Figure 31:
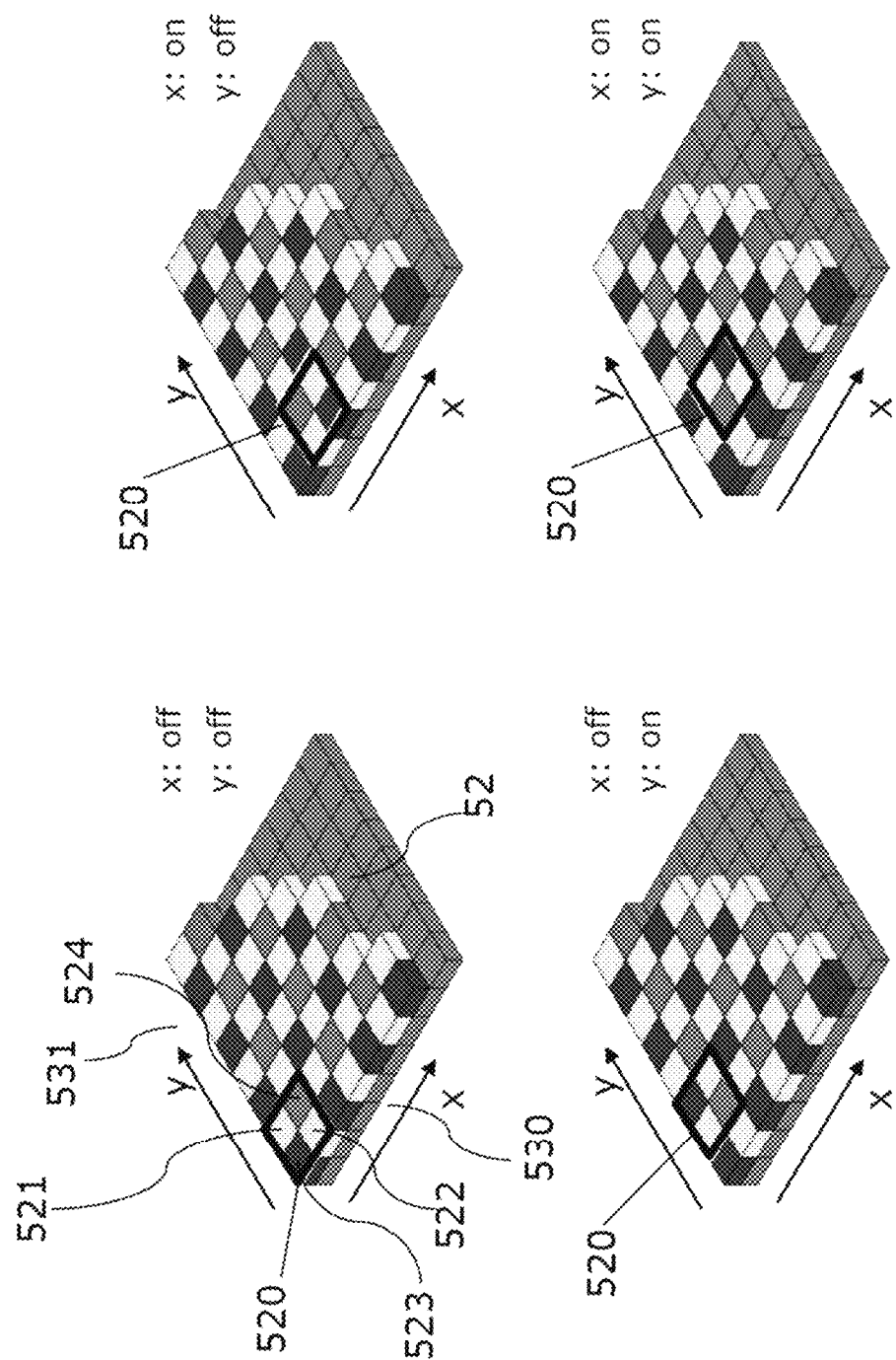
FIG. 31 shows the basic principle of super-resolution using Bayer pattern that can be implemented using tilting of the optical element in order to shift images pixelwise.

Furthermore, FIG. 31 shows how tilting of the transparent optical element 20 is used in embodiments of the present invention to achieve a super-resolution image.

Here, tilting the optical element 20 only as much as is required to move the image by half of an RGB pixel 520 on the image sensor 52 allows to create a super-resolution image, wherein the resolution of the optical element/camera 1 can be enhanced by a factor of four. Due to the tunable prism (volume V), the present invention allows a very fast movement in the few milliseconds range and therefore a high frame rate super resolution image.

In detail, as shown in FIG. 31, when the image sensor 52 is an RGB image sensor 52, each RGB pixel 520 (indicated by a solid black line square) consist of four pixels 521, 522, 523, 524 namely two pixels 521, 522 comprising a green filter (i.e. a filter transparent to green light) and a pixel 523 comprising a blue filter as well as a pixel 524 comprising a red filter, which four pixels are arranged in a square array (see e.g. black square indicating RGB pixel 520) so that each four neighbouring color filters forming a square together comprise two green filters 521 and 522 that are diagonally arranged in said square as well as a blue and a red filter 523, 524 which are also arranged diagonally in the said square.

Particularly, the individual pixels 521, 522, 523, 524 forming the RGB pixels 520 are arranged in (parallel) rows 530 that extend in a first direction x and (parallel) columns 531 that extend in a second direction y that runs orthogonal to the first direction x. Such a filter array having a filter pattern that comprises 50% green, 25% red, and 25% blue filters is also known as Bayer filter.

In case of such an RGB image sensor 52, the control unit 65 described herein is preferably configured to control the actuator means 40 such that an image projected onto the image sensor 52 by the optical device 1 (e.g. by the adjustable focus lens and the at least one lens 51 arranged in the lens barrel 50) is moved from an initial position (x: off, y: off) merely by one pixel in the first direction x (x: on, y: off), merely by one pixel in the second direction y (x: off, y: on), and by one pixel in the first direction x as well as by one pixel in the second direction y (x: on, y: on) by tilting the wall member 300 and therewith the optical element 20 in the corresponding direction which forms the volume V into a prism that deflects the light passing through the adjustable lens causing the desired displacements of the image projected onto the image sensor. Particularly, each of the four projected images that are shifted with respect to each other as described above are recorded by means of the image sensor 52, which four recorded images are then superimposed to form a single super-resolution image having a resolution being enhanced by a factor of four.

Figure 32:
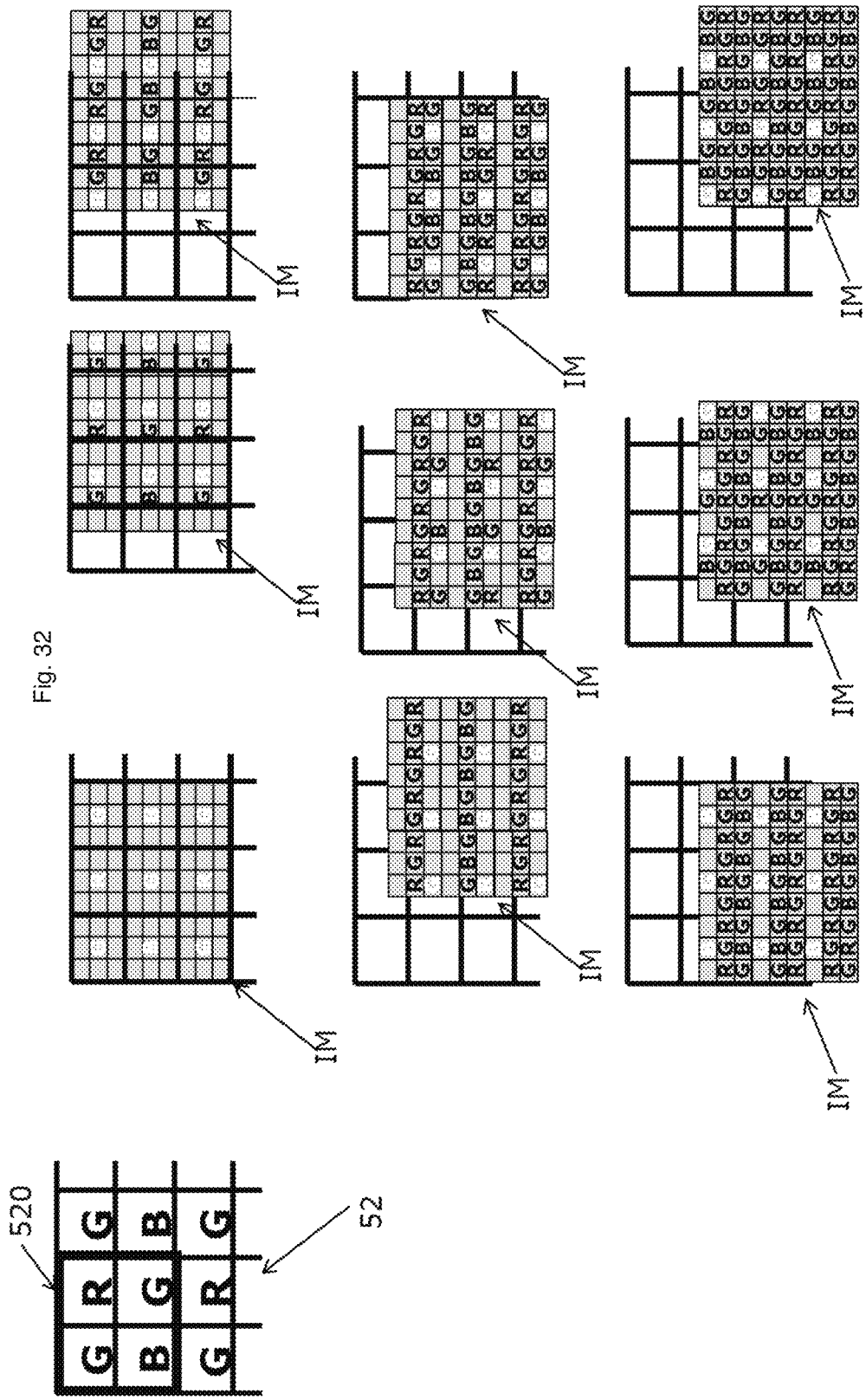
FIG. 32 shows the principle of achieving 9× super-resolution through optical image translation by means of tilting the optical element.

According to another embodiment shown in FIG. 32, the control unit 65 can be configured to control the actuator means 40 such that an image projected onto the image sensor 52 by the optical device 1 (e.g. by the adjustable lens and the at least one lens arranged in the lens barrel) is moved by a fraction or multiple fractions of an RGB pixel 520 by tilting the optical element 20 accordingly, wherein apart from the initial projected image each shifted projected image is recorded by the image sensor 52 and these recorded images are then superimposed by the optical device to form a high-resolution image. In FIG. 32 said fraction is a third of an RGB pixel 520 and the image IM is successively shifted 8 times as shown in FIG. 32 to yield the nine images IM to be superimposed by the optical device 1.

Figure 34:
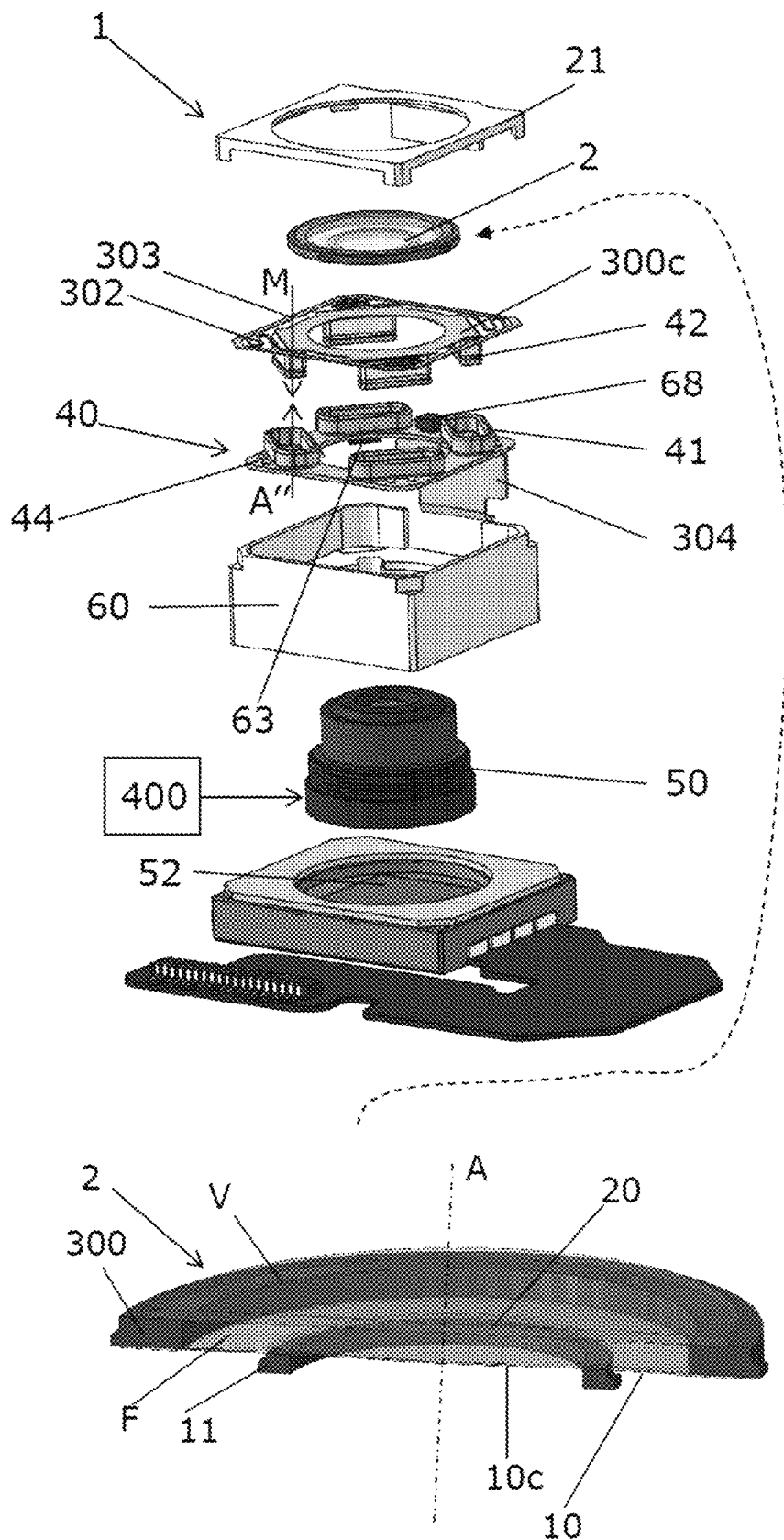
FIG. 34 shows an exploded view of a further embodiment of the optical device according to the invention

Furthermore, FIG. 34 shows a further embodiment of an optical device 1 according to the invention. Here, the coils 41 are arranged on a circumferential coil frame 44 which rests on the housing 60 such that the four coils 41 each surround an associated magnet 42, wherein these four magnets 42 are now arranged on a lower side of a container carrier 300c on which the container 2 of the optical device 1 rests, which container 2 comprises a circumferential wall member 300 that rests on the container carrier 300c and to which the flat optical element 20 and the membrane 10 are connected so that said volume V of the container 2 is formed in which the transparent fluid F is arranged.

The container carrier 300c is (preferably integrally) connected via four spring members 302 to the outer frame member 303 which in turn rests on the housing 60. The container 2 is thus elastically supported on the housing 60 and can be moved by the magnets 42 and the coils 41 that are fixed on the housing 60 as described above in detail. Particularly, the magnets 42 are magnetized in a direction M running perpendicular to the optical element 20, while said coil axes A" run parallel to the axial direction A.

Furthermore, the housing 60 may comprise a circumferential spacer element (see also above) on which the frame member 303 may be supported, wherein the spacer element is configured to expand in the axial direction A with increasing temperature of the optical device 1 for compensating a temperature induced increase of said volume V of the container 2 (due to an increasing volume of the fluid F with temperature). Such a spacer element may also be used in the other embodiments described herein.

Further, the temperature of the container 2, particularly of the fluid F, can be measured with a temperature sensor 63 that is integrated on the coil support 44. Further. The position of the magnets 42 and thus of the container 2 can be measured with a Hall sensor 68 that is integrated on the coil support 44, too. The measured position can be used by a control unit to control the actuator means 40 (i.e. the coils 41) in order to axially move and/or tilt the optical element 20 (container 2) so as to adjust the focal length of the focus adjustable lens 2 and provide image stabilization and/or super resolution (e.g. as described herein). Again, electrical contact to the coils 41 and sensors 63, 68 as well as other components may be made via a flexible conductor 304 that is connected to the coil support 44 or forms the coil support 44.

Figure 35A:
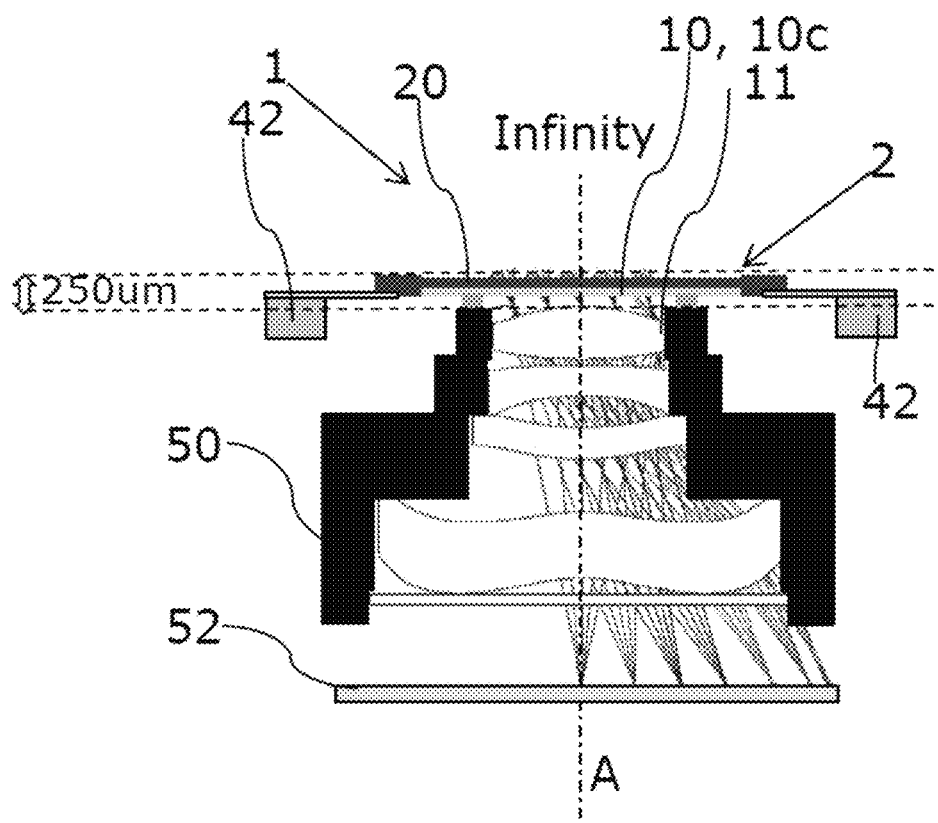
FIGS. 35A to 35C show the autofocus and optical image stabilization function, particularly of the embodiment of FIG. 34.
Figure 35B:
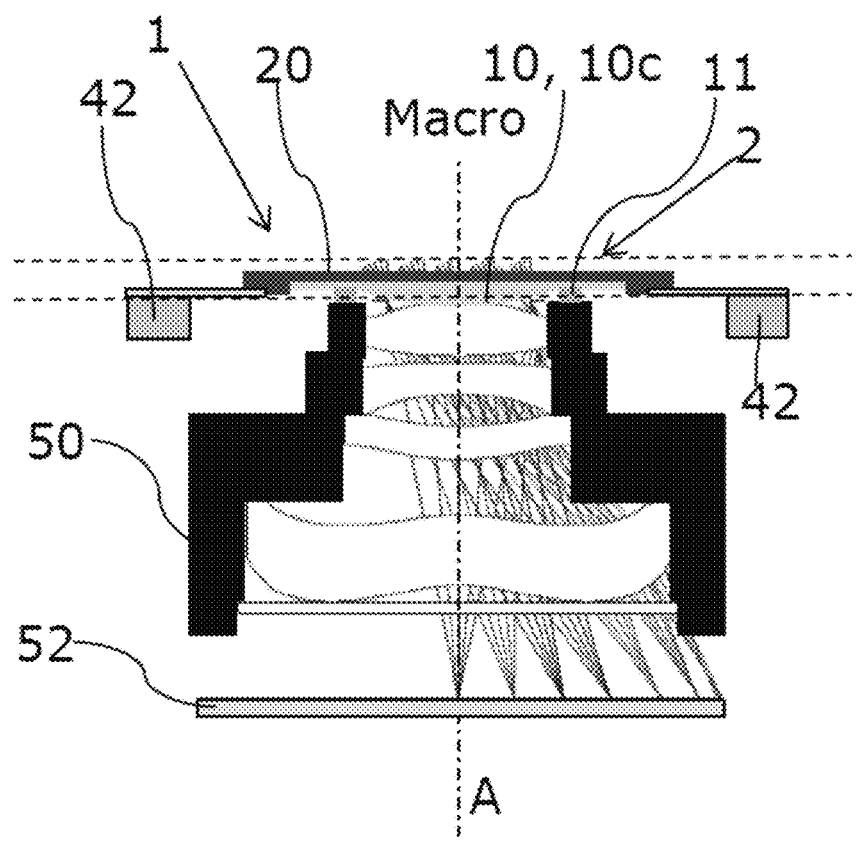

Adjusting the focal power by moving the optical element 20 of the optical device 1 of FIG. 34 axially is shown in FIG. 35A (Infinity) and FIG. 35B (Macro). Here, as shown in the upper part of FIG. 35C, optical image stabilization (OIS) can be provided by means of tilting the optical element 20 as described herein. This allows to move the image projected onto the image sensor 52 in a direction opposite to a shift of the image caused by a disturbance/movement of the optical device 1.

Figure 35C:
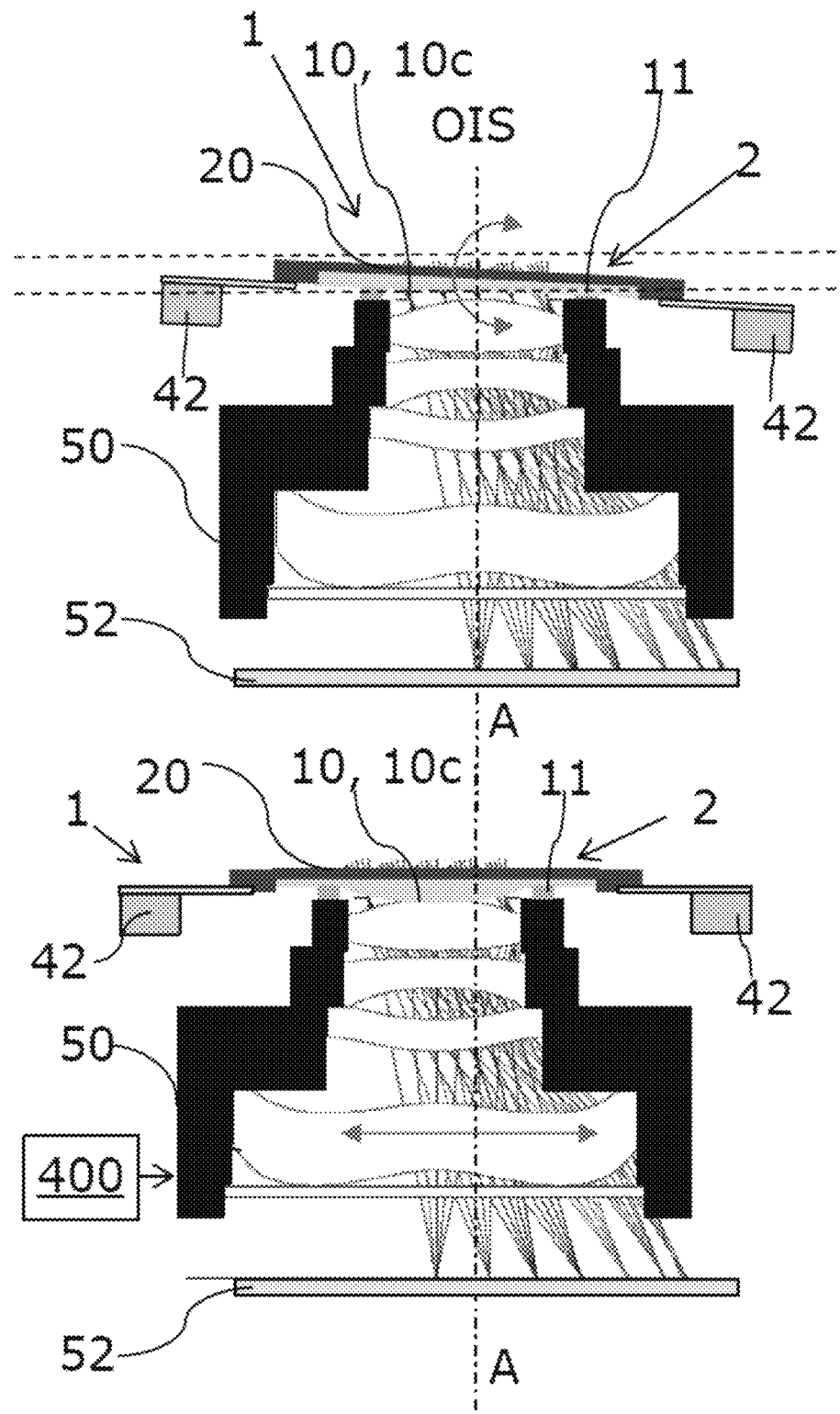

Alternatively, or in addition, the lens barrel 50 may be moved together with the container 2 parallel to the image sensor 52) as indicated in the lower part of FIG. 35C to provide OIS.

The embodiment according to FIG. 34 allows for a relatively small height of the design of the optical device 1 in the axial direction A which is very important in case the device 1 is to be used in mobile applications such as smart phones.

Figure 36A:
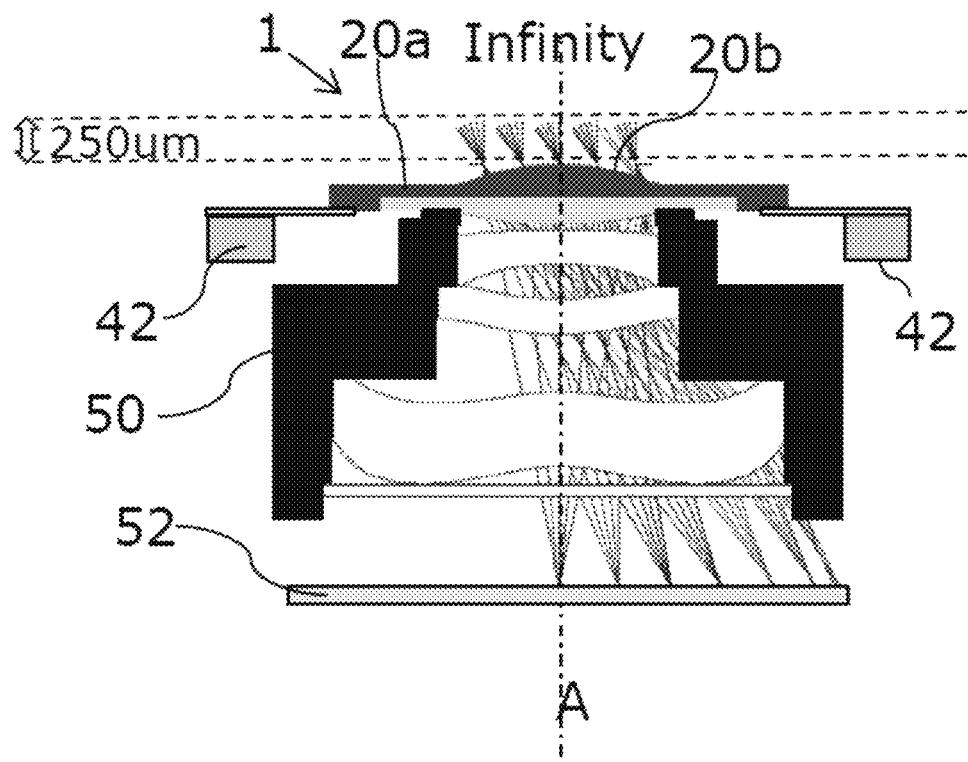
FIGS. 36A to 36C show the autofocus and optical image stabilization function of further embodiment of the optical device according to the invention having an optical element that comprises an integrated rigid lens.
Figure 36B:
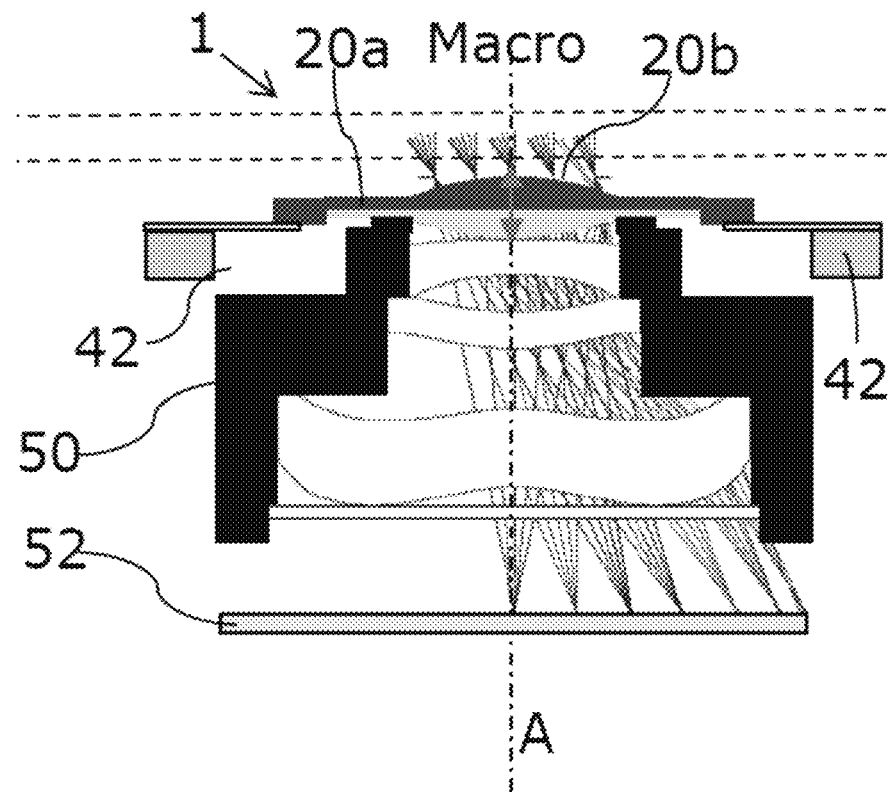
Figure 36C:
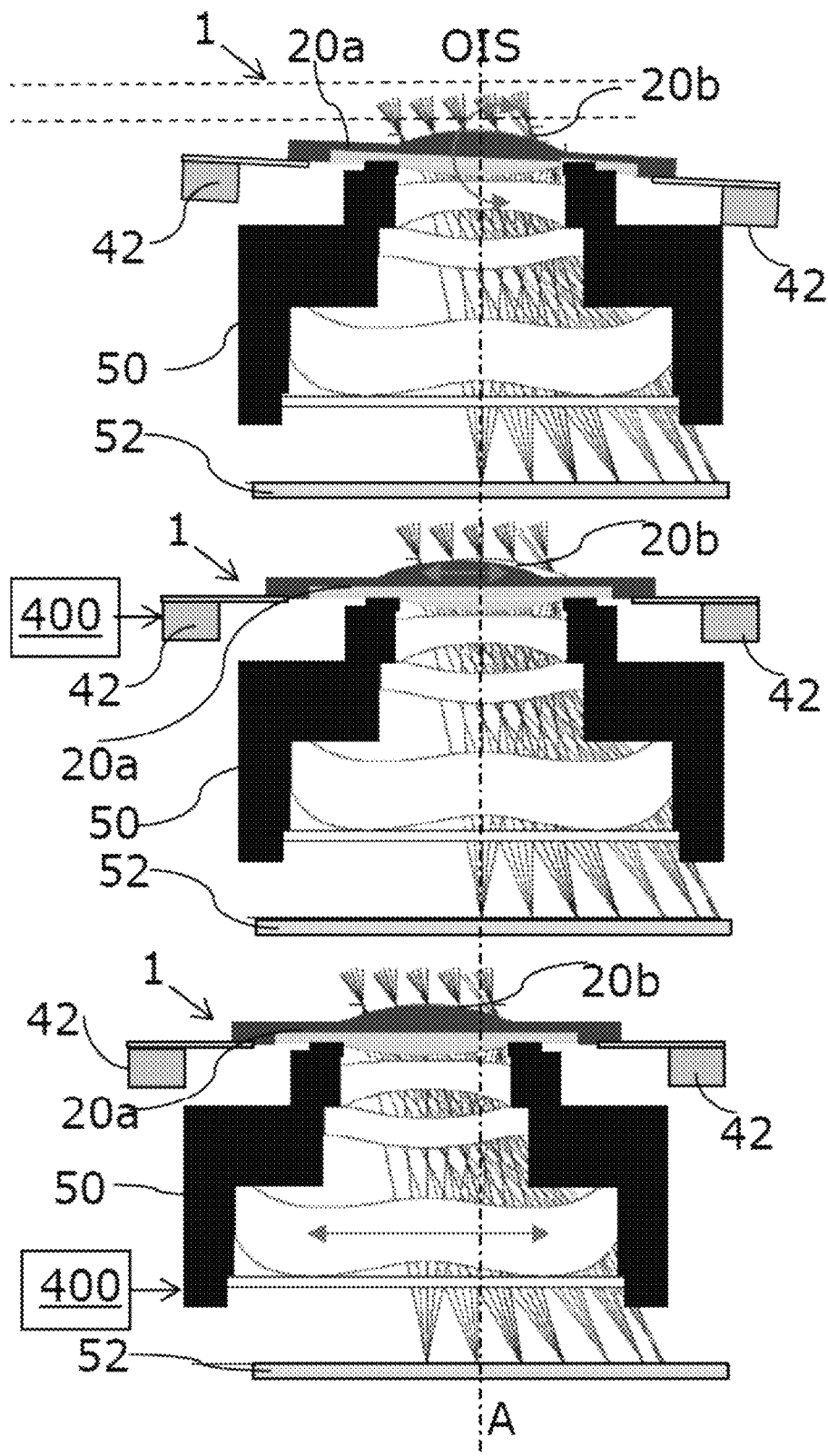

This height can be further reduced as indicated in FIGS. 36A to 36C by forming the optical element 20 into a rigid lens, particularly a converging lens such as plano-convex lens comprising a convex surface area 20b facing away from the lens barrel 50 and a flat surface 20a facing the lens barrel 50. This way the rigid lens 20 can assume the function of the first lens of the lens barrel 50.

Also here, autofocus (AF) can be achieved by moving the optical element 20 axially (along axis A) thus deforming the area 10c of the membrane 10 as described herein (cf. FIG. 36A "Infinity" and FIG. 36B "macro", while OIS in turn may be achieved by at least one of: tilting the optical element 20 (upper part of FIG. 36C), moving the optical element 20/container parallel to the image sensor 52) with respect to the lens shaping part 11 fixed to the barrel 50 as shown in the middle part of FIG. 36C, or by moving the whole lens barrel 50 together with the container 2 parallel to the image sensor 52 (lower part of FIG. 36C).

Figure 37A:
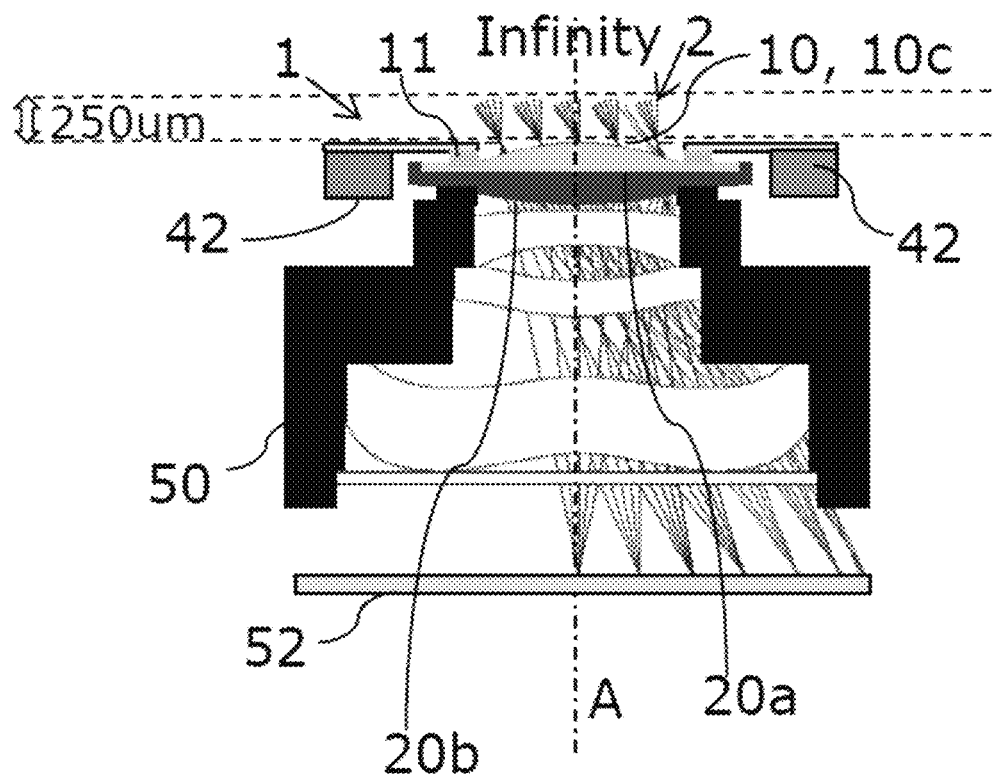
FIGS. 37A to 37C show the autofocus and optical image stabilization function of yet another optical device according to the invention wherein here the lens shaping part acts on a surface of the membrane that faces away from the rigid lens.
Figure 37B:
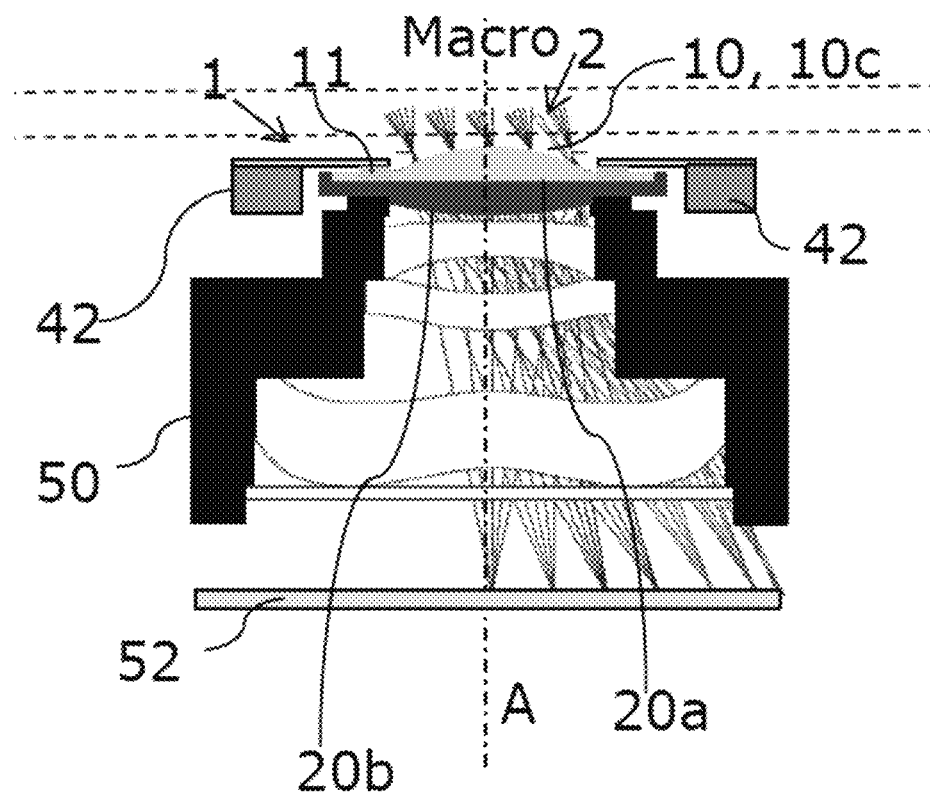
Figure 37C:
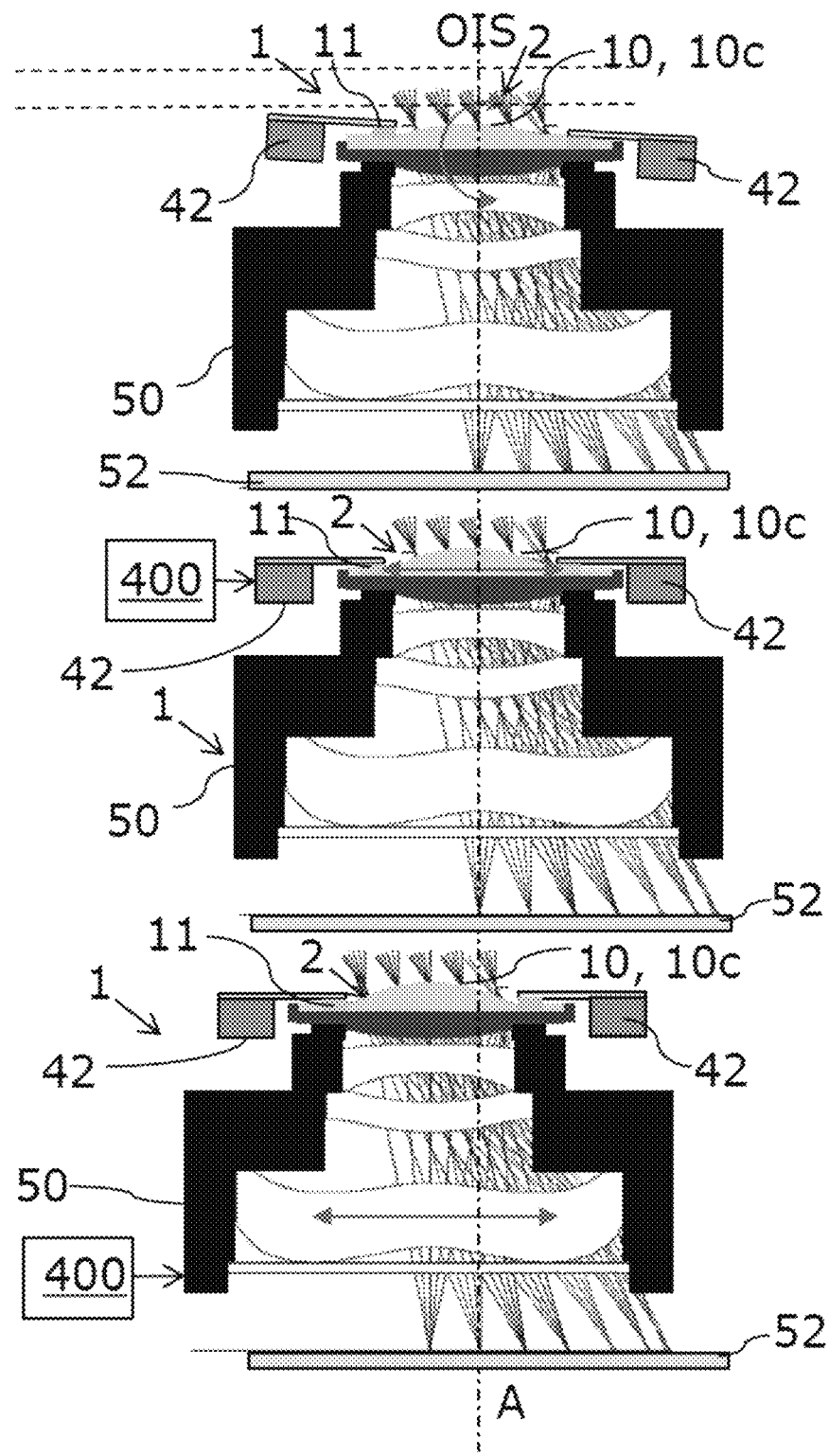

Furthermore, as shown in FIGS. 37A to 37C, the lens shaping part 11 can also be moved by means of magnets 42 and coils 41 as described herein in order to deform the area 10c of the membrane 10 and/or in order to deform the volume V for deflecting light (e.g. so as to move an image on the image sensor 52 for purposes of optical image stabilization or super resolution), wherein now the optical element 20 is fixed to the lens barrel 50 and is arranged between the membrane 20 and the lens barrel 50. Here, the membrane 20 forms the first surface of the focus adjustable lens 2 on which light impinges that travels through the volume V of the container 2 towards the image sensor 52.

Also here, as shown in the upper part of FIG. 37C, the lens shaping part 11 can be tilted, or can be moved parallel to the image sensor 52 (with respect to the membrane 20) as shown in the middle part of FIG. 37C in order to deform the volume V so that light impinging on the image sensor 52 is shifted on the sensor 52. Further, also the whole lens barrel 50 can be moved parallel to the image sensor 52 together with the container 2 in order to provide such a shift (e.g. for OIS or super resolution).

In the embodiments shown in FIGS. 35C, 36C, 37C, the parallel movement (with respect to the image sensor 52) of the barrel 50/container 2, or of the container 2, or lens shaping part 11 can be achieved by a further suitable actuator means 400.

Figure 38A:
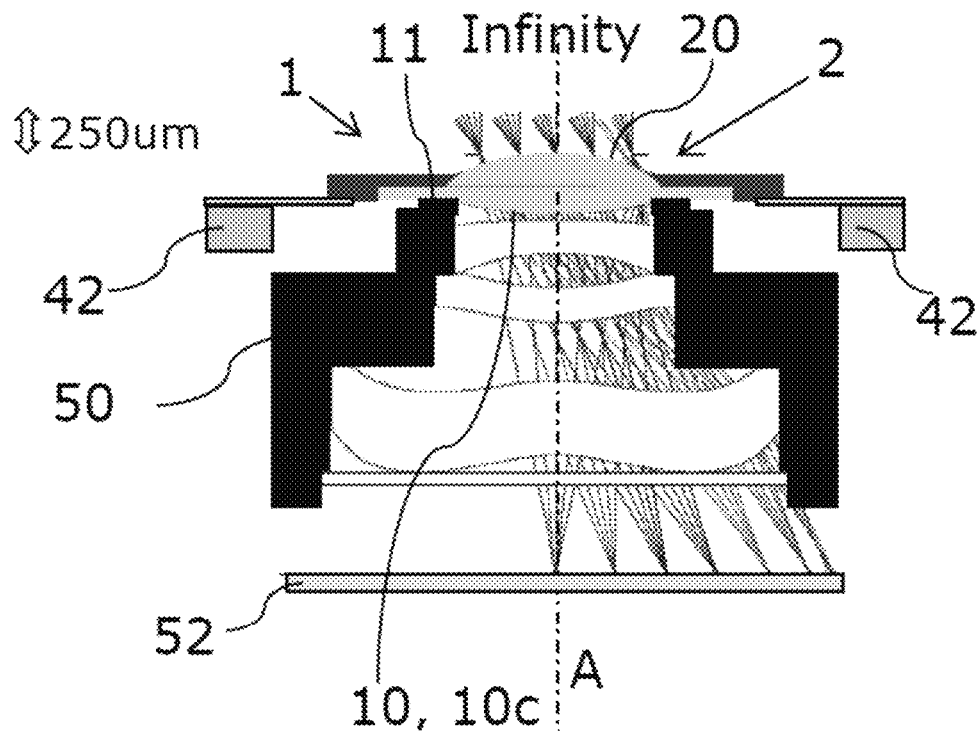
FIGS. 38A-38B show embodiments, where the optical element is also formed by a membrane so that the optical device comprises two membranes that face each other, wherein the lens shaping part acts on one of these membranes to tune the focal length of the optical device.
Figure 38B:
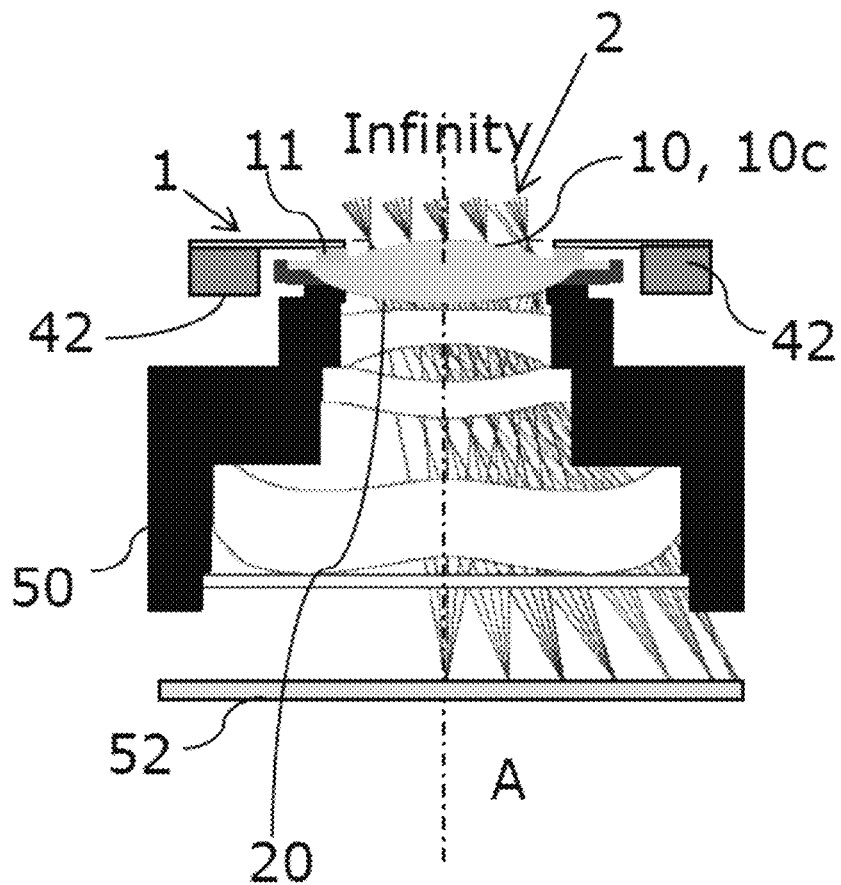

Further, as shown in FIGS. 38A to 38B, the rigid lens/optical element 20 of the afore-described embodiments can also be a transparent and elastically deformable membrane 20 instead of a rigid lens or optical element 20. Thus, both sides of the container 2 can now be elastically deformed. This allows to reduce the required deformation of the lens, which reduces power consumption while keeping optical aberrations including spherical aberrations comparatively low.

For any embodiment described herein, the position of the magnet and the coil can be switched. Furthermore, the shown actuator layouts are only exemplary and different coil magnet layouts resulting in the desired movement are possible. With regard to possible positions of the coils 41 of the actuator means 40 with respect to their associated magnets 42, FIGS. 39A to 39D show different configurations that may also be used in the afore-described embodiments of the optical device 1 according to the invention.

Figure 39A:
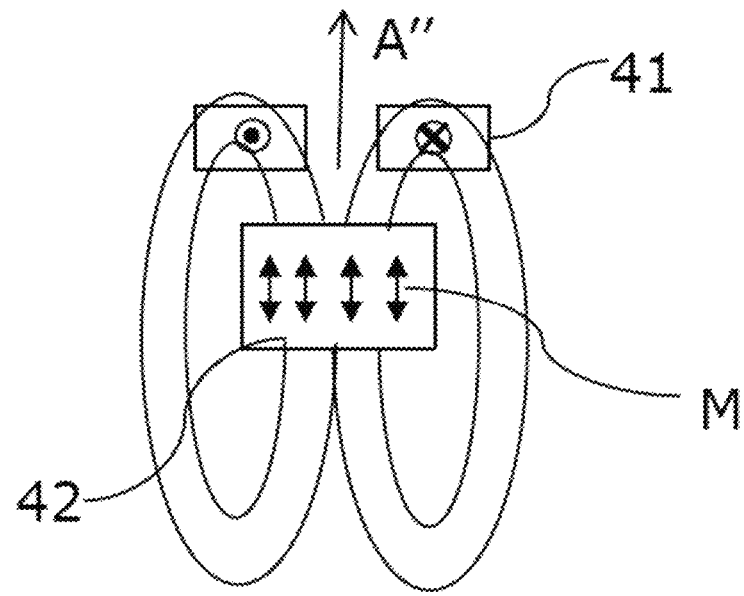
FIGS. 39A to 39D show different possible arrangements of the magnet(s) and coils of the actuator means for axially moving and/or tilting the optical element or lens shaping part of the optical device according to the invention.

According to FIG. 39A the respective magnet 42 faces its associated coil 41 in a centered fashion, wherein the magnetization M and the coil (or winding) axis A" around which a conductor of the coil 41 is wound run parallel with respect to each other (of course due to a tilting movement of the optical element 20 or lens shaping part 11, the magnetization M and coil axis A" may slightly deviate from said parallel configuration).

Figure 39B:
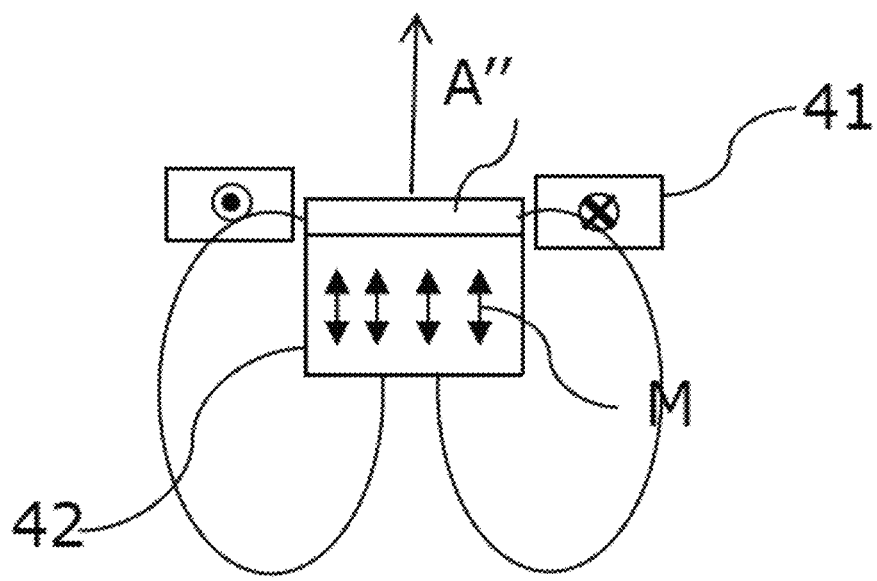

Further, according to FIG. 39B, the magnet 42 or a magnetic flux return structure 43 connected to the face side of the magnet 42 may actually partially protrude into a central opening formed by the associated coil 41.

Figure 39C:
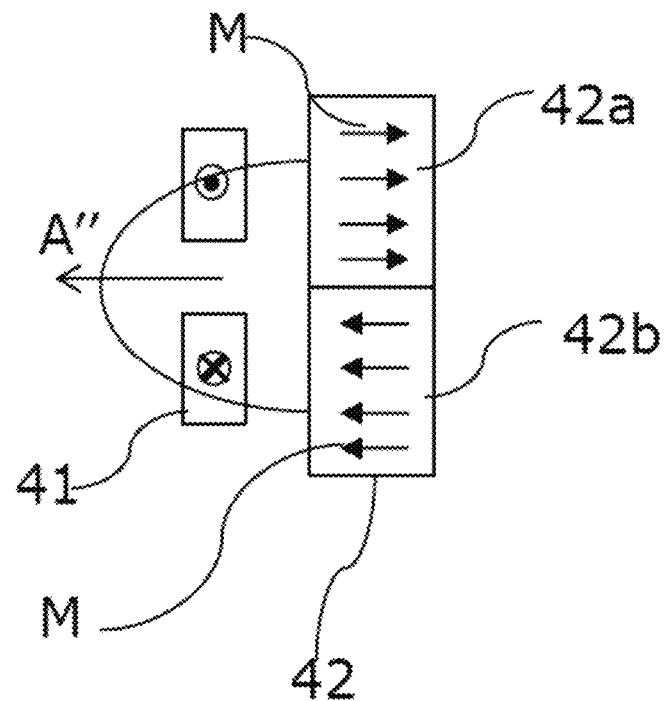

Further according to FIG. 39C, the respective magnet 42 may face its associated coil 31 as shown in FIG. 39A but may comprise adjacent portions 42a, 42b that are magnetized in an antiparallel fashion, wherein again said (antiparallel) magnetizations M run parallel to said coil axis A".

Figure 39D:
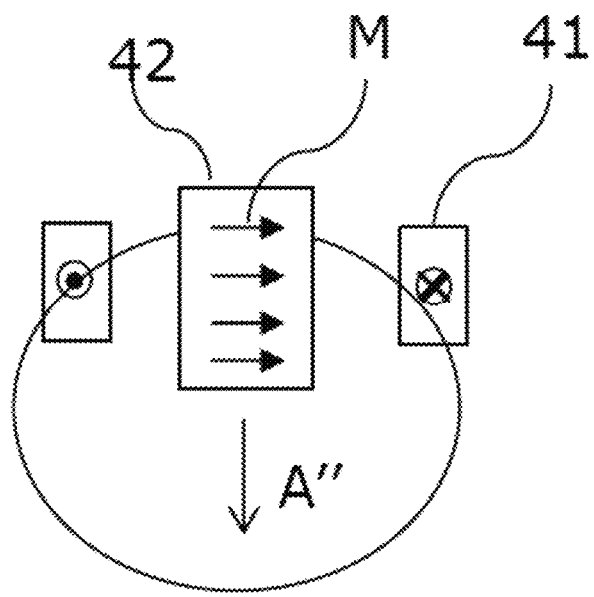

Further, the respective magnet 42 may be arranged inside the respective coil 31 and may comprise a magnetization M that runs perpendicular to the coil axis A" as shown in FIG. 39D.

Figure 40:
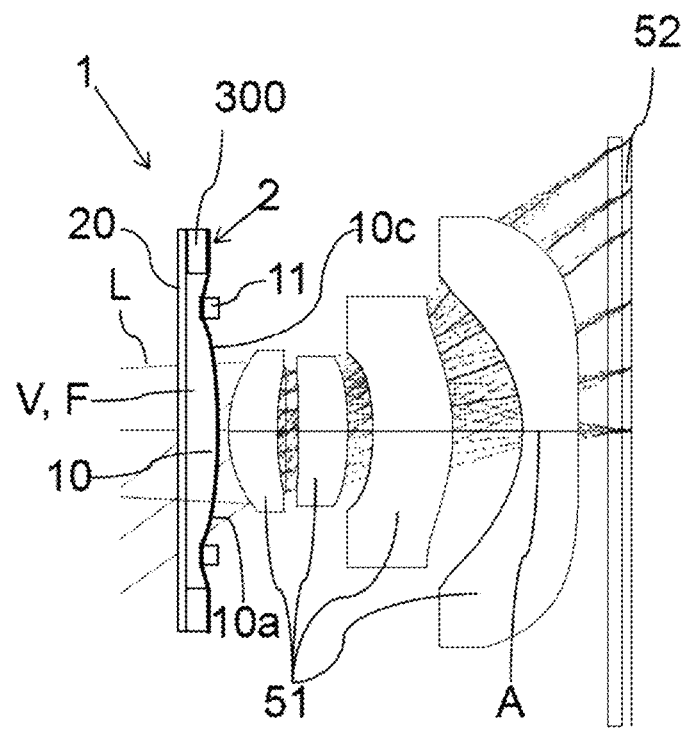
FIG. 40 shows an embodiment of an optical device according to the invention, wherein a front surface of the membrane of the container/focus adjustable lens faces the lens barrel/image sensor of the optical device.

Furthermore, FIG. 40 shows an embodiment of an optical device according to the invention, wherein a front surface 10a of the membrane 10 of the container 2/focus adjustable lens 2 faces the lens barrel 50/image sensor 52 of the optical device 1.

Particularly, the optical device 1, comprises a transparent and elastically expandable membrane 10, an optical element 20 facing the membrane 10, and a wall member 300, wherein the optical element 20 and the membrane 10 are connected to the wall member 300 such that the container 2 with a volume V is formed. As before, the volume V of the container is filled with a fluid F, wherein a lens shaping part 11 is in contact with the membrane 10 for defining a curvature adjustable area 10c of the membrane 10, which area 10c faces said optical element 20, The curvature of area 10c and therewith the focal length of the lens 2 can be changed as described herein, particularly by moving the lens shaping part relative to the container 2.

As already indicated, the membrane 10/area 10c comprises an outside or front surface 10a that faces away from the fluid F, but faces the image sensor 52 or rigid lenses 51 that are arranged in front of the image sensor 52. The rigid lenses 51 can be arranged in a lens barrel 50 (not shown).

Figure 41:
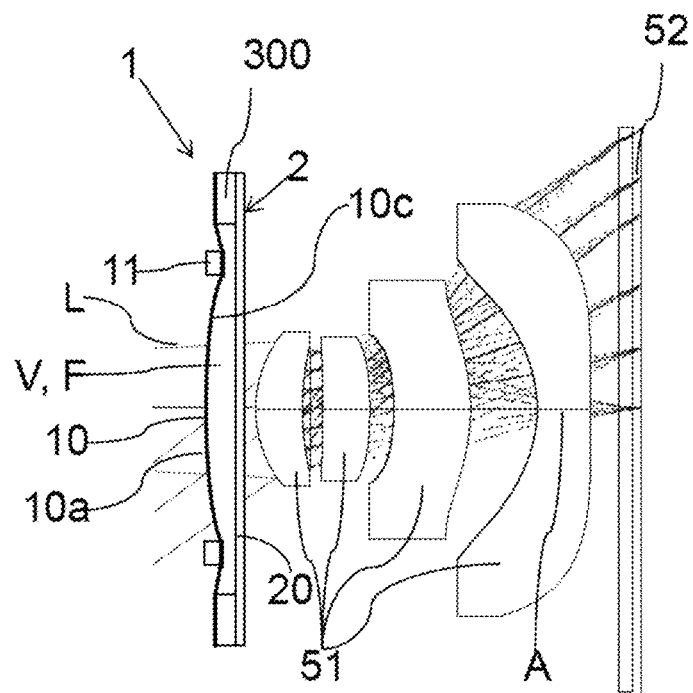
FIG. 41 shows a modification of the embodiment shown in FIG. 40, wherein here the front surface of the membrane of the container/focus adjustable lens faces away from the lens barrel/image sensor of the optical device.

Alternatively, as shown in FIG. 41, the front surface 10a may also face away from the rigid lenses or from the image sensor. Thus, the lens shaping part is also arranged on a side of the container 2 that faces away from the rigid lenses 51 or from the image sensor.

Figure 42:
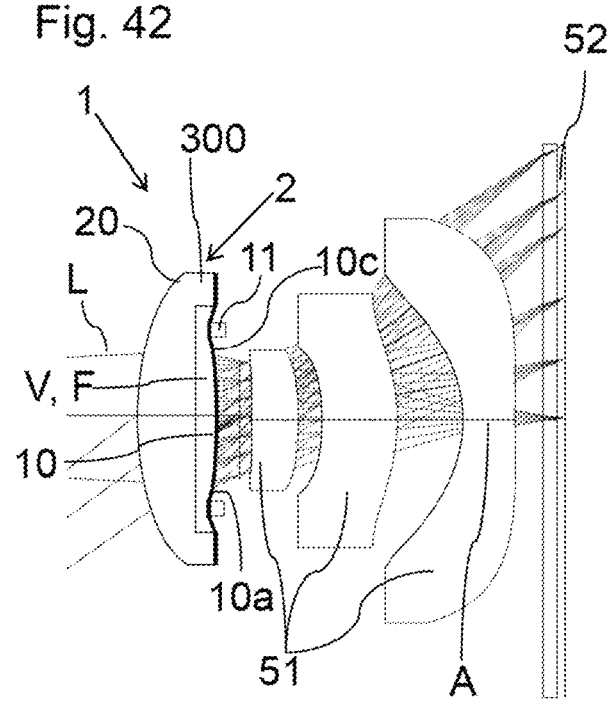
FIG. 42 shows an embodiment, where the container/focus adjustable lens is embedded into a lens barrel and forms the first lens of the lens barrel.

As further shown in FIG. 42, the optical element 20 does not have to be a flat transparent member, but can also form a rigid lens, here a plano-convex lens 2 which bulges away from the image sensor 52. Here, the front surface 10a of the membrane 10 faces the image sensor 52. Such a configuration can be used to integrate the container 2/focus adjustable lens 2 into a lens barrel, particularly into the topmost rigid lens of the lens barrel 50 (not shown)

Figure 43:
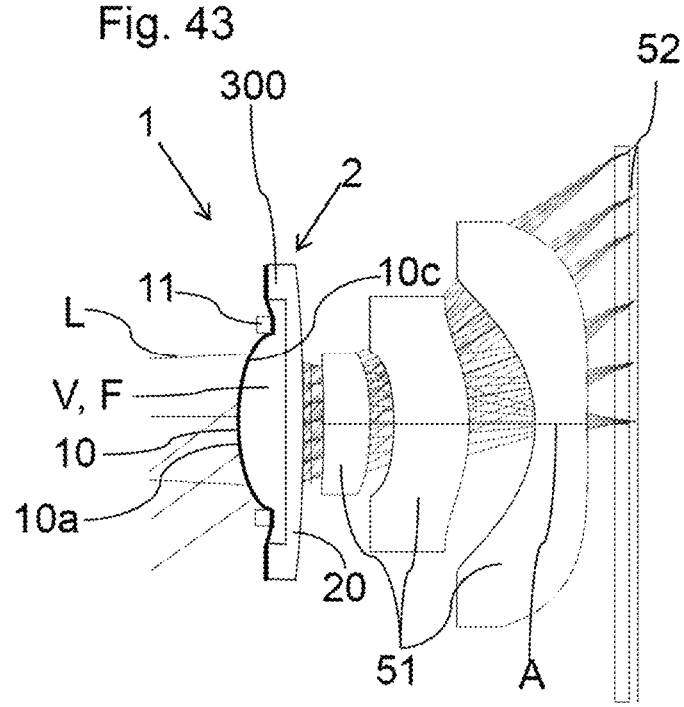
FIG. 43 shows a modification of the embodiment shown in FIG. 42, wherein here the front surface of the membrane of the container/focus adjustable lens faces away from mage sensor of the optical device.

Alternatively, as shown in FIG. 43, the rigid lens formed by the optical element 20 can also bulge towards the remaining rigid lenses 51 or towards the image sensor 52. Here, as in FIG. 41, the front surface 10a of the membrane faces away from the rigid lenses 51 or from the image sensor 52.

Figure 44:
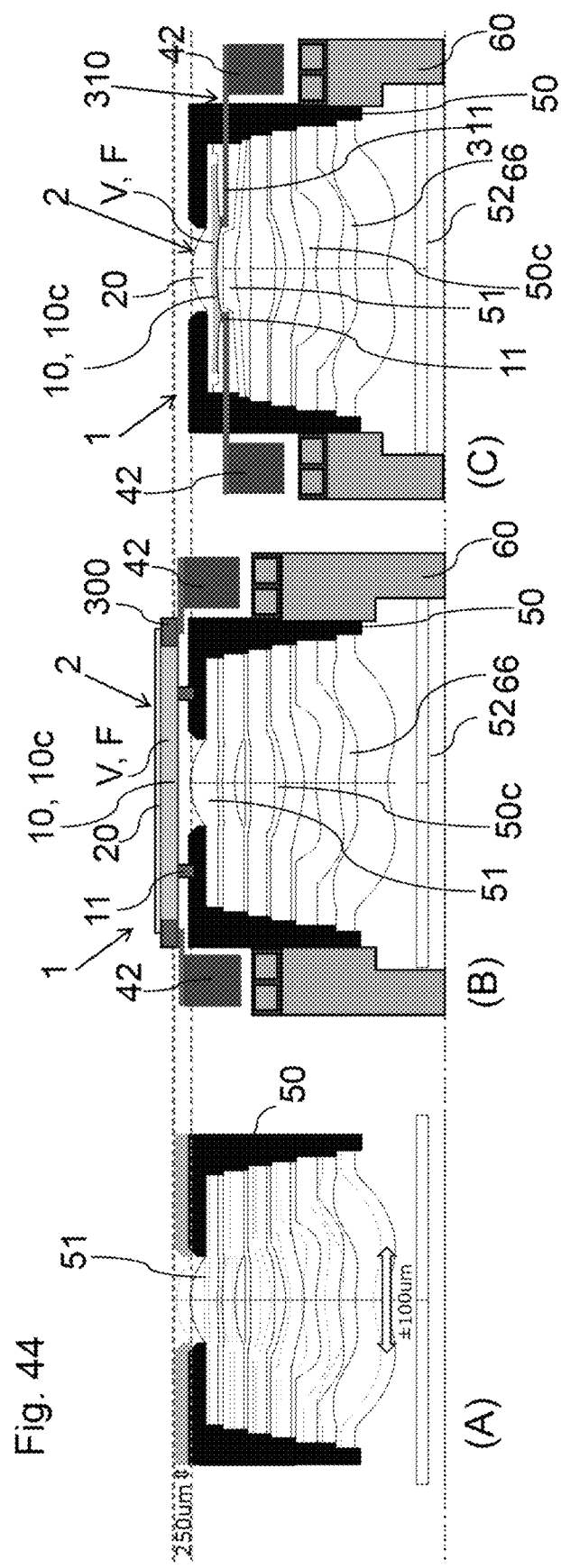
FIG. 44 shows a standard lens barrel having only rigid lenses (A) compared to two embodiments of the present invention, wherein the container/focus adjustable lens is placed in front of a lens barrel as an add-on (B), or wherein the container/focus adjustable lens is embedded into the lens barrel to form a topmost rigid lens of the lens barrel (C)

FIG. 44(A) shows a standard lens barrel 50 having only rigid lenses 51 compared to two embodiments of the present invention, wherein the container 2/focus adjustable lens 2 is placed in front of a lens barrel 50 as an add-on (cf. FIG. 44(B)), or wherein the container 2/focus adjustable lens 2 is embedded into the lens barrel 50 to form a topmost rigid lens of the lens barrel 50 (cf. FIG. 44(C)), which will be explained in detail below.

Figure 45:
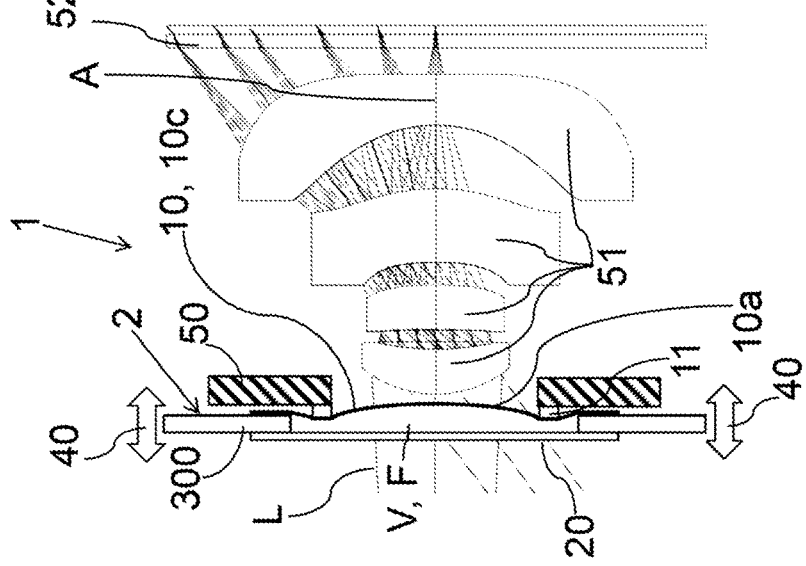
FIG. 45 shows the realization of an autofocus, wherein the container is moved in the axial direction with respect to a fixed lens shaping part to adjust the focus of the focus adjustable lens.

FIG. 45 shows the realization of an autofocus, wherein the container 2, which is designed as shown in FIG. 40, is moved in the axial direction A with respect to a fixed lens shaping part 11 so that the area 10c is curved/deformed correspondingly which adjusts the focus of the focus adjustable lens 2 as described above.

Figure 46:
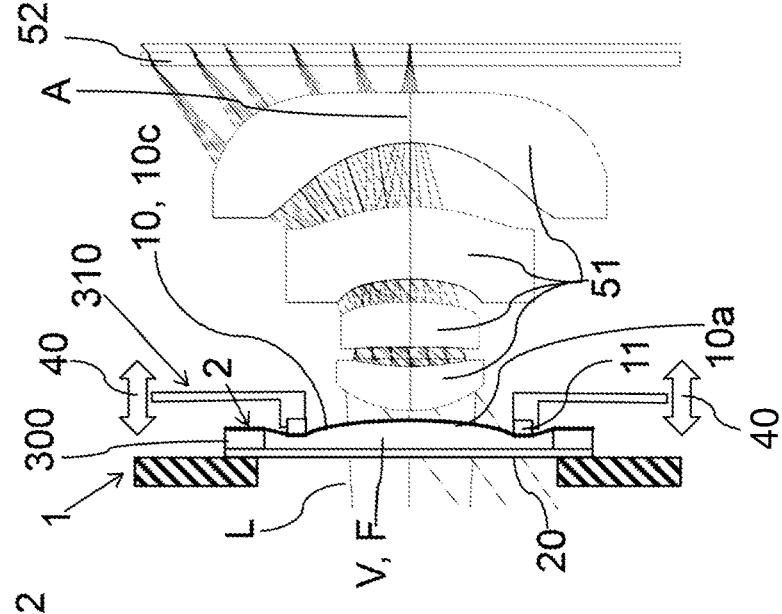
FIG. 46 shows the realization of an autofocus, wherein the lens shaping part is moved in the axial direction with respect to a fixed container to adjust the focus of the focus adjustable lens.

FIG. 46 shows the realization of an autofocus in a configuration with an add-on container 2/focus adjustable lens 2 where the lens shaping part 11 is moved in the axial direction A with respect to a fixed container 2 to adjust the focus of the focus adjustable lens 2.

Figure 47:
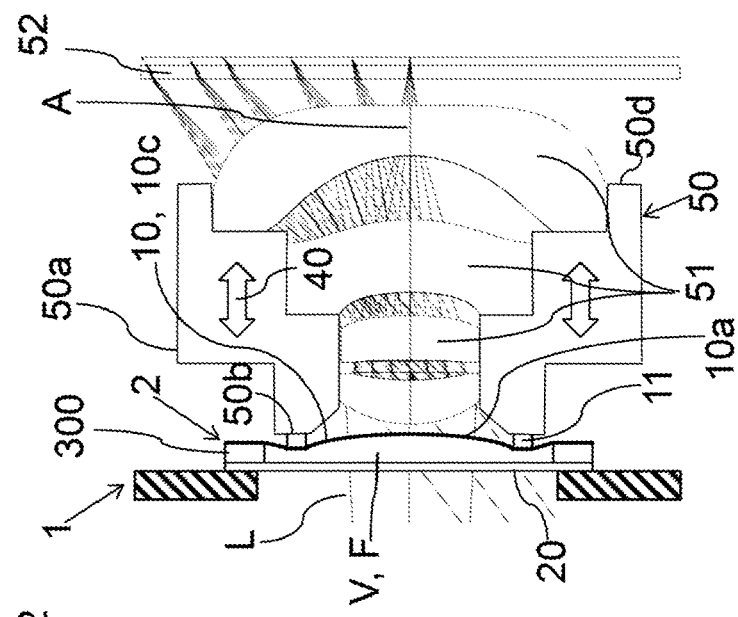
FIG. 47 shows the realization of an autofocus, wherein the lens barrel having the lens shaping part mounted thereon is moved in the axial direction with respect to a fixed container to adjust the focus of the focus adjustable lens.

FIG. 47 shows the realization of an autofocus, wherein the lens shaping part 11 is moved in the axial direction A with respect to the fixed container 2. For this, the lens shaping part 11 is connected to a face side 50b of the lens barrel 50 and the whole lens barrel 50 is moved in the axial direction A in order to adjust the focus of the focus adjustable lens 2.

FIG. 48 shows the realization of optical image stabilization (OIS), wherein here the container 2 that is designed as explained above in conjunction with FIG. 40 is tilted with respect to a fixed lens shaping part 11 that is connected to the face side 50b of the lens barrel 50. This allows to deflect light L travelling towards the image sensor 52.

Alternatively, as shown in FIG. 49, the lens shaping part 11 may be tilted with respect to a fixed container 2 to deflect light travelling towards the image sensor 52 for providing OIS.

According to yet another embodiment (cf. FIG. 50), optical image stabilization (OIS) may be achieved, by moving the container 2, which comprises an optical element 20 in the form of a rigid (e.g. plano-convex) lens, parallel to the image sensor 51 with respect to the lens shaping part 11 to shift light on the image sensor 52.

Further, alternatively, the lens shaping part 11 may be moved parallel to the image sensor 52 with respect to the container (which may comprise an optical element 20 in the form of a rigid (e.g. plano-convex) lens) to shift light on the image sensor 52 (cf. FIG. 51). Here, the front surface 10a of the membrane 10 faces away from the image sensor 52 and the lens shaping part 11 contacts the membrane on a side of the container 2 that faces away from the image sensor 2.

Further, FIG. 52 shows the realization of optical image stabilization (OIS), wherein the container 2 is moved together with the lens barrel 50 parallel to the image sensor 52 to shift light on the image sensor 52;

Alternatively, as shown in FIG. 53, the container 2 together with the lens barrel 50 can be tilted/rotated to shift light on the image sensor 52 for providing OIS.

Furthermore, FIG. 54 shows how a housing 60 and/or actuator coils 41 of the optical device 1 may provide stops that delimit the travel of the container 2 that is suspended via its membrane 10 on the lens shaping part 11, which in turn is connected to the face side 50b of the lens barrel 50, which face side 50b faces the container 2. Also here, the container 2 comprises a circumferential wall member 300, wherein an optical element 20 and a membrane 10 are connected to the wall member 300 such that the container 2 is formed which encloses a volume V that is filled with a fluid F (see also above).

As indicated in FIG. 54, magnets 42 are connected to the wall member 300 wherein each magnet 42 faces a coil 41 being connected to the housing 60. The coils 41 and magnets 42 form part of an actuator 40 that axially moves and or tilts the container 2 that is supported via its membrane 10 on the lens shaping part 11 such that the curvature-adjustable area 10c is defined. The curvature of this area 10c can be adjusted by corresponding axial movements of the container 2 with respect to the lens shaping part 11 (see also above).

Since the container 2 is suspended on the lens shaping part 11, stops for limiting the travel of the container can be used that are defined by the housing 60 and by the coils 41. Particularly, the container 2 can contact the housing 60 via its wall member 300 or the coils 41 via its magnets 42 which stops the movement of the container 2

FIG. 55 shows centering of the container 2 with respect to the lens barrel 50 using a centering tool 500, wherein the container 2 comprises a container centering face 2a that contacts the tool 500 in a form fitting manner when the container 2 is inserted into the tool 500. Further, also the lens barrel 50 can be inserted into the tool 500 from the other side so that the lens shaping part 11 connected to the membrane can contact the face side 50b of the lens barrel 50 in a centered fashion.

This tool 500 or its centering feature can also be an integral part of the lens barrel 50, and will then not be removed after assembly of the optical device.

Advantageously, using a separate centering face 2a instead of a face 10d at which the membrane 10 is cut allows to center the container 2 with a higher precision, since the face 2a cannot be damaged upon cutting of the membrane 10.

Further, FIGS. 56 to 58 demonstrate the reduction of temperature effects on the curvature of the membrane's area 10c when the container 2 is suspended merely via its membrane 10 on the lens shaping part 11 that is connected to the lens barrel 50. This is shown in FIG. 57, where the container 2 can move up (e.g. because its location is force controlled), when the fluid F expands due to an increase of temperature ΔT leading to a relatively small increase in curvature of area 10c in contrast to a situation where the container 2 is fixed in place (e.g. because its location is position controlled, e.g. by Hall sensors) and a thermal expansion of the fluid F due to an increase ΔT in temperature leads to a stronger bulge of area 10c as shown in FIG. 58.

Figure 59:
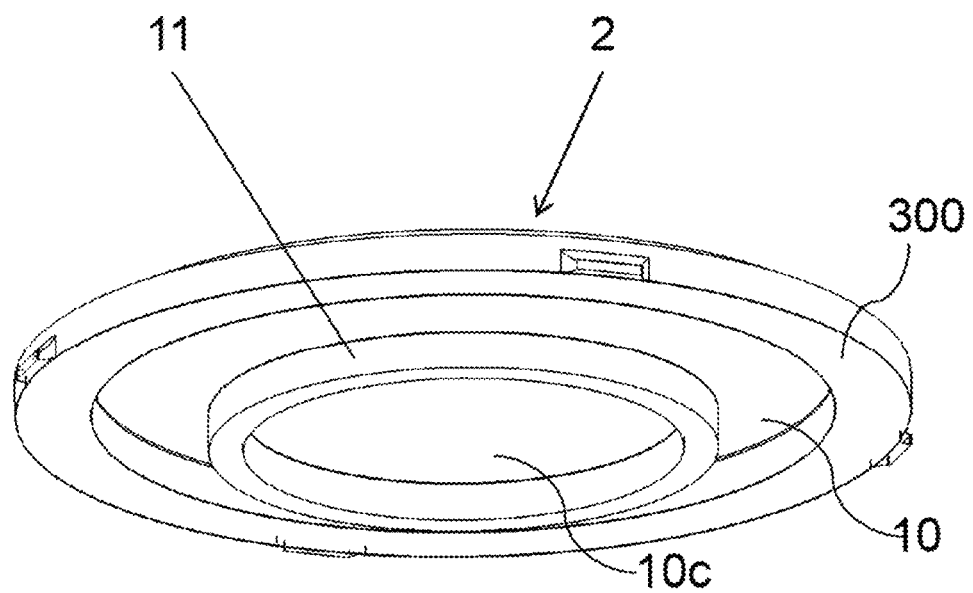
FIG. 59 shows a perspective view of a container of an optical device according to the invention and a circular lens shaping part that contacts the membrane of the container.
Figure 60:
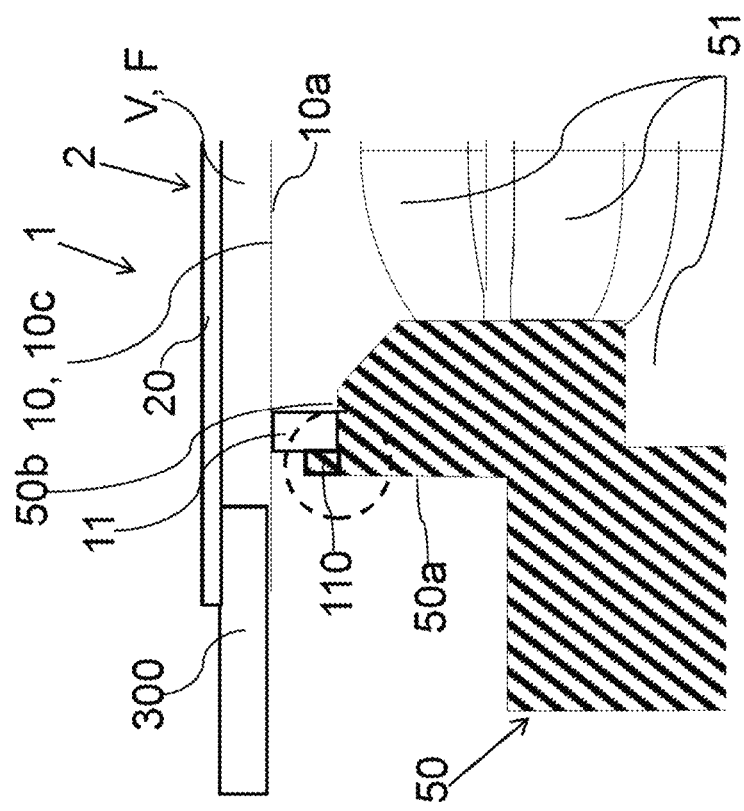
FIGS. 60 to 61 show different possibilities for centering the lens shaping part with respect to the lens barrel.
Figure 61:
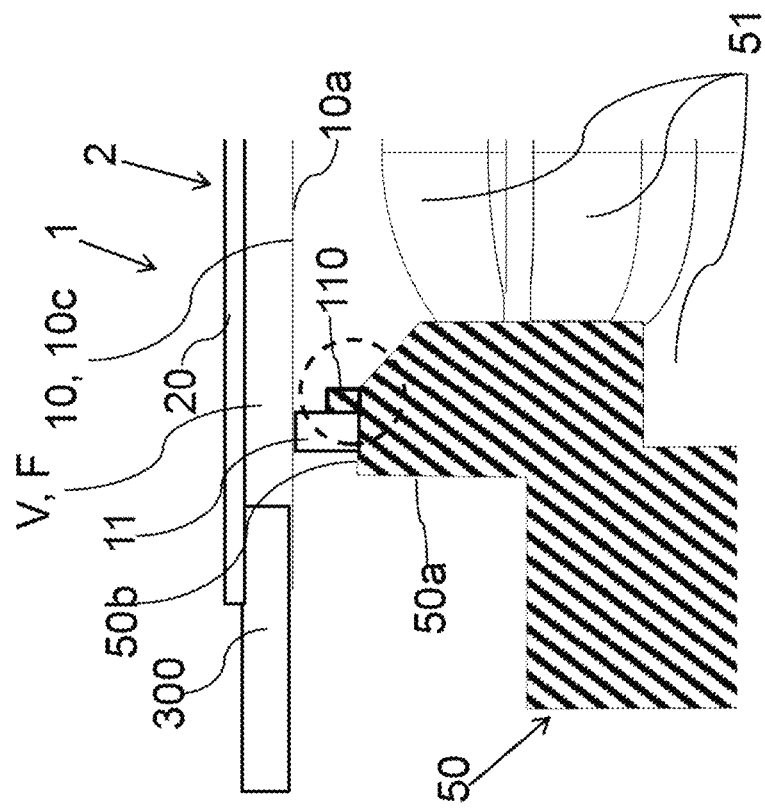

Further, FIG. 59 shows a perspective view of a container 2 of an optical device 1 according to the invention and a circular lens shaping part 11 that contacts the membrane 10 of the container 2 to define the curvature-adjustable area 10c;

Such a lens shaping part 11 can be connected/centered in different ways with respect to the lens barrel, which is shown in FIGS. 60 to 61.

According to FIG. 60, the lens barrel 50 can comprise an (e.g. circular) protrusion 110 protruding from the face side 50b of the lens barrel 50 towards the container 2, which can comprises, as described above, a wall member 300, an optical element 20 and a membrane 10 connected to the wall member 300, respectively, to form said container 2, wherein the container 2 encloses a volume V that is filled with a fluid F (see also above). The protrusion 110 is configured to center the separate lens shaping part 11 that is to be connected to the lens barrel 50 with respect to the lens barrel 50 when the lens shaping part 11 engages with the protrusion 110 in a form fitting manner.

As shown in FIG. 60, according to an embodiment, the lens shaping part 11 is configured to encompass the protrusion 110 when the lens shaping part 11 is engaged with the protrusion 110.

Alternatively, as shown in FIG. 61, the protrusion 110 can also be configured to encompass the lens shaping part 11 when the lens shaping part 11 is engaged with the protrusion 110.

Further, FIGS. 62 to 65 show different possibilities for implementing air exchange channels or tunnels to allow venting of displaced air volumes.

Here, in an embodiment, as shown in FIG. 62, the face side 50b of the lens barrel 50 comprises at least one recess 111 (e.g. three recesses 111) that forms a discontinuity of the protrusion 110 so that air can pass through said recess 111 and below the lens shaping part 11 from an outside of the lens barrel 50 into a region R adjacent said membrane 10 and surrounded by the lens shaping part 11 so that a venting of said region R is possible when the curvature of said curvature adjustable area 10c of the membrane 10 changes (which corresponds to a change of the volume of said region R).

Alternatively, as shown in FIG. 63, the lens barrel 50 may comprise at least one channel 112 (e.g. three channels 112) extending beneath said circular protrusion 110, and particularly beneath said face side 50b of the lens barrel 50, so that air can pass through said at least one channel 112 from an outside of the lens barrel 50 into said region R adjacent said membrane 10 and surrounded by the lens shaping part 11 so that again a venting of said region R is possible, Particularly, here, the protrusion 110 comprises no discontinuities.

Figure 64:
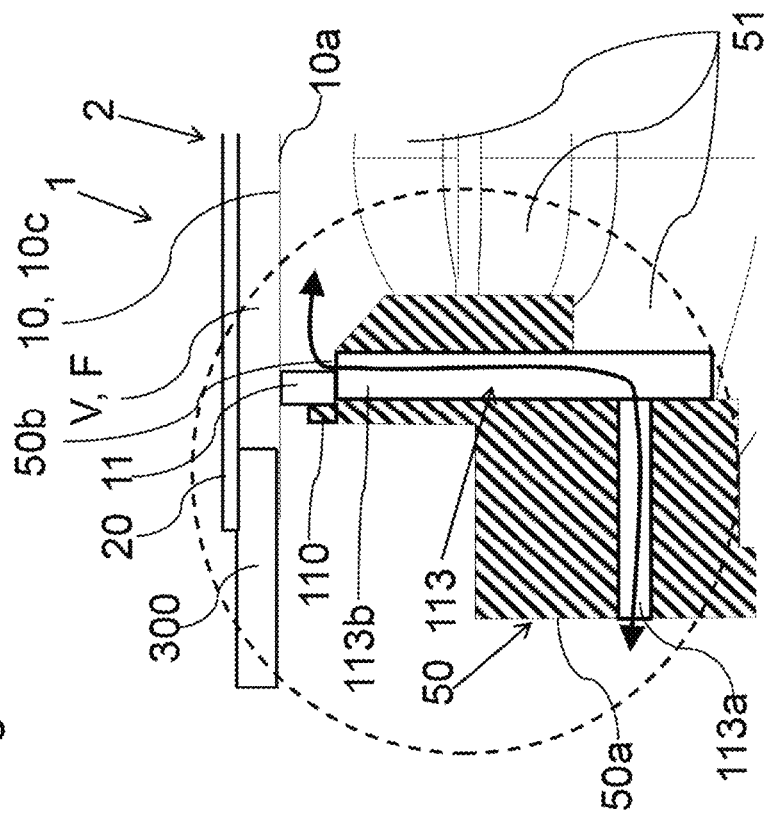

Furthermore, according to FIG. 64, the lens barrel 50 may comprises at least one channel 113, so that air can pass through said at least one channel 113 from an outside of the lens barrel 50 into said region R adjacent said membrane 10 and surrounded by the lens shaping part 11 so that a venting of said region R is possible, see above. Here, said at least one channel extends through the lens barrel wall, i.e. completely below the face side 50b of the lens barrel.

Figure 65:
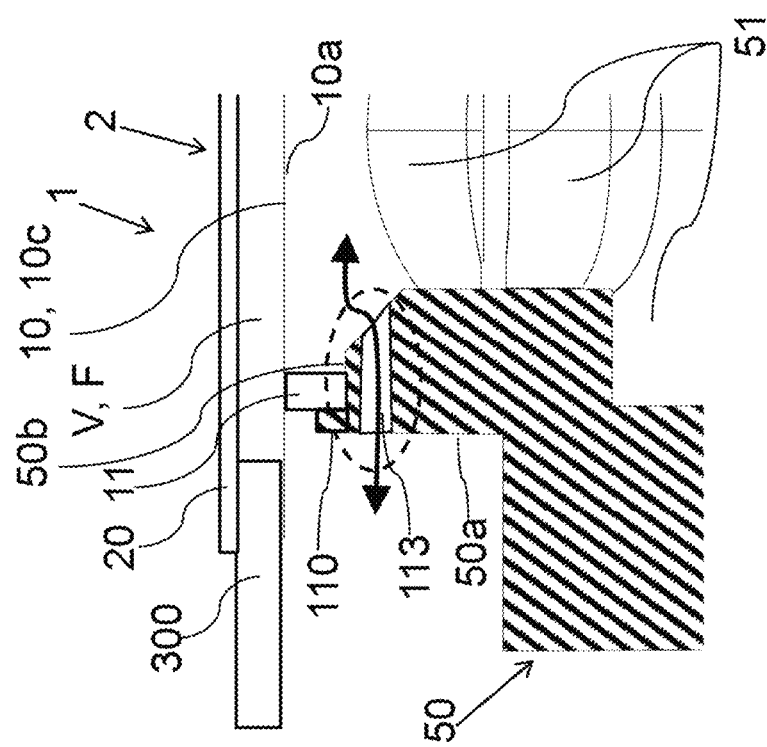

Particularly, as shown in FIG. 65 said at least one channel 113 may also comprises a first section 113a extending from a lateral outside 50a of the lens barrel 50 in a radial direction of the lens barrel 50 (i.e. perpendicular to the optical axis of the lens barrel 50) into the lens barrel 50, and a second section 113b which is in fluid communication with the first section 113a and extends parallel to the optical axis of the lens barrel (50) and leads to the face side 50b of the lens barrel 50 into said region R, so that also here a venting of this region R is possible.

Furthermore, FIGS. 66 to 70 show different possibilities for connecting the centered lens shaping part 11 to the lens barrel 50 by means of glue 116, 118.

Figure 66:
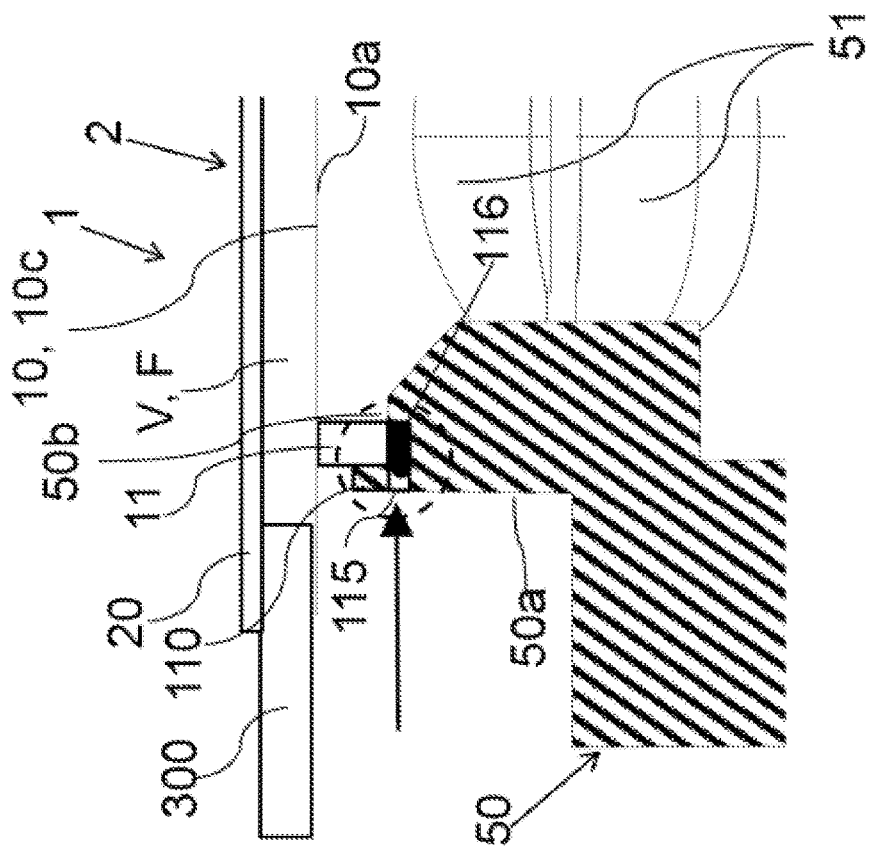

According to FIG. 66 the lens barrel 50 comprises at least one glue pocket 115 on the face side 50b of the lens barrel 50 for receiving said glue 116, wherein the at least one glue pocket 115 is arranged beneath the lens shaping part 11.

Furthermore, the at least one glue pocket 115 extends further outward in the radial direction of the lens barrel 50 than the protrusion 110. Particularly, in this way, the at least one glue pocket 115 is accessible for applying glue 116 to the at least one glue pocket 115 from a lateral outside 50a of the lens barrel 50 as indicated by the solid arrow.

Figure 67:
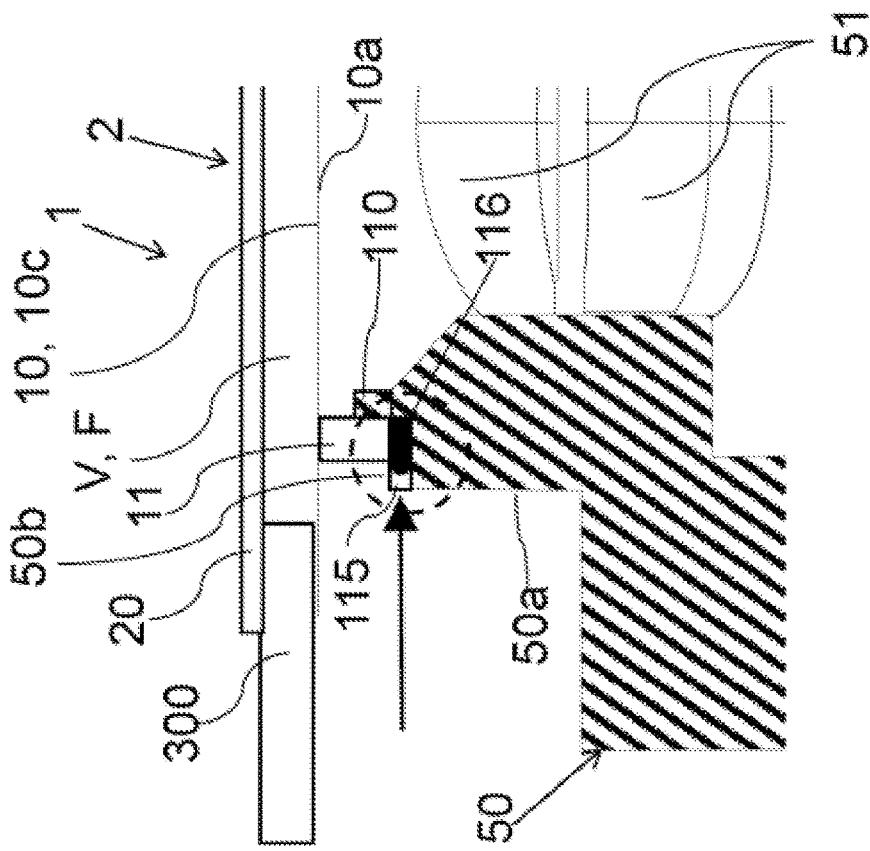

Alternatively, as shown in FIG. 67, the at least one glue pocket 115 extends further inward in the radial direction of the lens barrel 50 than the protrusion 110. Here, the at least one glue pocket 115 can extend beneath the protrusion 110. and particularly lead to a lateral outside 50a of the lens barrel 50 so that the at least one glue pocket 115 is accessible from said lateral outside 50a for applying said glue 116 to the at least one glue pocket 115, as indicated by the solid arrow.

Furthermore, as shown in FIG. 68, the at least one glue pocket 115 may comprise an elongated curved shape and may particularly extend along the protrusion 110 along an inside of the protrusion 110, i.e. further inward in the radial direction of the lens barrel 50/protrusion 110 than the protrusion 110.

Further, as shown in FIG. 69, the lens barrel 50 may comprises at least one through hole 117 (e.g. formed in a circumferential wall of the lens barrel 50), which through hole 117 extends along the optical axis of the lens barrel 50 and leads to the at least one glue pocket 115 (e.g. is in fluid communication with the glue pocket 115) so that the glue 116 can be applied to the at least one glue pocket 115 via said through hole 117, as indicated by the solid arrow.

Alternatively, instead of a liquid glue 116 also a double-faced adhesive tape 118 can be used to connect the lens shaping part 11 to the face side 50b of the lens barrel 50 as shown in FIG. 70. Here, the tape 118 can be arranged on the face side 50b of the lens barrel 50 between the face side 50b of the lens barrel 50 and the lens shaping part 11, wherein particularly the tape 118 can be surrounded by the (e.g. circular) protrusion 110 which extends further outward in the radial direction of the lens barrel 50 than the tape 118.

Furthermore, FIGS. 71 to 73 show different embodiments of lens shaping parts 11.

According to FIG. 71, the lens shaping part 11 can be a separate part 11 that is glued (see above) to the face side 50b of the lens barrel 50. Alternatively, the lens shaping part 11 can be a mold insert 11 that is molded to the lens barrel upon injection molding of the barrel 50, wherein the insert 11 is then embedded into a recess 50e in the face side 50b of the lens barrel 50.

Furthermore, the lens shaping part 11 can also be integrally connected to the lens barrel 50 as shown in FIG. 73.

FIG. 74 shows an embodiment of an optical device 1 according to the invention of the kind shown in FIG. 44(C), wherein the container 2 is embedded into the lens barrel 50 and also forms a topmost rigid lens of the lens barrel 50.

Particularly, the optical device 1 comprises a lens barrel 50 having a central opening 50c in which a plurality of lenses 51 is arranged. The lens barrel is received in an opening 66 of a housing 60 so that the barrel 50 is arranged in front of an image sensor 52 of the optical device 1, which image sensor 52 is arranged in the housing 60. The topmost lens of the barrel 50 is formed by the container 2, which comprises an optical element 20 in the form of a plano-convex lens (or any other combination of surface shapes including strongly aspherical surfaces) that forms an integral lateral wall member 300 to which the membrane 10 is connected such that the container 2 encloses a volume V in which said fluid F is arranged. The transparent container 2 is arranged in front of the remaining lenses 51 as well as in front of the image sensor 52 so that light L can pass the container 2 and said lenses 51 before impinging onto the image sensor 52.

In order to adjust the focal power of the focus adjustable lens 2 formed by the container 2 and the fluid F therein, a lens shaping part 11 contacts the membrane 10 and defines a curvature adjustable area 10c of the membrane as described herein, the lens shaping part 11 comprises a ring shape and is connected to a lens shaping part carrier 310 that will be described in more detail below. The carrier 310 comprises legs 311 connected to the lens shaping part, which extend out of the barrel 50 through slots 53 formed in the barrel (see below), which legs 311 connect to magnets 42 which are arranged outside the barrel 50 and each interact with an associated coil 41. These coils 41 are arranged on the housing 60 and can attract/repel the associated magnet 42 depending on the direction of the current in the respective coil 41. Particularly each magnet 42 may face its associated coil 41 in a centered fashion as explained in detail e.g. in conjunction with FIG. 31

Figure 75:
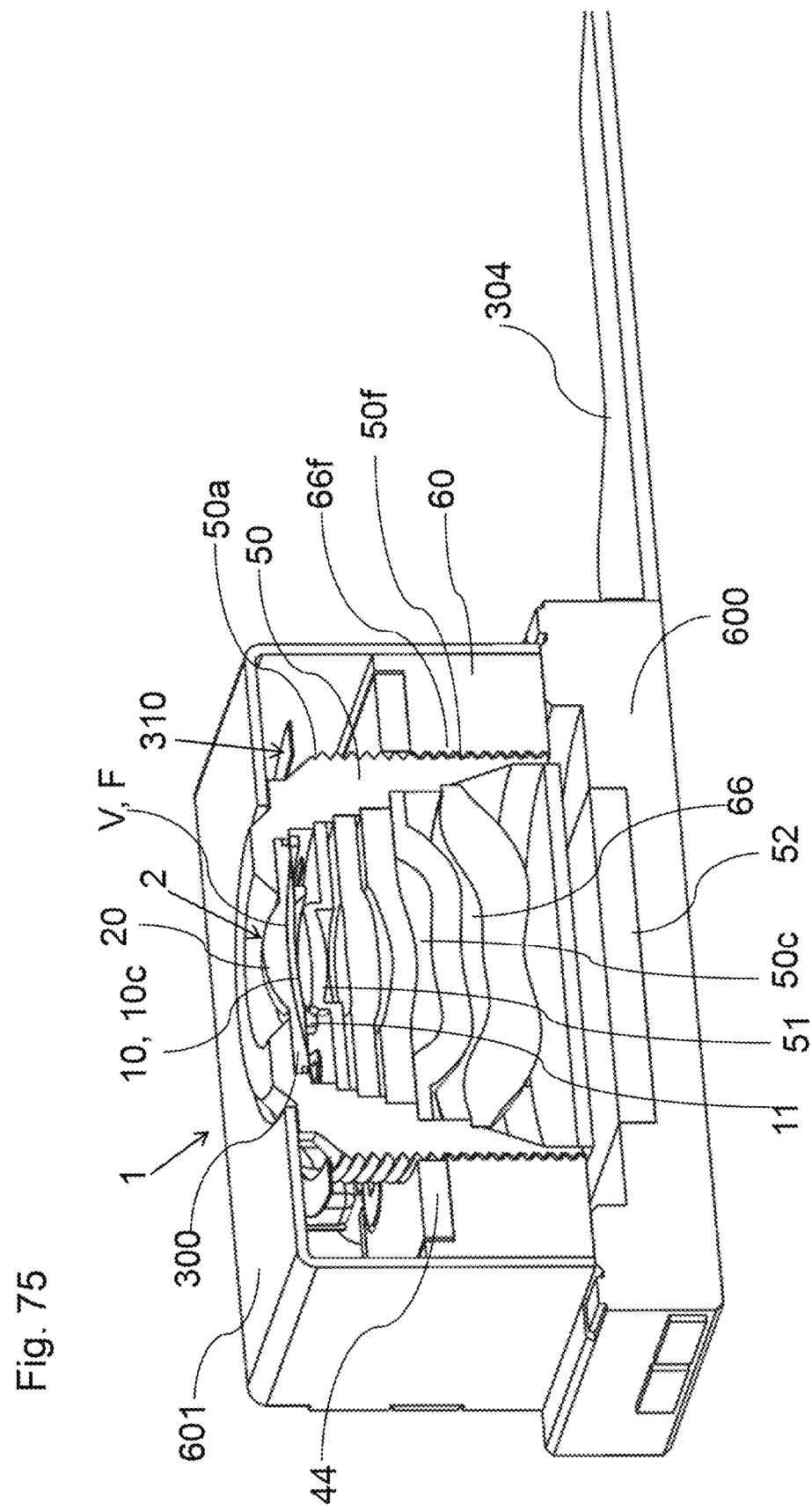
FIG. 75 shows an optical device of the kind shown in FIG. 74, wherein the lens barrel comprises an external thread for positioning the lens barrel with respect to the image sensor.

According to FIG. 75 the lens barrel 50 can comprises an external thread 50f that engages with an internal thread 66f of said recess 66 of the housing 60 which allows a precise positioning of the lens barrel with respect to the image sensor 52.

As further indicated in FIG. 75, the housing 60 may rest on a substrate 600 carrying the image sensor 52. Furthermore, electrical contact to components of the optical device 1 can be made via a flexible conductor 304 connecting to the substrate 600/housing 60. Furthermore, the housing or barrel 50 can be covered by a shield 601 that comprises a central opening aligned with the container 2. The shield 601 serves for protecting the optical device 1 against external disturbances such as electromagnetic radiation.

Figure 76:
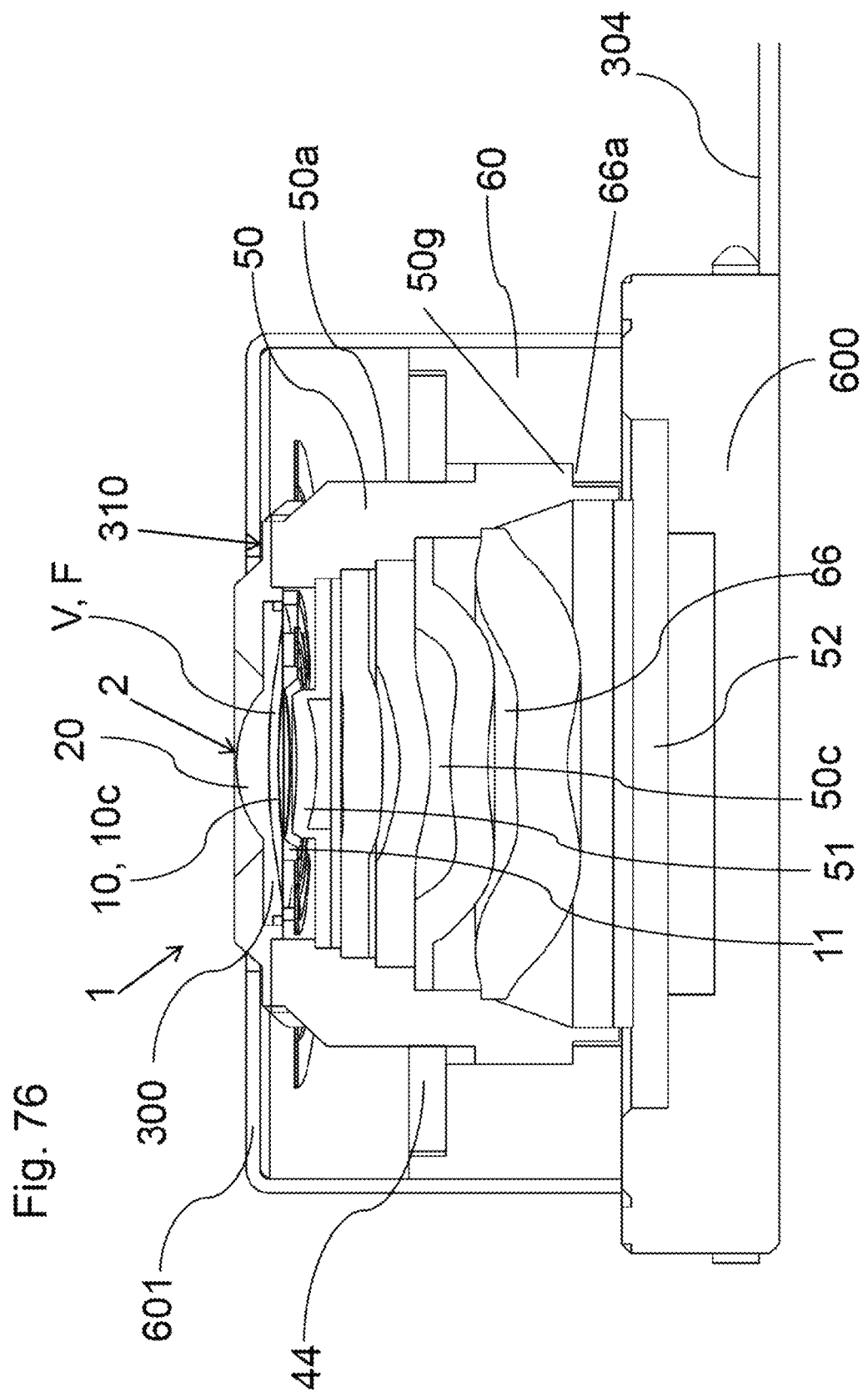
FIG. 76 shows an optical device of the kind shown in FIG. 74, wherein the housing comprises a stop for positioning the lens barrel with respect to the image sensor.

Further, as shown in FIG. 76 the housing 60 may further provide a stop in form of a circumferential step 66a of the recess 60 for positioning the lens barrel 50 with respect to the image sensor 52. Here, a circumferential surface region 50g of the barrel 50 can butt against said stop 66a to define a precise position/distance of the lens barrel 50 with respect to the image sensor 52.

Figure 77:
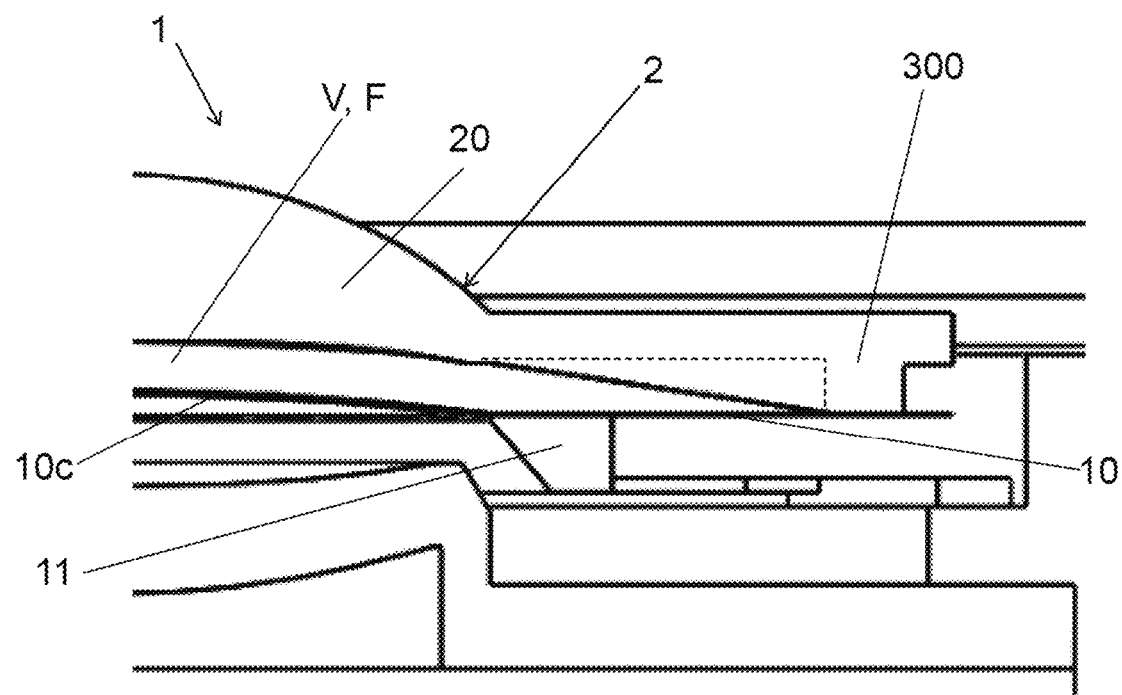
FIG. 77 shows a tapered volume of the container for reducing temperature effects.

Furthermore, as shown in FIG. 77, the volume V of the container 2 tapers in a radial direction of the container 2 towards the periphery of the volume V/container 2 for reducing the amount of optical fluid F in the container 2 and thus for reducing the changes in optical performance due to temperature changes. Particularly, for this, the container may have a conically shaped periphery (e.g. instead of a flat periphery indicated by the dashed lines in FIG. 77). Particularly, the wall member 300 and the optical element 20 can be formed in one piece, i.e., can be integrally connected to one another, instead of being separate elements that are joined together.

Particularly, the lens shaping part carrier 310 already mentioned above, can be formed as shown in FIGS. 78 to 79. According thereto, the lens shaping part 11 is connected to the lens shaping part carrier 310 for carrying the lens shaping part 11, wherein the lens shaping part carrier 310 comprises legs 311 connected to the lens shaping part 11, wherein the legs 311 are particularly integrally connected to the lens shaping part 11 and each extend from the lens shaping part 11 outward (e.g. in a radial fashion) through an associated slot 53 formed in the lens barrel 50.

Figure 79:
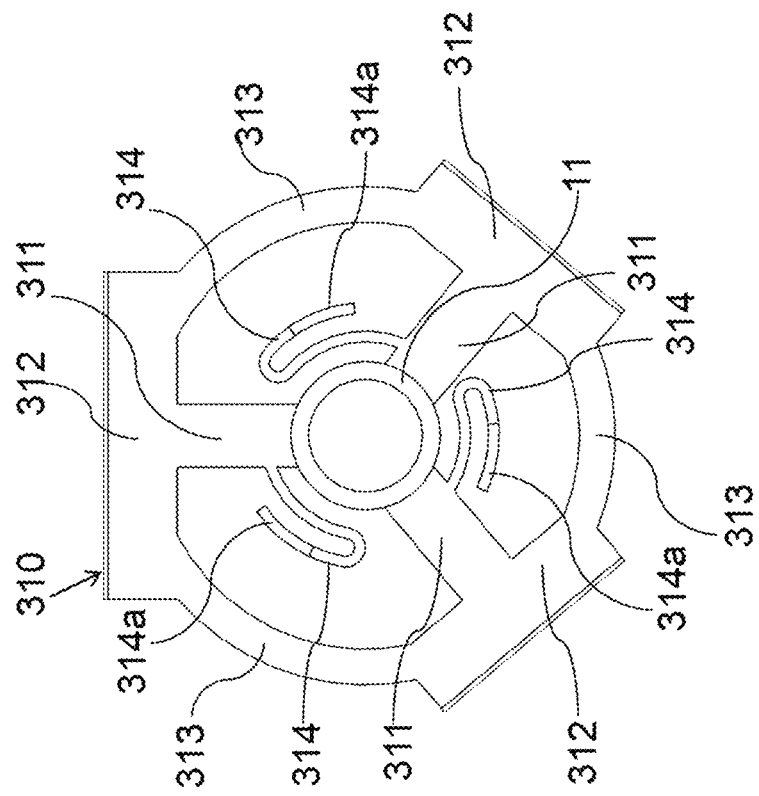
FIGS. 78 to 79 show an embodiment of a lens shaping part carrier carrying a lens shaping part, which carrier is inserted into slots of a lens barrel.
Figure 78:
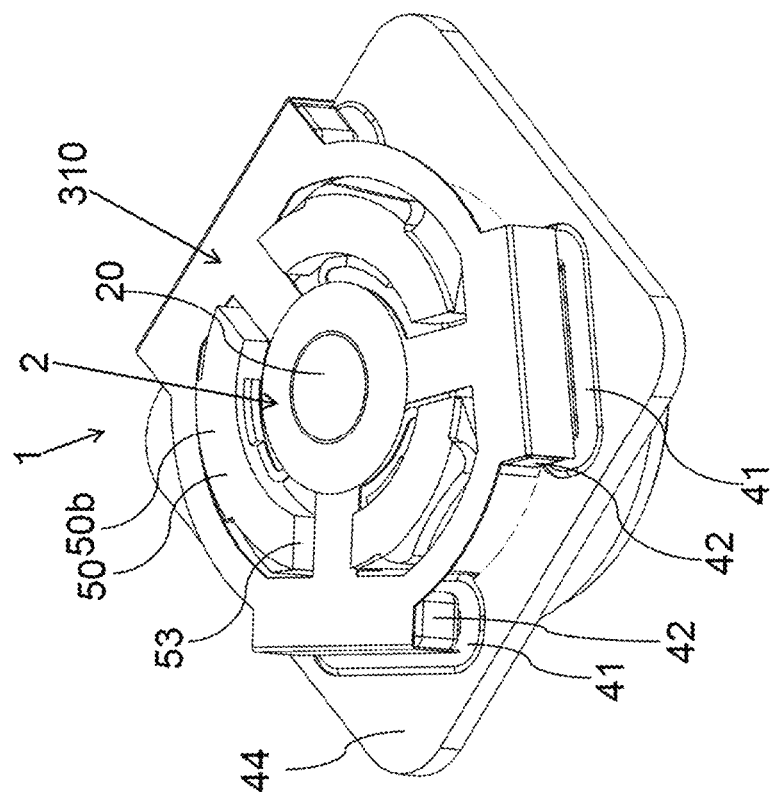

For moving the lens shaping part 11 in the axial direction A and/or for tilting the lens shaping part 11 (see also above) the respective leg 311 is connected to an associated holding member 312 for holding a magnet 42 of the actuator means/actuator 40, wherein the respective holding member 312 is arranged outside the lens barrel 50. As indicated in FIGS. 78 and 79, the magnets 42 particularly connect to sides of the holding members 312 that face the coils 41 which are arranged on the housing 60, particularly on a coil support 44. The magnets 42 are arranged such that each magnet 42 faces its associated coil 41 as e.g. described in detail above.

Further, each two neighboring holding members 312 can be connected by a connecting member 313, wherein particularly the respective connecting member 313 integrally connects the respective neighboring holding members 312 to one another. The respective connecting member 313 also extends outside the lens barrel 50 along the lateral outside 50a of the lens barrel 50, wherein said connecting members 313 form an annular structure together with the holding members 312.

Furthermore, for providing restoring forces and for centering the lens shaping part carrier 310/lens shaping part 11 with respect to the lens barrel 50, the carrier 310 comprises spring members 314, wherein the respective spring member 314 is (e.g. integrally) connected to an associated leg 311 of the lens shaping part carrier 310. Particularly, the spring members 314 provide a restoring force on the lens shaping part carrier 310 when the latter is moved by means of the actuator 40, 41, 42 as described herein.

Figure 80:
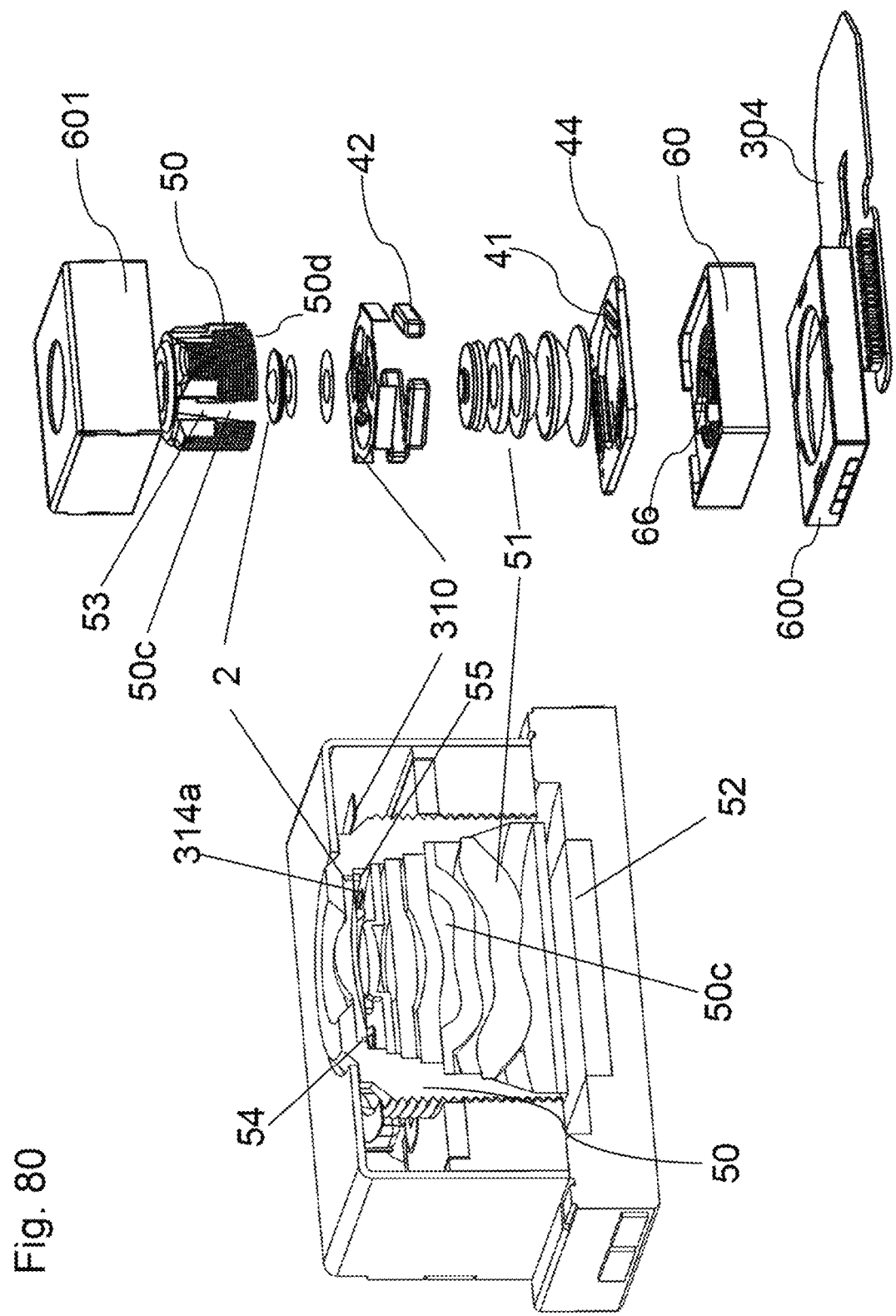

Furthermore, FIGS. 80 to 82 show different ways of centering and assembling components of the optical device, particularly the lens shaping part carrier/lens shaping part 11 and the container 2 with respect to the lens barrel.

As shown in FIG. 80, the respective slot 53 can also be formed into a bottom 50d of the lens barrel 50, which bottom 50d faces away from the container 2, wherein particularly the respective slot 53 extends along the optical axis of the lens barrel 50.

Here, particularly, the container 2 is inserted from the bottom 50d into the opening 50c of the lens barrel 50 and is centered by a circumferential surface region 54 of an inside of the lens barrel 50, wherein the container 2 engages in a form fitting manner with said surface region 54.

Also the lens shaping part carrier 310 together with the lens shaping part 11 is inserted from the bottom 50d into the opening 50c of the lens barrel 50 following the container 2 so that particularly the lens shaping part 11 contacts said membrane 10, wherein each spring member 314 is arranged with an end section 314a on an associated surface area 55 of an inside of the lens barrel 50 so as to center the lens shaping part 11 with respect to the lens barrel 50/container 2, and wherein the respective leg 311 is arranged in its associated slot 53.

Alternatively, as shown in FIG. 81 (cf. also FIGS. 78 and 79) the respective slot 53 of the barrel 50 can also be formed into a face side 50b of the lens barrel 50, which face side 50b faces away from an image sensor 52 of the optical device 1, wherein particularly the respective slot 53 also extends along the optical axis of the lens barrel 50.

Here, the container 2 is inserted together with the lens shaping part 11 and the lens shaping part carrier 310 into a separate lens barrel top part 58 to form a sub assembly that is inserted into the lens barrel 50 from the face side 50b so that the container 2 and the lens shaping part 11 are centered with respect to the lens barrel 50 and the respective leg 311 is arranged in its associated slot 53.

Further, particularly, the container 2 engages in a form fitting manner with an associated circumferential surface region 58a of an inside of the lens barrel top part 58, and also each spring member 314 is particularly arranged with an end section 314a on an associated surface area 58b of the lens barrel top part 58. The lens barrel top part 58 then engages in a form fitting manner with a further circumferential surface region 58c with a circumferential inside region 50h of the lens barrel 50 adjacent the face side 50b of the lens barrel 50 so that the container 2 and the lens shaping part 11 are centered with respect to the lens barrel 50.

Alternatively, as shown in FIG. 82 the lens shaping part carrier 310 together with the lens shaping part 11 can be inserted from the face side 50b of the lens barrel 50 into the opening 50c of the lens barrel 50, wherein the legs 311 are arranged in slots 53 formed into the face side 50b of the barrel 50, and wherein each spring member 314 is arranged with an end section 314a on an associated surface area 56 of an inside of the lens barrel 50 so as to center the lens shaping part 11 with respect to the lens barrel 50/container 2.

The container 2 is then inserted from the face side 50b into the opening 50c of the lens barrel (50) on top of the lens shaping part carrier 310 and is centered by a circumferential surface region 57 of an inside of the lens barrel 50, wherein the container 2 engages in a form fitting manner with said surface region 57.

Figure 94:
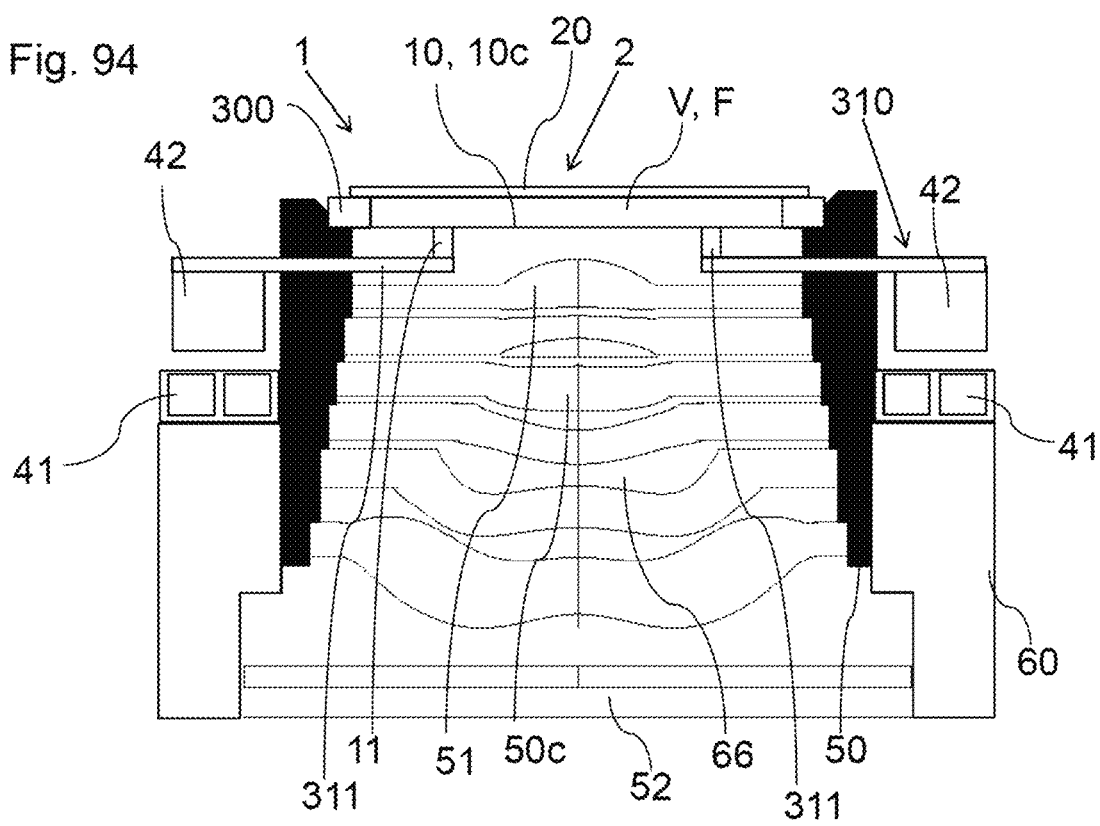
FIG. 94 shows an embodiment using an actuation principle as shown in FIG. 74, wherein here the container/focus adjustable lens particularly is an add-on that can be placed in front of lens barrel (e.g. from the face side of the barrel), wherein the container can be at least partially inserted into the lens barrel from the face side of the lens barrel.

Further, as an alternative to the embodiment shown in FIG. 74, FIG. 94 shows that the lens container 2 can be actuated as described in conjunction with FIG. 74, but is an add-on lens 2 instead of an embedded container/lens 2. Here, the container 2 particularly has a flat optical element 20. Particularly, also here, the wall member 300 can be integrally connected to the optical element 20 (see also above FIG. 77).

Particularly, also here, the optical device 1 comprises a lens barrel 50 having a central opening 50c in which a plurality of lenses 51 is arranged. The lens barrel 51 is received in an opening 66 of a housing 60 so that the barrel 50 is arranged in front of an image sensor 52 of the optical device 1, which image sensor 52 is arranged in the housing 60. The topmost lens of the barrel 50 is not formed by the container 2, which is here placed in front of the barrel 50 or partially inserted into the opening 50c of the barrel, but by a rigid lens 51. The container 2 comprises a flat optical element 20 that is connected (e.g. integrally) to a lateral wall member 300 to which the membrane 10 is connected such that the container 2 encloses a volume V in which said fluid F is arranged. The transparent container 2 is arranged in front of the rigid lenses 51 as well as in front of the image sensor 52 so that light L can pass the container 2 and said lenses 51 before impinging onto the image sensor 52.

In order to adjust the focal power of the focus adjustable lens 2 formed by the container 2 and the fluid F therein, a lens shaping part 11 contacts the membrane 10 and defines a curvature adjustable area 10c of the membrane 10 as described herein. Particularly, the lens shaping part 11 comprises a ring shape and is connected to a lens shaping part carrier 310 that can be designed as described herein. Particularly, the carrier 310 comprises legs 311 connected to the lens shaping part 11, which legs 311 extend out of the barrel 50 through slots 53 formed in the barrel (see also above), which legs 311 connect to magnets 42 which are arranged outside the barrel 50 and each interact with an associated coil 41. These coils 41 are arranged on the housing 60 and can attract/repel the associated magnet 42 depending on the direction of the current in the respective coil 41. Particularly each magnet 42 may face its associated coil 41 in a centered fashion as explained in detail e.g. in conjunction with FIG. 31.

Figure 84:
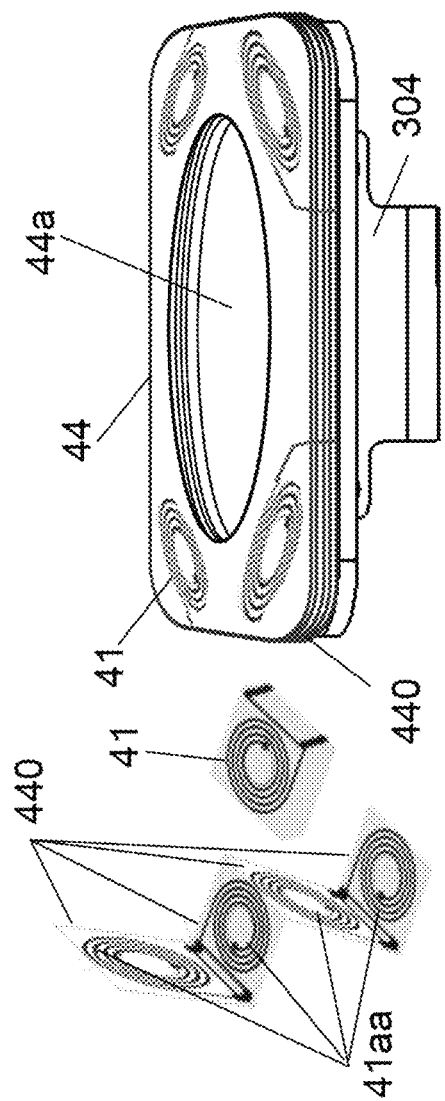
FIGS. 83 to 84 show different embodiments of coils of an actuator that can be used to move the container or lens shaping part.
Figure 83:
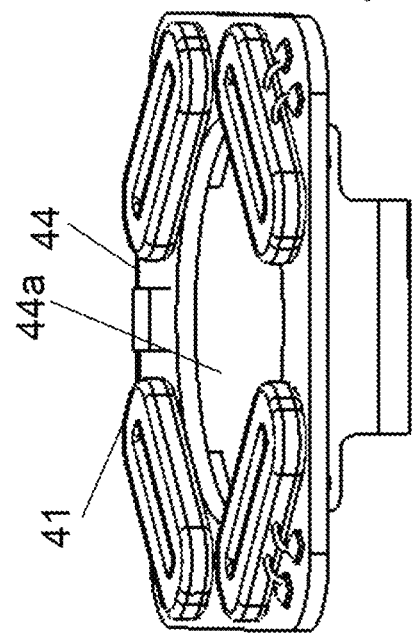

Furthermore, according to FIGS. 83 to 84 air coils 41 (cf. FIG. 83) as well as planar coils 41aa can be used to form the coils 41 of the actuator 40 that interact e.g. with associated magnets 42.

Particularly, as shown FIG. 84, the coil support 44 may comprise a plurality of (e.g. flexible) sheets 440 that are folded on one another so that the coil support 44 comprises a stack of said sheets 440, wherein each sheet comprises a plurality of planar coils 41aa so that said stack of sheets 440 forms said plurality of electrically conducting coils 41.

Figure 85:
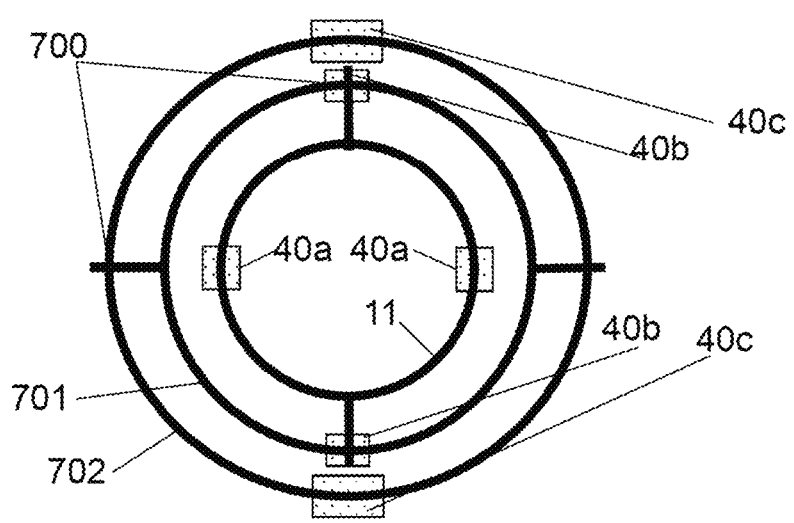
FIG. 85 shows how separate actuators (e.g. voice coil motors) can be used for autofocus (AF) and optical image stabilization (OIS) using gimbal bearings and gimbal rings.

FIG. 85 shows how separate actuators (e.g. voice coil motors) can be used for autofocus (AF) and optical image stabilization (OIS) using gimbal bearings and gimbal rings;

According to FIGS. 83 and 84 (cf. also FIGS. 90 to 91) four coil and magnet pairs (or also three coil and magnet pairs) can be used as an actuator means/actuator 40 for axially moving e.g. the lens shaping part 11 or the optical element 20/container 2 (e.g. for providing AF) and also for tilting the lens shaping part 11 or optical element 20/container 2 for providing OIS (e.g. at the same time/superimposed). In case only an axial movement shall be performed, a single coil magnet pair can be used (e.g. FIG. 92).

However, actuators 40a, 40b, 40c may also be used for autofocus (AF) and optical image stabilization (OIS) as indicated in FIG. 85. Here, generally, OIS is achieved using actuators 40a, and 40b which can tilt the lens shaping part 11 in two directions due to the fact that actuators 40a tilt the lens shaping part 11 in a first direction, wherein actuators 40b tilt the gimbal ring 701 together with part 11 in an independent (e.g. perpendicular) second direction, Outer gimbal ring can be axially moved together with ring 701 and part 11 to provide AF. This concept can be applied to all embodiments.

Furthermore, FIGS. 86 to 89 show different actuators for axial movement of the container 2, which again comprises an optical element 20 and a membrane 10 connected to a lateral wall member 300 such that a volume V is formed that is filled with a fluid F. Here front surface 10a of the membrane 10 faces the image sensor 52 and the lens shaping part 11 is fixed (e.g. to a lens barrel 50) so that the container is moved with respect to the lens shaping part 11 in order to adjust the focal power of the container 2/focus adjustable lens 2.

Figure 86:
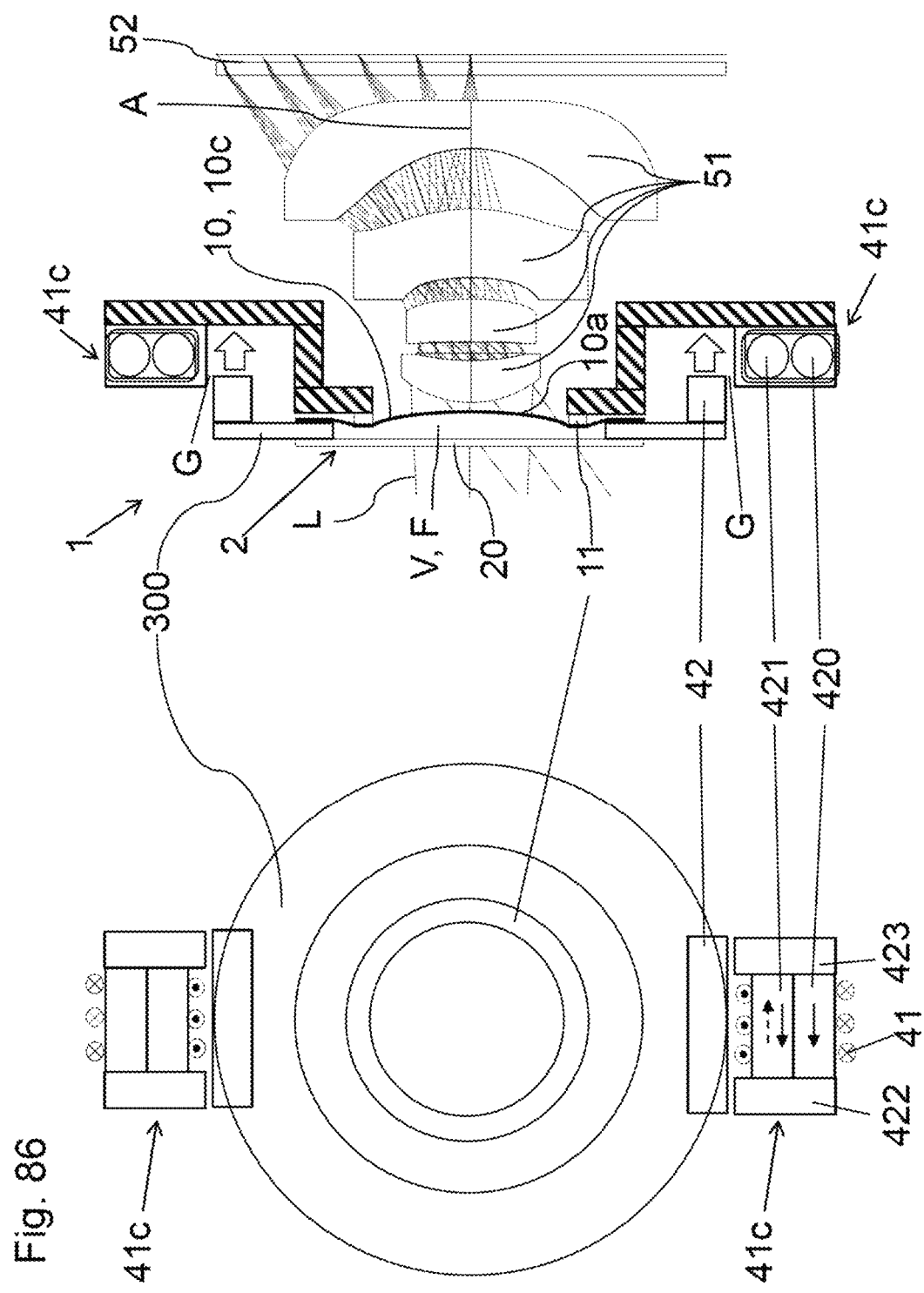
FIG. 86 shows an embodiment of the optical device, wherein the container is moved using electropermanent magnets.

According to FIG. 86 the actuator means 40 comprises a plurality of electropermanent magnets 41c arranged on the housing 60, here particularly two electropermanent magnets 41c, and a corresponding number of soft magnetic members 42 connected to the container (2), particularly to the wall member 300, wherein each soft magnetic member 42 is associated to exactly one of the electropermanent magnets 41c. Further, each soft magnetic member 42 is arranged adjacent its associated electropermanent magnet 41c such that a gap G is formed between the respective soft magnetic member 42 and its associated electropermanent magnet 41c, wherein for moving the container 2 in said axial direction A the respective electropermanent magnet 41c is configured to attract its associated soft magnetic member 42 (e.g. by means of a reluctance force that minimizes the respective gap G) when a corresponding voltage pulse is applied to the respective electropermanent magnet 41c that generates an external magnetic field of the respective electropermanent magnet 41c that causes said attraction.

In detail, the respective electropermanent magnet 41c comprises a first magnet 420 having a first coercivity and a second magnet 421 having a second coercivity being smaller than the first coercivity, and wherein an electrically conducting conductor is wound around the second magnet 421 to form a coil 41 enclosing at least the second magnet 421, so that when a voltage pulse is applied to the coil 41 so as to switch the magnetization of the second magnet 421 an external magnetic field/magnetic flux of the respective electropermanent magnet 41c is generated that causes said attraction/respective reluctance force describe above.

Particularly, the two magnets 420, 421 of the respective electropermanent magnet 41c are arranged between two pole pieces 422, 423 which form the respective gap G with the associated soft magnetic member 42 and guide magnetic flux.

Furthermore, particularly, the magnetizations of the two magnets 420, 421 are oriented parallel to said plane along which the lens shaping part 11 extends.

As further shown in FIG. 86, the respective soft magnetic member 42 is particularly arranged offset perpendicular to the axial direction A with respect to the associated electropermanent magnet 41c, wherein particularly the respective electropermanent magnet 41c extends further outward in the radial direction of the lens barrel 50 than the associated soft magnetic member 42.

Figure 87:
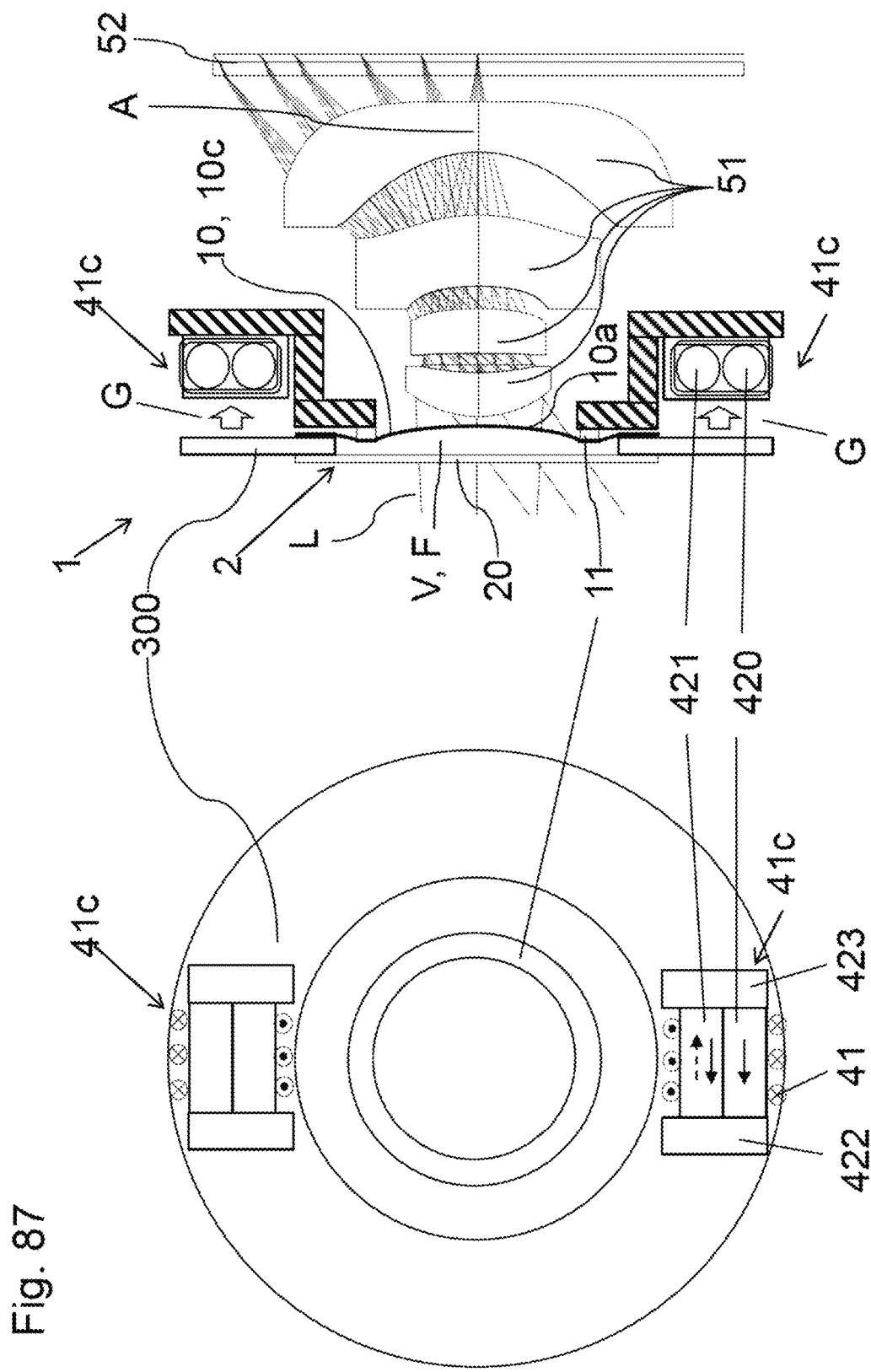
FIG. 87 shows a modification of the embodiment shown in FIG. 86

Furthermore, FIG. 87 shows an alternative embodiment, wherein the actuator means/actuator 40 comprises a plurality of electropermanent magnets 41c arranged on the housing 60, here particularly two electropermanent magnets 41c, and a single soft magnetic member formed by the annular wall member 300, wherein each electropermanent magnet 41c know faces the wall member 300 in the axial direction A such that a gap G is formed between the wall member 300 and the respective electropermanent magnet 41c. For moving the container 2 in said axial direction A the respective electropermanent magnet 41c is configured to attract said wall member 300 (e.g. by means of a reluctance force that minimizes the respective gap G) when a corresponding voltage pulse is applied to the respective electropermanent magnet 41c that generates an external magnetic field of the respective electropermanent magnet 41c that causes said attraction.

Figure 88:
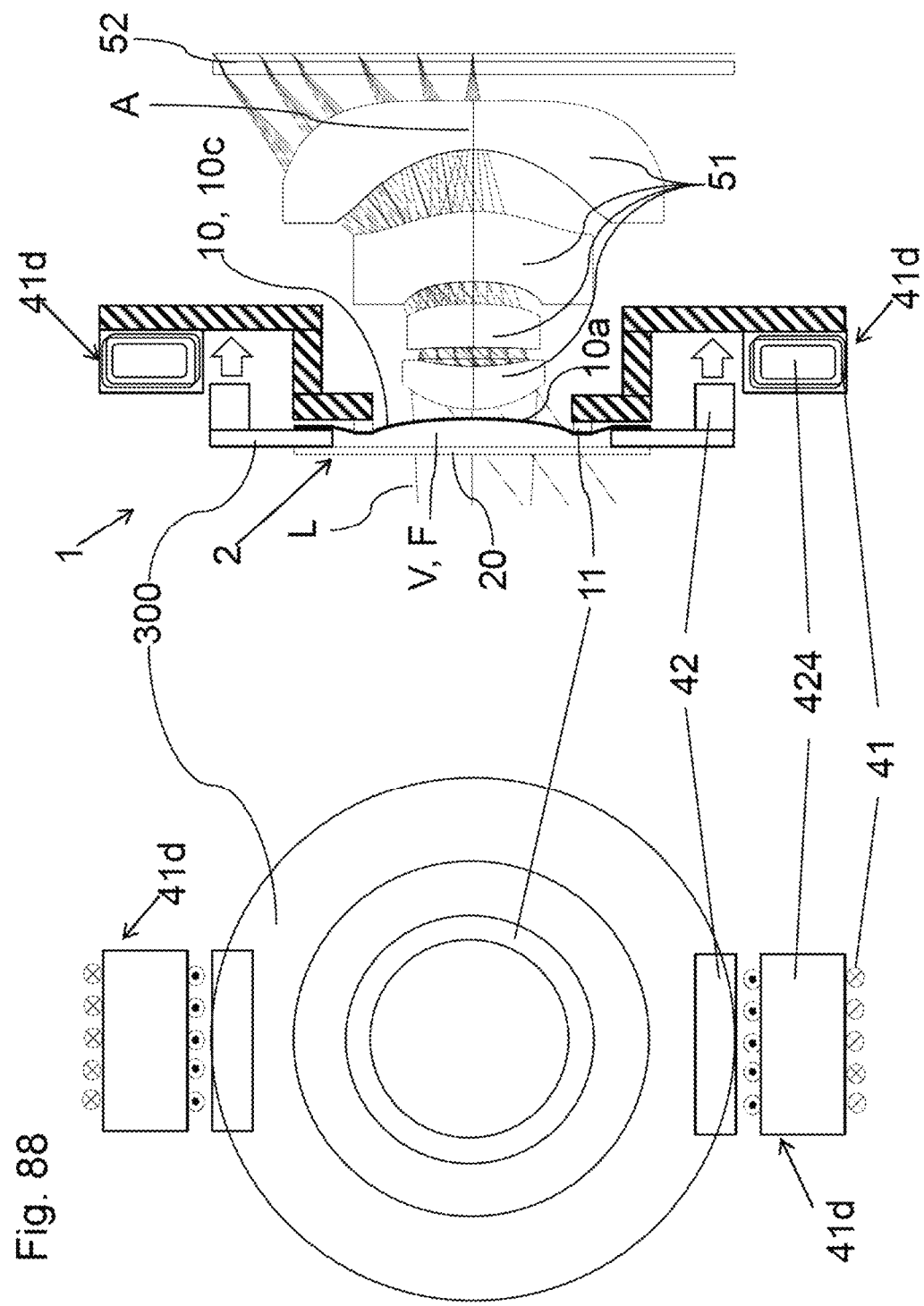
FIG. 88 shows an embodiment of the optical device, wherein the container is moved using electromagnets.

FIG. 88 shows a further embodiment, wherein here the actuator means 40 comprises a plurality of electromagnets 41d arranged on the housing 60, particularly two electromagnets 41d, and a corresponding number of soft magnetic members or magnets 42 connected to the container 2, particularly to the wall member 300, wherein each soft magnetic member or magnet 42 is associated to exactly one of the electromagnets 41d, wherein each soft magnetic member or magnet 42 is arranged adjacent its associated electromagnet 41d, wherein for moving the container 2 in said axial direction A the respective electromagnet 41d is configured to attract its associated soft magnetic member or magnet 42 (e.g. by means of a magnetic force) when a corresponding current is applied to the respective electromagnet (41d) that generates an external magnetic field of the respective electromagnet 41d that causes said attraction.

Further, as shown in FIG. 88, the respective electromagnet 41d may comprises a magnetic core 424, wherein an electrically conducting conductor is wound around the magnetic core 424 about a winding axis to form a coil 41 enclosing the magnetic core 424, so that when a current is applied to the coil 41 an external magnetic field/magnetic flux of the respective electromagnet 41d is generated that causes said attraction. As indicated in FIG. 88, the respective winding axis is oriented parallel to said plane along which the lens shaping part extends 11, and the respective soft magnetic member or magnet 42 is arranged offset perpendicular to the axial direction A with respect to the associated electromagnet 41d, wherein particularly the respective electromagnet 41d extends further outward in the radial direction of the lens barrel 50 than the associated soft magnetic member or magnet 42.

Further, FIG. 89 shows an alternative embodiment, wherein in contrast to FIG. 88 the respective winding axis is perpendicular to said plane along which the lens shaping part extends 11 and the respective soft magnetic member or magnet 42 faces its associated electromagnet 41d in the axial direction A in a centered fashion.

The actuator means/actuators 40, i.e. the magnet coil pairs, electropermanent magnets and soft magnetic members, or electromagnets and corresponding magnets/soft magnetic members/regions can be controlled using a control unit as described above, which control unit controls electrical currents and/or voltages applied to the coils 41 so as to generate defined axial or tilting movements of the optical element 20/container 2 or lens shaping part 11, particularly for providing autofocus (AF) and/or optical image stabilization (OIS).

Figure 93:
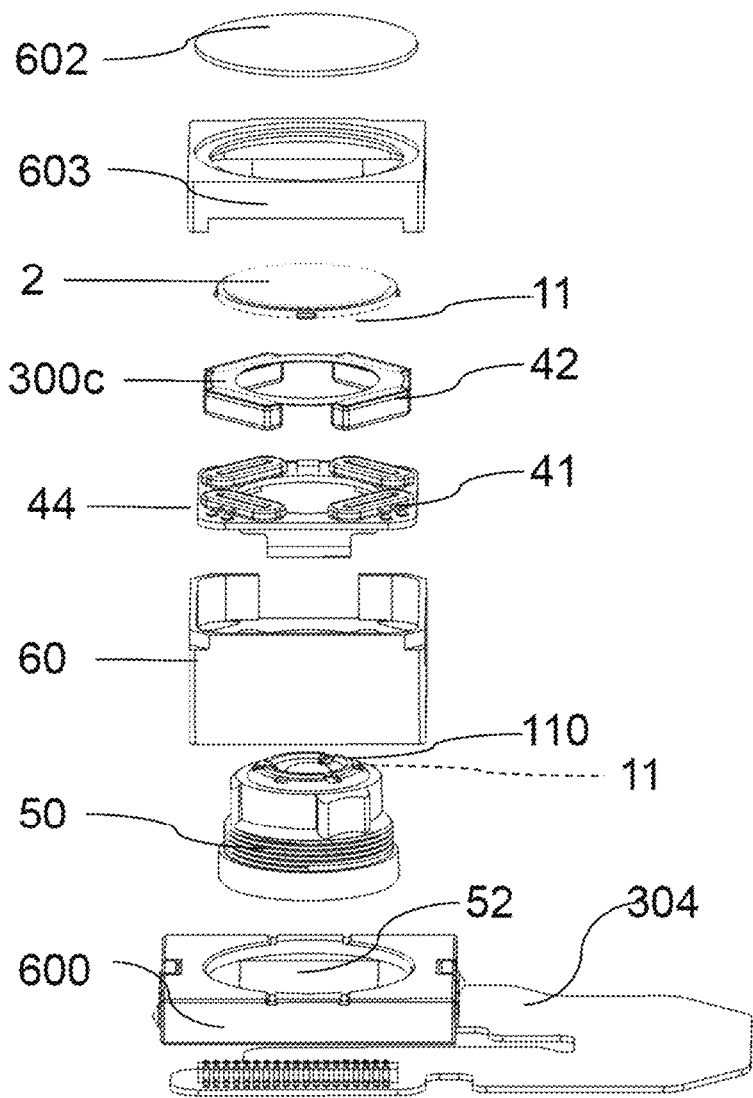
FIG. 93 shows an exploded view of an optical device according as well as a mounting process of the individual components of the optical device.

Further, FIG. 93 shows an exploded view of an optical device 1 for explaining a possible mounting process of the optical device 1. Particularly, the following steps may be conducted in order to assemble the optical device 1 shown in FIG. 93:

connecting a housing 60 of the optical device 1 to an image sensor 52 (the image sensor may be provided on a substrate or some frame 600), arranging a lens barrel 50 (which optionally comprises a centering protrusion 110 for a lens shaping part 11 on a face side 50b of the barrel 50) in a recess of said housing 60, and adjusting the distance between the lens barrel 50 and the image sensor 52 to achieve a sharp focus for an infinite object distance;

arranging electrically conducting coils 41 on the housing 60, particularly by arranging a coil support 44, particularly circuit board, comprising said coils 41 on the housing 60 (the coil support can comprise an opening that aligns with the recess 66), providing an adjustable focus lens 2 comprising a container 2 having a transparent and elastically expandable membrane 10, an optical element 20 facing the membrane 10, and a wall member 300, wherein the optical element 20 and the membrane 10 are connected to the wall member 300 such that said container 2 with a volume V is formed, in which a fluid F is arranged, and wherein a lens shaping part 11 is connected to the membrane 10 (so that particularly a curvature adjustable area 10c is defined, see e.g. also above), arranging said container 2 on a container carrier 300c comprising magnets 42 such that each magnet 42 is associated to one of the coils 41, arranging the container carrier (300c) and container (2) on the lens barrel (50) such that the lens shaping part (11) is arranged on a face side 50b of the lens barrel 50 (and particularly engages with the protrusion 110 for centering the lens shaping part 11 with respect to the lens barrel 50);

optionally mounting a cover glass (602) to a cover frame (603);

optionally mounting the cover frame (603) to the housing (60).

Alternatively, the lens shaping part 11 is initially part of the lens barrel 50 (dashed line in FIG. 93) and already connected to the latter. Then, the method is conducted as follows:

connecting a housing 60 of the optical device 1 to an image sensor 52 (the image sensor 52 may be provided on a substrate or some frame 600), arranging a lens barrel 50 in a recess of said housing 60, and adjusting the distance between the lens barrel 50 and the image sensor 52 to achieve a sharp focus for an infinite object distance, wherein the lens barrel 50 comprises a lens shaping part 11 for defining a curvature adjustable area 10c of the membrane 10 arranging electrically conducting coils 41 on the housing 60, particularly by arranging a coil support 44, particularly circuit board, comprising said coils 41 on the housing 60 (the coil support can comprise an opening that aligns with the recess 66), providing an adjustable focus lens 2 comprising a container 2 having a transparent and elastically expandable membrane 10, an optical element 20 facing the membrane 10, and a wall member 300, wherein the optical element 20 and the membrane 10 are connected to the wall member 300 such that said container 2 with a volume V is formed, in which a fluid F is arranged, arranging said container 2 on a container carrier 300c comprising magnets 42 such that each magnet 42 is associated to one of the coils 41, arranging the container carrier 300c and container 2 on the lens barrel 50 such that the lens shaping part 11 contacts the membrane 10 and defines a curvature adjustable area 10c of the membrane;

particularly mounting a cover glass (602) to a cover frame (603);

particularly mounting the cover frame (603) to the housing (60).

Figure 95:
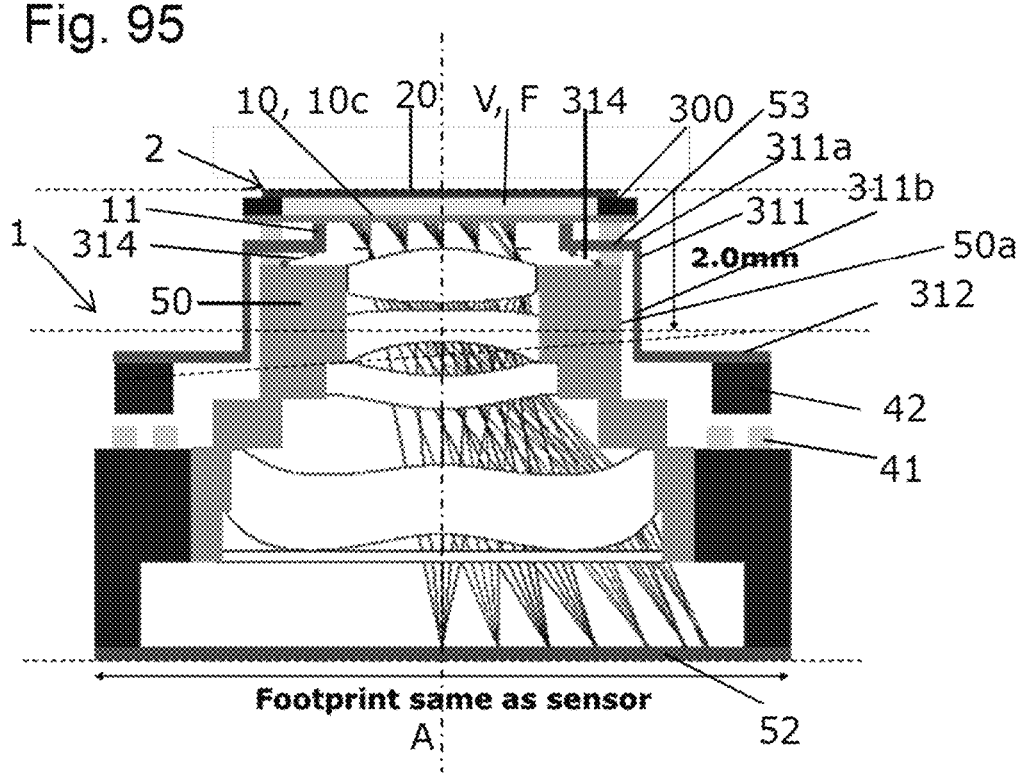
FIG. 95 shows a modification of the embodiment shown in FIG. 94.
Figure 96:
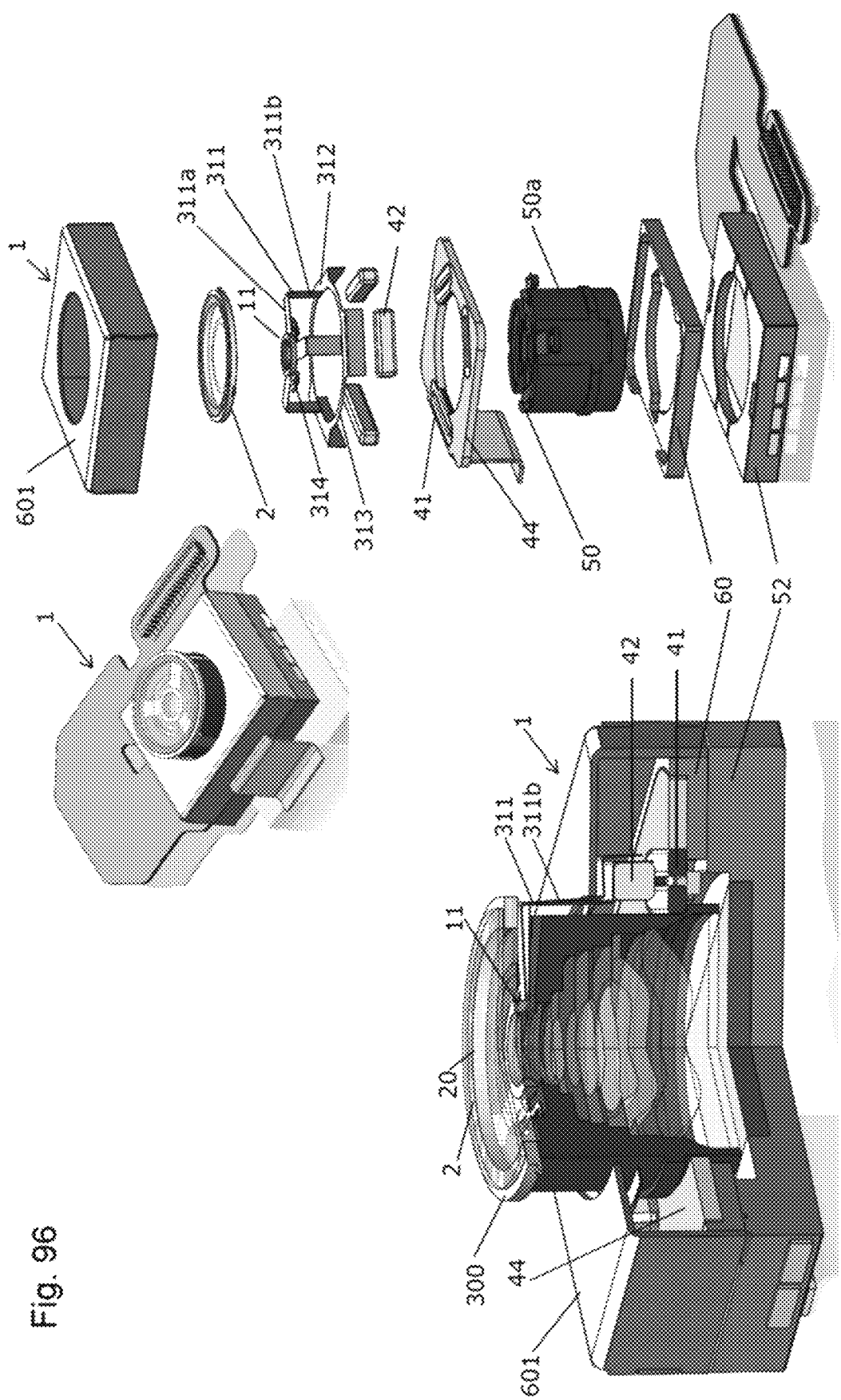
FIG. 96 shows an embodiment of the optical device according to the present invention, wherein the legs protruding out of the lens barrel are formed according to the manner shown in FIG. 95.

Finally, FIGS. 95 and 96 show a modification of the embodiment shown in FIG. 94, wherein here in contrast to FIG. 94, where the legs 311 extend out of the lens barrel 50 in a linear fashion, the legs 311 comprise a first section 311a that extends through the respective slot 53 in the lens barrel 50 and a second section 311b that is connected to the first section 311a and extends at an angle (as an example 80° to 100°, particularly 90°) with respect to the first section 311a, and wherein the second section 311b extends outside the lens barrel 50 along a lateral outside 50a of the lens barrel 50 as well as along or parallel to the optical axis (or axial direction A) of the lens barrel 50.

This allows one to reduce the diameter of the device 1 in the upper section of the lens barrel 50 where the container 2 is arranged so that the lens barrel's upper section can now protrude into a recess of a casing/cover glass of a further device, such as a mobile phone, into which the device 1 is to be mounted. In contrast, using a design according to FIG. 94 such recess has to have a larger diameter, since here the upper region of the lens barrel 50 is not as slim as in case of FIGS. 95 and 96 due to the installation space needed for the magnets 42 and legs 311.

Further, FIGS. 95 and 96 also show the spring members 314 connected to the lens shaping part 11, which spring members 314 may rest with end sections 314a (cf. also FIG. 79) on the lens barrel 50.

Furthermore, in the following, further aspects of the present invention are disclosed and termed "item 1", and "item 15". These items may also be formulated as independent claims of the present invention (e.g. by replacing "item" with "claim").

Further, embodiments of these aspects are also disclosed in the following and are also denoted as items. These items corresponding to embodiments can be formulated as sub claims of the respective independent claim (e.g. by replacing "item" with "claim"). The numerals stated in parenthesis refer to the Figures of the present application.

Item 1: Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
an actuator means (40) that is designed to move the optical element (20) in an axial direction (A) with respect to the lens shaping part (11) so as to adjust the pressure of the fluid (F) residing inside the volume (V) and therewith a curvature of said area (10c), wherein said axial direction (A) is oriented perpendicular to a plane along which the lens shaping part (11) extends, and wherein said actuator means (40) is designed to tilt the optical element (20) with respect to said plane, particularly so as to form the volume (V) into a prism for deflecting light passing through the volume (V),
characterized in that
the lens shaping part (11) is connected to a circumferential lens barrel (50) that surrounds an opening (50c) in which at least one rigid lens (51) is arranged that is held by the lens barrel (50).

Item 2: Optical device according to item 1, characterized in that the lens shaping part (11) is integrally formed with the lens barrel (50) and forms a face side of the lens barrel (50), which face side (11) is particularly connected to the membrane (10).

Item 3: Optical device according to item 1, characterized in that the lens shaping part (11) is formed by a circumferential material layer (11) that is connected to a face side (50b) of the lens barrel (50), wherein particularly the material layer (11) is connected to the membrane (10).

Item 4: Optical device according to one of the preceding items, characterized in that the lens shaping part (11) is plasma bonded to the membrane (10).

Item 5: Optical device according to one of the preceding items, characterized in that the optical device (1) comprises a housing (60) that surrounds the lens barrel (50).

Item 6: Optical device according to item 5, characterized in that the housing (60) comprises a recess (66) configured for receiving the lens barrel (50) in a form-fitting manner, wherein said recess (66) is further configured to guide the lens barrel (50) upon mounting of the lens barrel (50) into the housing (60).

Item 7: Optical device according to item 5 or 6, characterized in that the wall member (300) is connected via at least one spring member (302) to the housing (60) so that the wall member (300) is elastically coupled to the housing (60) such that when the wall member (300) is moved out of a resting position a restoring force is exerted on the wall member (300).

Item 8: Optical device according to one of the preceding items, characterized in that the actuator means (40) comprises a plurality of electrically conducting coils (41), particularly three or four coils (41), and at least one magnet (42) or a corresponding number of magnets (42), wherein each magnet (42) is associated to exactly one of the coils (41), wherein each coil (41) faces the at least one magnet (42) or its associated magnet (42) in the axial direction (A), or wherein each coil (41) surrounds at least one magnet (42), and wherein each coil (41) is configured to interact with the at least one magnet (42) or its associated magnet (42) such that when a current is applied to a coil (41) the respective coil (41) is either moved in the axial direction (A) towards the at least one magnet (42) or towards its associated magnet (42) or away from the at least one magnet (42) or away from its associated magnet (42) depending on the direction of the current in the respective coil (41).

Item 9: Optical device according to item 8, characterized in that that the respective coil (41) comprises a conductor (410) that is wound around a coil axis (A") running perpendicular to said plane or to said optical element (20).

Item 10: Optical device according item 5 and according to one of the items 8 to 9, characterized in that the at least one magnet (42) or said plurality of magnets (42) is arranged on the housing and that the coils (41) are arranged on the wall member (300).

Item 11: Optical device according to item 5 and according to one of the items 8 to 9, characterized in that the at least one magnet (42) or said plurality of magnets (42) is connected to the wall member (300) and that the coils (41) are arranged on the housing (60).

Item 12: Optical device according to one of the items 8 to 10, characterized in that the wall member (300) is formed as a circuit board comprising the spring members (302) as integral portions, wherein the coils (41) are integrated into the circuit board (300).

Item 13: Optical device according to one of the items 7 to 12, characterized in that the housing (60) comprises a spacer element (61) for supporting a frame member (303) to which the at least one spring member (302) is connected, wherein the spacer element (61) is configured to expand in the axial direction (A) with increasing temperature for compensating a temperature induced increase of said volume (V) due to the expansion of the fluid (F) with temperature.

Item 14: Optical device according to one of the items 1 to 13, characterized in that the optical device (1) comprises an image sensor (52) and forms a camera, which is particularly configured to be arranged in a mobile phone, and wherein the optical element (20) is configured to be moved in the axial direction (A) for providing autofocus, particularly supermacro autofocus, and/or wherein the optical element (20) is configured to be tilted to form the volume (V) into a prism for providing optical image stabilization and/or super resolution imaging.

Item 15: Method for producing an optical device, particularly according one of the items 1 to 14, comprising the steps of:
arranging an adjustable focus lens in a housing (60) of the optical device (1), the adjustable focus lens comprising a transparent and elastically expandable membrane (10), an optical element (20) facing the membrane (10), and a wall member (300), wherein the optical element (10) and the membrane (10) are connected to the wall member (300) such that a container (2) with a volume (V) is formed, in which a fluid (F) is arranged, providing a lens barrel (50) comprising a lens shaping part (11) that is to be attached to the membrane (10) for defining a curvature adjustable area (10c) of the membrane (10), and moving the lens barrel (50) into the housing (60) with the lens shaping part (11) ahead towards the membrane (10) until the lens shaping part (11) contacts with the membrane (10) and thereafter moving the lens barrel (50) in the housing (60) until the curvature of said area (10c) and therewith the focal length of the focus adjustable lens is set to a desired value, and fastening the lens barrel (50) to the housing (60).

Furthermore, in the following, further aspects of the present invention are disclosed and termed "object 1", "object 22", "object 23", "object 25", and "object 26". These objects may also be formulated as independent claims of the present invention (e.g. by replacing "object" with "claim"). Further, embodiments of these aspects are also disclosed in the following and are also denoted as objects. These objects corresponding to embodiments can be formulated as sub claims of the respective independent claim (e.g. by replacing "object" with "claim"). The numerals stated in parenthesis refer to the Figures of the present application.

Object 1: Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
a circumferential lens barrel (50) that surrounds an opening (50c) in which at least one rigid lens (51) is arranged that is held by the lens barrel (50), and
an actuator means (40) that is designed to move the optical element (20) in an axial direction (A) with respect to the lens shaping part (11) so as to adjust the pressure of the fluid (F) residing inside the volume (V) and therewith a curvature of said area (10c), wherein said axial direction (A) is oriented perpendicular to a plane along which the lens shaping part (11) extends, characterized in that
the lens shaping part (11) is connected to the circumferential lens barrel (50), wherein the optical device (1) is designed to at least one of: tilt the optical element (20) with respect to said plane, particularly so as to form the volume (V) into a prism, move the container (2) parallel to said plane with respect to the lens barrel (50), move the lens barrel (50) together with said container (2).

Object 2: Optical device according to object 1, characterized in that the actuator means (40) is designed to tilt the optical element (20) with respect to said plane, particularly so as to form the volume (V) into a prism for deflecting light passing through the volume (V).

Object 3: Optical device according to object 1 or 2, characterized in that the actuator means (40) is designed to move the container (2) parallel to said plane with respect to the lens barrel (50), particularly for deflecting light passing through the volume (V).

Object 4: Optical device according to one of the preceding objects, characterized in that the lens shaping part (11) is integrally formed with the lens barrel (50) and forms a face side of the lens barrel (50), which face side (11) is particularly connected to the membrane (10).

Object 5: Optical device according to one of the objects 1 to 3, characterized in that the lens shaping part (11) is formed by a circumferential material layer (11) that is connected to a face side (50b) of the lens barrel (50), wherein particularly the material layer (11) is connected to the membrane (10).

Object 6: Optical device according to one of the preceding objects, characterized in that the lens shaping part (11) is plasma bonded to the membrane (10).

Object 7: Optical device according to one of the preceding objects, characterized in that the optical device (1) comprises a housing (60) that surrounds the lens barrel (50).

Object 8: Optical device according to object 7, characterized in that the housing (60) comprises a recess (66) configured for receiving the lens barrel (50) in a form-fitting manner, wherein said recess (66) is further configured to guide the lens barrel (50) upon mounting of the lens barrel (50) into the housing (60).

Object 9: Optical device according to object 7 or 8, characterized in that the wall member (300) is connected via at least one spring member (302) to the housing (60) so that the wall member (300) is elastically coupled to the housing (60) such that when the wall member (300) is moved out of a resting position a restoring force is exerted on the wall member (300).

Object 10: Optical device according to one of the preceding objects, characterized in that the actuator means (40) comprises a plurality of electrically conducting coils (41), particularly three or four coils (41), and at least one magnet (42), wherein each coil (41) faces the at least one magnet (42) and wherein each coil (41) is configured to interact with the at least one magnet (42) such that when a current is applied to a coil (41) the respective coil (41) and the at least one magnet (42) move with respect to each other depending on the direction of the current in the respective coil (41).

Object 11: Optical device according to one of the objects 1 to 9, characterized in that the actuator means (40) comprises a plurality of electrically conducting coils (41), particularly three or four coils (41), and a corresponding number of magnets (42), wherein each magnet (42) is associated to exactly one of the coils (41), wherein each coil (41) faces its associated magnet (42) and wherein each coil (41) is configured to interact with its associated magnet (42) such that when a current is applied to a coil (41) the respective coil (41) and its associated magnet (42) move with respect to each other depending on the direction of the current in the respective coil (41).

Object 12: Optical device according to one of the objects 1 to 9, characterized in that the actuator means (40) comprises a plurality of electrically conducting coils (41), particularly three or four coils (41), wherein each coil (41) surrounds an associated magnet (42), and wherein each coil (41) is configured to interact with the associated magnet (42) such that when a current is applied to a coil (41) the respective coil (41) and the associated magnet (42) attract each other or repel each other depending on the direction of the current in the respective coil (41).

Object 13: Optical device according to one of the objects 10 to 12, characterized in that that the respective coil (41) comprises a conductor (410) that is wound around a coil axis (A'') running perpendicular to said plane or to said optical element (20).

Object 14: Optical device according to object 7 and according to one of the objects 10 to 12, characterized in that the at least one magnet (42) or said plurality of magnets (42) is arranged on the housing and that the coils (41) are connected to the wall member (300).

Object 15: Optical device according to object 7 and according to one of the objects 10 to 12, characterized in that the at least one magnet (42) or said plurality of magnets (42) is connected to the wall member (300) and that the coils (41) are arranged on the housing (60).

Object 16: Optical device according to object 9 and one of the objects 10 to 12, characterized in that the wall member (300) is formed as a circuit board comprising the at least one spring member (302) as an integral portion, wherein the coils (41) are integrated into the circuit board (300).

Object 17: Optical device according to object 9 or one of the objects 10 to 16 when referring to object 9, characterized in that the housing (60) comprises a spacer element (61) for supporting a frame member (303) to which the at least one spring member (302) is connected, wherein the spacer element (61) is configured to expand in the axial direction (A) with increasing temperature for compensating a temperature induced increase of said volume (V) due to the expansion of the fluid (F) with temperature.

Object 18: Optical device according to one of the objects 1 to 17, characterized in that the optical device (1) comprises an image sensor (52) and forms a camera, which is particularly configured to be arranged in a mobile phone, and wherein the optical element (20) is configured to be moved in the axial direction (A) for providing autofocus, particularly supermacro autofocus, and/or wherein the optical element (20) is configured to be tilted to form the volume (V) into a prism for providing optical image stabilization and/or super resolution imaging; and/or wherein the container (2) is configured to be moved parallel to said plane with respect to the lens barrel for providing optical image stabilization and/or super resolution; and/or wherein said lens barrel (50) is configured to be moved parallel to said image sensor (52) together with the container (2) for providing image stabilization and/or super resolution.

Object 19: Optical device according to one of the preceding objects, characterized in that said optical element (20) forms a rigid lens (20), particularly a converging lens.

Object 20: Optical device according to object 19, characterized in that said rigid lens (20) is a plano-convex lens (20).

Object 21: Optical device according to object 19 or 20, characterized in that said optical element (20) comprises a convex surface area (20b) facing away from said membrane (10).

Object 22: Method for producing an optical device, particularly according one of the objects 1 to 21, comprising the steps of:

arranging an adjustable focus lens in a housing (60) of the optical device (1), the adjustable focus lens comprising a transparent and elastically expandable membrane (10), an optical element (20) facing the membrane (10), and a wall member (300), wherein the optical element (10) and the membrane (10) are connected to the wall member (300) such that a container (2) with a volume (V) is formed, in which a fluid (F) is arranged, providing a lens barrel (50) comprising a lens shaping part (11) that is to be attached to the membrane (10) for defining a curvature adjustable area (10c) of the membrane (10), and moving the lens barrel (50) into the housing (60) with the lens shaping part (11) ahead towards the membrane

(10) until the lens shaping part (11) contacts the membrane (10) and thereafter moving the lens barrel (50) in the housing (60) until the curvature of said area (10c) and therewith the focal length of the focus adjustable lens is set to a desired value, and fastening the lens barrel (50) to the housing (60).

Object 23: Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
a circumferential lens barrel (50) that surrounds an opening (50c) in which at least one rigid lens (51) is arranged that is held by the lens barrel (50), and
an actuator means (40) that is designed to move the lens shaping part (11) in an axial direction (A) with respect to the optical element (20) so as to adjust the pressure of the fluid (F) residing inside the volume (V) and therewith a curvature of said area (10c), wherein said axial direction (A) is oriented perpendicular to a plane along which the at least one rigid lens (51) of the lens barrel (50) extends, and
wherein the optical element (20) is rigidly connected to the lens barrel (50).
and wherein the optical device (1) is designed to at least one of: tilt the lens shaping part (11) with respect to said plane, move the lens shaping part (11) parallel to said plane with respect to the lens barrel, move the lens barrel (50) together with the container (2).

Object 24: Optical device according to one of the preceding objects, characterized in that said optical element (20) forms a transparent and elastically expandable membrane (20).

Object 25: A method for calibrating an optical image stabilization function of an optical device (1), particularly according to one of the objects 1 to 21, 23, 24, wherein the optical device (1) comprises an image sensor (52) and forms a camera, and wherein the method comprises the steps:
measuring a movement of the optical device (1) during an image preview modus of the optical device (1), which movement leads to a shift of an image projected onto the image sensor (52) by the optical device (1),
applying a signal to an actuator means (40, 400) of the optical device (1), which signal prompts the actuator means (40, 400) to at least partially compensate said shift of said image on the image sensor (52) for providing optical image stabilization,
automatically determining the sharpness of the image generated by the image sensor (52),
increasing or decreasing an amplitude of the signal applied to said actuator means (40, 400) by a proportionality factor,
determining the one signal among said signals that results in an image having the best sharpness;
storing the proportionality factor as calibration data in the optical device (1).

Object 26: A method for calibrating an autofocus function of an optical device (1), particularly according to one of the objects 1 to 21, 23, 24, wherein the optical device (1) is formed as a camera, and wherein the method comprises the steps of:

measuring a distance between the optical device (1) and an object using a distance sensor of the optical device (1),
sweeping through different focal lengths of the optical device (1) by applying a corresponding electrical current signal to an actuator means (40) of the optical device (1),
analyzing the image sharpness of an image at each focal length,
storing the electrical current signal at which the image had the highest sharpness together with the measured distance between the optical device (1) and the object.

We claim:
1. Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
a circumferential lens barrel (50) that surrounds an opening (50c) in which at least one rigid lens (51) is arranged that is held by the lens barrel (50), and
an actuator means (40) that is designed to
move the optical element (20) in an axial direction (A) with respect to the lens shaping part (11), which axial direction (A) is oriented perpendicular to a plane along which the lens shaping part (11) extends, or
move the lens shaping part (11) in an axial direction (A) with respect to the optical element (20), which axial direction (A) is oriented perpendicular to a plane along which the rigid lens (51) extends,
so as to adjust the pressure of the fluid (F) residing inside the volume (V) and therewith a curvature of said area (10c), and wherein
the actuator means (40) comprises magnets (42) and a corresponding number of coils (41), wherein each of the magnets (42) is associated to exactly one of the coils (41) and each of the magnets faces the associated coil in the axial direction (A), and wherein the coils comprise a section (411) bellow the magnet (42) respectively, in which section (411) an electrical current (I) flows in a first direction and perpendicular to a magnetic field (B) of the magnet (42) respectively, and in a neighboring second section (412) the current flows in a direction, which is opposed to the first direction and which is perpendicular to the magnetic field (B) of the magnet (42) respectively, and wherein
the magnet (42) is centered with respect to the first and second sections (411, 412) so that the magnetic field (B) extends perpendicular to the axial direction (A) so that a Lorentz Force (FL) generated when said current (I) is applied is oriented along the axial direction (A) and causes the magnet (42) and the coil (41) to attract each other or to repel each other depending on the direction of the current in the coil (41) respectively, wherein
a coil support (44) comprises a plurality of sheets (440) that are folded on one another so that the coil support (44) comprises a stack of said sheets (440), wherein each sheet comprises a plurality of planar coils (41aa) so that said stack of sheets (440) forms a plurality of electrically conducting coils (41).

2. Optical device according to claim 1, characterized in that the optical device (1) is designed to at least one of:
- tilt the optical element (20) with respect to said plane along which the lens shaping part (11) extends, particularly so as to form the volume (V) into a prism, particularly for providing optical image stabilization,
- tilt the lens shaping part (11) with respect to said plane along which the rigid lens (51) extends, particularly so as to form the volume (V) into a prism, particularly for providing optical image stabilization,
- move the container (2) parallel to said plane along which the lens shaping part (11) extends with respect to the lens barrel (50), particularly for providing optical image stabilization,
- move the lens shaping part (11) parallel to said plane along which the rigid lens (51) extends with respect to the lens barrel (50) and/or with respect to said container (2), particularly for providing optical image stabilization,
- move the lens barrel (50) together with said container (2), particularly for providing optical image stabilization, particularly parallel to an image sensor (52) of the optical device (1), wherein the lens barrel (50) is arranged in front of the image sensor (52),
- tilt the lens barrel (50) together with the container (2), particularly for providing optical image stabilization, particularly with respect to an image sensor (52) of the optical device (1), wherein the lens barrel (50) is arranged in front of the image sensor (52).

3. Optical device according to claim 1, characterized in that the actuator means (40) is designed to tilt the lens shaping part (11) with respect to said plane along which the rigid lens (51) extends, particularly so as to form the volume (V) into a prism for deflecting light passing through the volume (V).

4. Optical device according to claim 1, characterized in that the actuator means (40) is designed to move the lens shaping part (11) parallel to said plane along which the rigid lens (51) extends with respect to the lens barrel (50) and/or with respect to said container (2), particularly for deflecting light passing through the volume (V).

5. Optical device according to claim 1, characterized in that the lens shaping part (11) is plasma bonded to the membrane (10).

6. Optical device according to claim 1, characterized in that the container (2) is completely arranged in said opening (50c) of the lens barrel (50).

7. Optical device according to claim 1, characterized in that the optical device (1) comprises a housing (60) that surrounds the lens barrel (50).

8. Optical device according to claim 7, characterized in that the housing (60) comprises a recess (66) configured for receiving the lens barrel (50) in a form-fitting manner, wherein particularly said recess (66) is further configured to guide the lens barrel (50) upon mounting of the lens barrel (50) into the housing (60).

9. Optical device according to claim 8, characterized in that the recess (66) comprises a circumferential step (66a) that forms a stop for positioning the lens barrel (50) with respect to an image sensor (52) of the optical device (1).

10. Optical device according to claim 1, characterized in that the lens shaping part (11) is connected to a lens shaping part carrier (310), wherein the lens shaping part carrier (310) comprises legs (311) connected to the lens shaping part (11), wherein the respective leg (311) extends from the lens shaping part (11) outward through an associated slot (53) formed in the lens barrel (50), and wherein the respective leg (311) is connected to an associated holding member (312) for holding a magnet (42) or a coil or other parts of the actuator means (40), wherein the respective holding member (312) is arranged outside the lens barrel (50).

11. Optical device according to claim 1, characterized in that the actuator means (40) comprises one or a plurality of electrically conducting coils (41), particularly three or four coils (41), and at least one magnet (42), wherein each coil (41) faces the at least one magnet (42) and wherein each coil (41) is configured to interact with the at least one magnet (42) such that when a current is applied to a coil (41) the respective coil (41) and the at least one magnet (42) move with respect to each other depending on the direction of the current in the respective coil (41).

12. Optical device according to claim 1, characterized in that the actuator means (40) comprises one or a plurality of electrically conducting coils (41), particularly three or four coils (41), and a corresponding number of magnets (42), wherein each magnet (42) is associated to exactly one of the coils (41), wherein each coil (41) faces its associated magnet (42) and wherein each coil (41) is configured to interact with its associated magnet (42) such that when a current is applied to a coil (41) the respective coil (41) and its associated magnet (42) move with respect to each other depending on the direction of the current in the respective coil (41).

13. Optical device according to claim 1, characterized in that the actuator means (40) comprises one or a plurality of electrically conducting coils (41), particularly three or four coils (41), wherein each coil (41) surrounds an associated magnet (42), and wherein each coil (41) is configured to interact with the associated magnet (42) such that when a current is applied to a coil (41) the respective coil (41) and the associated magnet (42) attract each other or repel each other depending on the direction of the current in the respective coil (41).

14. Optical device according to claim 11, characterized in that that the respective coil (41) comprises a conductor (410) that is wound around a coil axis (A″) running perpendicular to said plane or to said optical element (20).

15. Optical device according to claim 7, characterized in that the actuator means (40) comprises one or a plurality of electropermanent magnets (41c) arranged on the housing (60), particularly, two, three or four electropermanent magnets (41c), and a corresponding number of soft magnetic members (42) connected to the container (2), wherein each soft magnetic member (42) is associated to exactly one of the electropermanent magnets (41c), and wherein each soft magnetic member (42) is arranged adjacent its associated electropermanent magnet (41c) such that a gap (G) is formed between the respective soft magnetic member (42) and its associated electropermanent magnet (41c), wherein for moving the optical element (20) in said axial direction (A) and/or for tilting the optical element (20) the respective electropermanent magnet (41c) is configured to attract its associated soft magnetic member (42) when a corresponding voltage pulse is applied to the respective electropermanent magnet (41c) that generates an external magnetic field of the respective electropermanent magnet (41c) that causes said attraction.

16. Optical device according to claim 1, characterized in that said optical element (20) forms a transparent and elastically expandable membrane (20).

17. A method for calibrating an optical image stabilization function of an optical device (1), the optical device comprising a transparent and elastically expandable membrane (10), an optical element (20) facing the membrane (10), a wall member (300), wherein the optical element (20) and the membrane (10) are connected to the wall member (300) such that a container (2) with a volume (V) is formed, a fluid (F) residing in said volume (V), and a lens shaping part (11) that is in contact with the membrane (10) for defining a curvature adjustable area (10c) of the membrane (10), which area (10c) faces said optical element (20), and a circumferential lens barrel (50) that surrounds an opening (50c) in which at least one rigid lens (51) is arranged that is held by the lens barrel (50), and an actuator means (40) that is designed to
    move the optical element (20) in an axial direction (A) with respect to the lens shaping part (11), which axial direction (A) is oriented perpendicular to a plane along which the lens shaping part (11) extends, or
    move the lens shaping part (11) in an axial direction (A) with respect to the optical element (20), which axial direction (A) is oriented perpendicular to a plane along which the rigid lens (51) extends,
so as to adjust the pressure of the fluid (F) residing inside the volume (V) and therewith a curvature of said area (10c), and wherein the optical device (1) comprises an image sensor (52) and forms a camera, and wherein the method comprises the steps: measuring a movement of the optical device (1) during an image preview modus of the optical device (1), which movement leads to a shift of an image projected onto the image sensor (52) by the optical device (1),
    applying a signal to the actuator means (40, 400) of the optical device (1), which signal prompts the actuator means (40, 400) to at least partially compensate said shift of said image on the image sensor (52) for providing optical image stabilization,
    automatically determining the sharpness of the image generated by the image sensor (52),
    increasing or decreasing an amplitude of the signal applied to said actuator means (40, 400) by a proportionality factor,
    determining the one signal among said signals that results in an image having the best sharpness; and
    storing the proportionality factor as calibration data in the optical device (1).

18. Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
a circumferential lens barrel (50) that surrounds an opening (50c) in which at least one rigid lens (51) is arranged that is held by the lens barrel (50), and
an actuator means (40) that is designed to
    move the optical element (20) in an axial direction (A) with respect to the lens shaping part (11), which axial direction (A) is oriented perpendicular to a plane along which the lens shaping part (11) extends, or
    move the lens shaping part (11) in an axial direction (A) with respect to the optical element (20), which axial direction (A) is oriented perpendicular to a plane along which the rigid lens (51) extends,
    so as to adjust the pressure of the fluid (F) residing inside the volume (V) and therewith a curvature of said area (10c), and
the lens shaping part (11) is connected to a lens shaping part carrier (310), wherein the lens shaping part carrier (310) comprises legs (311) connected to the lens shaping part (11), wherein the respective leg (311) extends from the lens shaping part (11) outward through an associated slot (53) formed in the lens barrel (50), and wherein the respective leg (311) is connected to an associated holding member (312) for holding a magnet (42) or a coil or other parts of the actuator means (40), wherein the respective holding member (312) is arranged outside the lens barrel (50).

19. Optical device (1), comprising:
a transparent and elastically expandable membrane (10),
an optical element (20) facing the membrane (10),
a wall member (300), wherein the optical element (20) and the membrane (10) are connected to the wall member (300) such that a container (2) with a volume (V) is formed,
a fluid (F) residing in said volume (V), and
a lens shaping part (11) that is in contact with the membrane (10) for defining a curvature adjustable area (10c) of the membrane (10), which area (10c) faces said optical element (20), and
a circumferential lens barrel (50) that surrounds an opening (50c) in which at least one rigid lens (51) is arranged that is held by the lens barrel (50), and
an actuator means (40) that is designed to
    move the optical element (20) in an axial direction (A) with respect to the lens shaping part (11), which axial direction (A) is oriented perpendicular to a plane along which the lens shaping part (11) extends, or
    move the lens shaping part (11) in an axial direction (A) with respect to the optical element (20), which axial direction (A) is oriented perpendicular to a plane along which the rigid lens (51) extends,
so as to adjust the pressure of the fluid (F) residing inside the volume (V) and therewith a curvature of said area (10c), and wherein
the actuator means (40) comprises magnets (42) and a corresponding number of coils (41), wherein each of the magnets (42) is associated to exactly one of the coils (41) and each of the magnets faces the associated coil in the axial direction (A), and wherein
the coils comprise a section (411) bellow the magnet (42) respectively, in which section (411) an electrical current (I) flows in a first direction and perpendicular to a magnetic field (B) of the magnet (42) respectively, and in a neighboring second section (412) the current flows in a direction, which is opposed to the first direction and which is perpendicular to the magnetic field (B) of the magnet (42) respectively, and wherein
the magnet (42) is centered with respect to the first and second sections (411, 412) so that the magnetic field (B) extends perpendicular to the axial direction (A) so that a Lorentz Force (FL) generated when said current (I) is applied is oriented along the axial direction (A) and causes the magnet (42) and the coil (41) to attract each other or to repel each other depending on the direction of the current in the coil (41) respectively, wherein
the optical device (1) comprises a housing (60) that surrounds the lens barrel (50),
the actuator means (40) comprises one or a plurality of electropermanent magnets (41c) arranged on the housing (60), particularly, two, three or four electropermanent magnets (41c), and a corresponding number of soft magnetic members (42) connected to the container (2), wherein each soft magnetic member (42) is associated to exactly one of the electropermanent magnets (41c), and wherein each soft magnetic member (42) is arranged adjacent its associated electropermanent magnet (41*c*) such that a gap (G) is formed between the respective soft magnetic member (42) and its associated electropermanent magnet (41*c*), wherein for moving the optical element (20) in said axial direction (A) and/or for tilting the optical element (20) the respective electropermanent magnet (41*c*) is configured to attract its associated soft magnetic member (42) when a corresponding voltage pulse is applied to the respective electropermanent magnet (41*c*) that generates an external magnetic field of the respective electropermanent magnet (41*c*) that causes said attraction.

* * * * *